(12) United States Patent
Hatakeyama

(10) Patent No.: US 9,869,931 B2
(45) Date of Patent: Jan. 16, 2018

(54) RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/016,920

(22) Filed: Feb. 5, 2016

(65) Prior Publication Data

US 2016/0231652 A1    Aug. 11, 2016

(30) Foreign Application Priority Data

Feb. 9, 2015   (JP) ................. 2015-023149
Aug. 12, 2015  (JP) ................. 2015-159402
Nov. 26, 2015  (JP) ................. 2015-230189

(51) Int. Cl.
  G03F 7/039   (2006.01)
  G03F 7/20    (2006.01)
  G03F 7/32    (2006.01)
  G03F 7/16    (2006.01)
  G03F 7/004   (2006.01)

(52) U.S. Cl.
  CPC .......... G03F 7/0397 (2013.01); G03F 7/0045 (2013.01); G03F 7/0046 (2013.01); G03F 7/0392 (2013.01); G03F 7/2004 (2013.01); G03F 7/2059 (2013.01); Y10S 522/904 (2013.01)

(58) Field of Classification Search
  CPC .... G03F 7/0397; G03F 7/2004; G03F 7/2059; G03F 7/0392; G03F 7/0045; G03F 7/0046; Y10S 522/904
  See application file for complete search history.

(56) References Cited

U.S. PATENT DOCUMENTS

2009/0317742 A1* 12/2009 Toriumi ............... G03F 7/0042
                                              430/270.1
2012/0058429 A1*  3/2012 Nishino ............... G03F 7/0045
                                              430/283.1
2012/0202153 A1*  8/2012 Hatakeyama ......... G03F 7/0045
                                              430/283.1
2012/0208125 A1*  8/2012 Hatakeyama ......... G03F 7/0043
                                              430/281.1
2012/0208127 A1*  8/2012 Hatakeyama ........... G03F 7/038
                                              430/283.1
2013/0029270 A1   1/2013 Hatakeyama
2013/0224652 A1*  8/2013 Bass ..................... G03F 7/0042
                                              430/270.1
2015/0099228 A1*  4/2015 Hatakeyama ........... G03F 7/039
                                              430/270.1

FOREIGN PATENT DOCUMENTS

| JP | 2001-329228   | 11/2001 |
| JP | 2006-178317   | 7/2006  |
| JP | 2009-237150   | 10/2009 |
| JP | 2010-152136 A | 7/2010  |
| JP | 2013-25211 A  | 2/2013  |

OTHER PUBLICATIONS

Hinsberg et al., "Extendibility of Chemically Amplified Resists : Another Brick Wall?", Advances in Resist Technology and Processing XX, 2003, Proceedings of SPIE vol. 5039, pp. 1-14, (14 pages).
Kishikawa et al., "Assessment of trade-off between resist resolution and sensitivity for optimization of hyper-NA immersion lithography", Optical Mlcrolfthography XX, 2007, Proceedings of SPIE vol. 6520, pp. 65203L-1-65203L-9, (10 pages).
Office Action dated Oct. 13, 2016, issued in counterpart Taiwanese application No. 105103904 (6 pages).

* cited by examiner

*Primary Examiner* — Cynthia Hamilton
(74) *Attorney, Agent, or Firm* — Westerman, Hattori, Daniels & Adrian, LLP

(57) ABSTRACT

To a resist composition comprising a polymer comprising recurring units having an acid labile group and an acid generator is added a metal-acid complex. The metal is Ce, Cu, Zn, Fe, In, Y, Yb, Sn, Tm, Sc, Ni, Nd, Hf, Zr, Ti, La, Ag, Ba, Ho, Tb, Lu, Eu, Dy, Gd, Rb, Sr or Cs. The acid is a fluoroalkylsulfonic acid, fluorinated arylsulfonic acid, fluorinated tetraphenylboric acid, fluoroalkylsulfonimidic acid or fluoroalkylsulfonemethide acid. Due to a high contrast of alkaline dissolution rate before and after exposure, high resolution, high sensitivity, and controlled acid diffusion rate, the composition forms a pattern with satisfactory profile and minimal line edge roughness.

14 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application 2015-023149 and 2015-159402 filed in Japan on Feb. 9, 2015, and Aug. 12, 2015, respectively, the entire contents of which are hereby incorporated by reference.

TECHNICAL FIELD

This invention relates to a resist composition, and more particularly to a chemically amplified positive resist composition adapted for the EB and EUV lithography processes; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The current technology is approaching to the processing size which is reduced below 50 nm as minimum line width. When the processing size is so reduced, the thickness of resist film must be reduced below 100 nm, depending on the surface material of the substrate to be processed, because of such factors as the structural strength to maintain the pattern against the surface tension of developer and the adhesion strength to the substrate. On use of prior art chemically amplified resist materials intended to form high-resolution resist film, for example, based on a base resin having an acetal protective group, no significant degradation of line edge roughness does occur with a resist film having a thickness of 150 nm, but line edge roughness is substantially exacerbated when the film thickness is reduced below 100 nm.

With respect to high-energy radiation of very short wavelength such as EB or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was $\frac{1}{5}$, a factor of $\frac{1}{4}$ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of $\frac{1}{4}$ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film lowers its sensitivity. Since the mask exposure tool is designed for exposure by direct continuous writing, a lowering of sensitivity of resist film leads to an undesirably reduced throughput. Due to a need for higher sensitivity, chemically amplified resist compositions are contemplated.

As the feature size is reduced, image blurs due to acid diffusion become a problem (see Non-Patent Document 1). To insure resolution for fine patterns with a size of 45 nm et seq., not only an improvement in dissolution contrast is requisite, but control of acid diffusion is also important (see Non-Patent Document 2). Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin. Patent Documents 1 to 3 disclose sulfonium salts having polymerizable olefin capable of generating a sulfonic acid and similar iodonium salts. Patent Document 1 discloses a polymer-bound sulfonium salt in which sulfonic acid is directly attached to the backbone.

It was avoided to use metal-containing materials as the photoresist material for the semiconductor lithography because of a possible malfunction of semiconductor devices. However, it is known in the application other than the semiconductor, for example, as the resist material for forming color filters for LCD (see Patent Document 2), to use a metal-containing (meth)acrylate as a copolymerizable monomer. The metal-containing (meth)acrylate is typically contemplated as the antifouling paint for ships. Patent Document 3 shows many examples such as zinc acrylate, copper acrylate and magnesium acrylate.

Patent Document 4 discloses EB resist and antistatic film having alkali metal, alkaline earth metal and cesium salts added thereto. These salts improve the sensitivity on EB exposure at no sacrifice of resolution. Patent Document 5 discloses a chemically amplified resist composition having a metal salt of carboxylic acid or β-diketone added thereto. The metal salt of carboxylic acid or β-diketone functions as a quencher as it undergoes ion exchange with a sulfonic acid generated from the acid generator.

CITATION LIST

Patent Document 1: JP-A 2006-178317
Patent Document 2: JP-A 2009-237150
Patent Document 3: JP-A 2001-329228
Patent Document 4: JP-A 2010-152136
Patent Document 5: JP-A 2013-025211 (US 20130029270)
Non-Patent Document 1: SPIE Vol. 5039 p1 (2003)
Non-Patent Document 2: SPIE Vol. 6520 p65203L-1 (2007)

DISCLOSURE OF INVENTION

An object of the invention is to provide a resist composition which has both high resolution and sensitivity, and forms a pattern with a satisfactory profile and minimal line edge roughness after exposure and development; and a patterning process using the same.

In one aspect, the invention provides a resist composition comprising
a resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator,
said resist composition further comprising a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of an alkylsulfonic acid, arylsulfonic acid, alkylsulfonimidic acid, alkylsulfonemethide acid, and tetraphenylboric acid each of which has at least one fluorine atom.

In a preferred embodiment, the polymer comprises recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator,
said resist composition further comprising a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of a $C_1$-$C_4$ fluoroalkylsulfonic acid, $C_6$-$C_{12}$ arylsulfonic acid having at least one fluorine atom which may be substituted with hydroxy group, $C_1$-$C_{12}$ alkoxy group or acyloxy group, or sulfonyl group, tetraphenylboric acid having at least one fluorine atom, $C_1$-$C_4$ fluoroalkylsulfonimidic acid, and $C_1$-$C_4$ fluoroalkylsulfonemethide acid.

In a further preferred embodiment, the polymer comprising recurring units of acid labile group-substituted (meth)acrylic acid, styrenecarboxylic acid or vinylnaphthalenecarboxylic acid and/or recurring units having an acid labile group-substituted phenolic hydroxyl group has recurring units (a1) and/or (a2), as represented by the general formula (1).

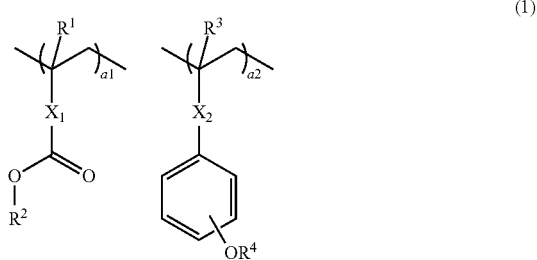

Herein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety and naphthylene moiety, a phenylene group, or a naphthylene group, $X_2$ is a single bond or an ester or amide group, a1 and a2 are numbers in the range; $0 \leq a1 \leq 0.9$, $0 \leq a2 \leq 0.9$, and $0 < a1+a2 < 1$.

Preferably, in addition to the recurring units (a1) and (a2), the polymer may comprise recurring units (b1), (b2) or (b3) of a sulfonium salt having the general formula (2).

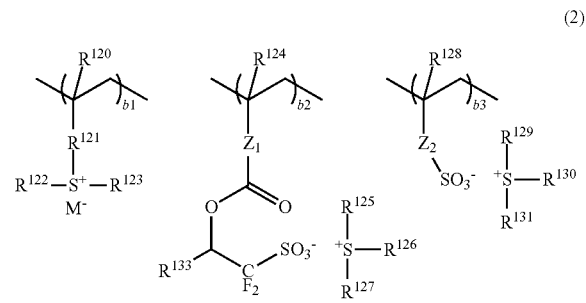

Herein $R^{120}$, $R^{124}$, and $R^{128}$ each are hydrogen or methyl, $R^{121}$ is a single bond, phenylene, —O—R—, or —C(=O)—Y—R—, Y is oxygen or NH, R is a straight, branched or cyclic $C_1$-$C_6$ alkylene group, $C_3$-$C_{10}$ alkenylene or phenylene group, which may contain a carbonyl, ester, ether or hydroxyl moiety, $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or phenylthio group which may contain a straight, branched or cyclic $C_1$-$C_{10}$ alkyl, halogen, trifluoromethyl, cyano, nitro, hydroxyl, alkoxy, alkoxycarbonyl or acyloxy radical, $Z_1$ is a single bond or —C(=O)—$Z_3$—$R^{132}$—, $Z_2$ is a single bond, methylene, ethylene, phenylene, fluorinated phenylene, —O—$R^{132}$— or —C(=O)—$Z_3$—$R^{132}$—, $Z_3$ is oxygen or NH, $R^{132}$ is a straight, branched or cyclic $C_1$-$C_6$ alkylene group, alkenylene, or phenylene group, which may contain a carbonyl, ester, ether or hydroxyl moiety, a pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom, $R^{133}$ is hydrogen or trifluoromethyl, $M^-$ is a non-nucleophilic counter ion, b1, b2 and b3 are in the range of $0 \leq b1 \leq 0.5$, $0 \leq b2 \leq 0.5$, $0 \leq b3 \leq 0.5$, and $0 < b1+b2+b3 \leq 0.5$. Typically, the polymer comprises recurring units (b2) of sulfonium salt having formula (2).

In a preferred embodiment, the complex is at least one selected from those complexes having the following general formulae.

$Ce^{3+} (R^{11}SO_3^-)_3$  $Ce^{4+} (R^{11}SO_3^-)_4$  $Zn^{2+} (R^{11}SO_3^-)_2$
$Cu^{2+} (R^{11}SO_3^-)_2$  $In^{3+} (R^{11}SO_3^-)_3$  $Fe^{3+} (R^{11}SO_3^-)_3$
$Yb^{3+} (R^{11}SO_3^-)_3$  $Y^{3+} (R^{11}SO_3^-)_3$  $Tm^{3+} (R^{11}SO_3^-)_3$
$Sn^{2+} (R^{11}SO_3^-)_2$  $Ni^{2+} (R^{11}SO_3^-)_2$  $Sc^{3+} (R^{11}SO_3^-)_3$
$Hf^{4+} (R^{11}SO_3^-)_4$  $Nd^{3+} (R^{11}SO_3^-)_3$  $Ti^{4+} (R^{11}SO_3^-)_4$
$Zr^{4+} (R^{11}SO_3^-)_4$  $Ba^{2+} (R^{11}SO_3^-)_2$  $Ho^{3+} (R^{11}SO_3^-)_3$
$Tb^{3+} (R^{11}SO_3^-)_3$  $Lu^{3+} (R^{11}SO_3^-)_3$  $La^{3+} (R^{11}SO_3^-)_3$
$Ag^+ R^{11}SO_3^-$  $Eu^{3+} (R^{11}SO_3^-)_3$  $Dy^{3+} (R^{11}SO_3^-)_3$
$Gd^{3+} (R^{11}SO_3^-)_3$  $Rb^+ R^{11}SO_3^-$  $Sr^{2+} (R^{11}SO_3^-)_2$
$Cs^+ R^{11}SO_3^-$  $Ce^{3+} (R^{15}SO_2N^-SO_2R^{16})_3$  $Ce^{4+} (R^{15}SO_2N^-SO_2R^{16})_4$
$Zn^{2+} (R^{15}SO_2N^-SO_2R^{16})_2$  $Cu^{2+} (R^{15}SO_2N^-SO_2R^{16})_2$
$In^{3+} (R^{15}SO_2N^-SO_2R^{16})_3$  $Fe^{3+} (R^{15}SO_2N^-SO_2R^{16})_3$
$Yb^{3+} (R^{15}SO_2N^-SO_2R^{16})_3$  $Y^{3+} (R^{15}SO_2N^-SO_2R^{16})_3$
$Tm^{3+} (R^{15}SO_2N^-SO_2R^{16})_3$  $Sn^{2+} (R^{15}SO_2N^-SO_2R^{16})_2$
$Ni^{2+} (R^{15}SO_2N^-SO_2R^{16})_2$  $Sc^{3+} (R^{15}SO_2N^-SO_2R^{16})_3$
$Hf^{4+} (R^{15}SO_2N^-SO_2R^{16})_4$  $Nd^{3+} (R^{15}SO_2N^-SO_2R^{16})_3$
$Ti^{4+} (R^{15}SO_2N^-SO_2R^{16})_4$  $Zr^{4+} (R^{15}SO_2N^-SO_2R^{16})_4$
$Ba^{2+} (R^{15}SO_2N^-SO_2R^{16})_2$  $Ho^{3+} (R^{15}SO_2N^-SO_2R^{16})_3$
$Tb^{3+} (R^{15}SO_2N^-SO_2R^{16})_3$  $Lu^{3+} (R^{15}SO_2N^-SO_2R^{16})_3$
$La^{3+} (R^{15}SO_2N^-SO_2R^{16})_3$  $Ag^+ R^{15}SO_2N^-SO_2R^{16}$
$Eu^{3+} (R^{15}SO_2N^-SO_2R^{16})_3$  $Dy^{3+} (R^{15}SO_2N^-SO_2R^{16})_3$
$Gd^{3+} (R^{15}SO_2N^-SO_2R^{16})_3$  $Rb^+ R^{15}SO_2N^-SO_2R^{16}$
$Sr^{2+} (R^{15}SO_2N^-SO_2R^{16})_2$  $Cs^+ R^{15}SO_2N^-SO_2R^{16}$

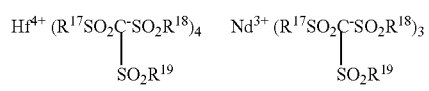
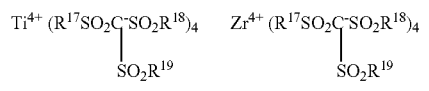
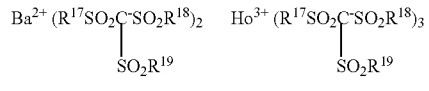
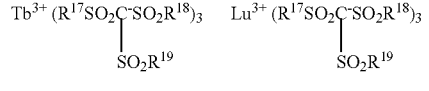
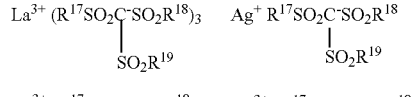
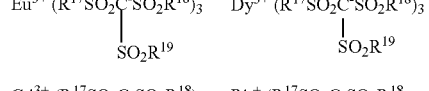
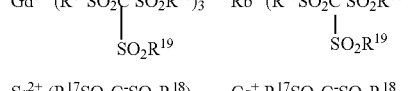
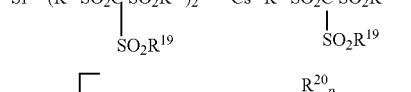

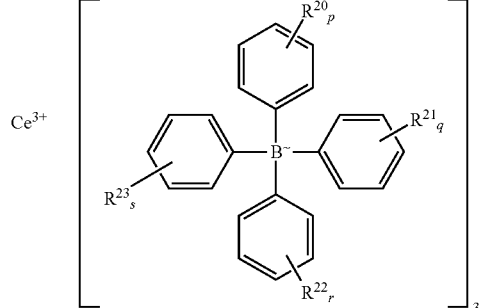

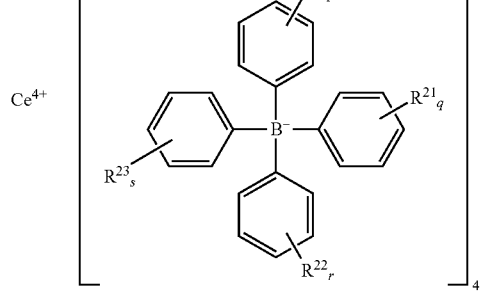

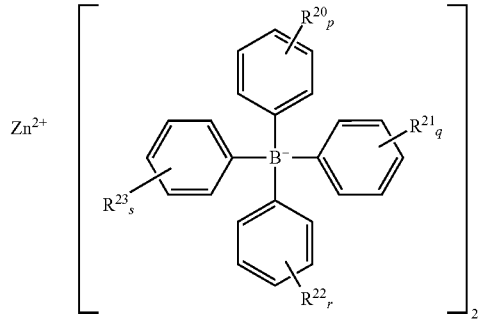

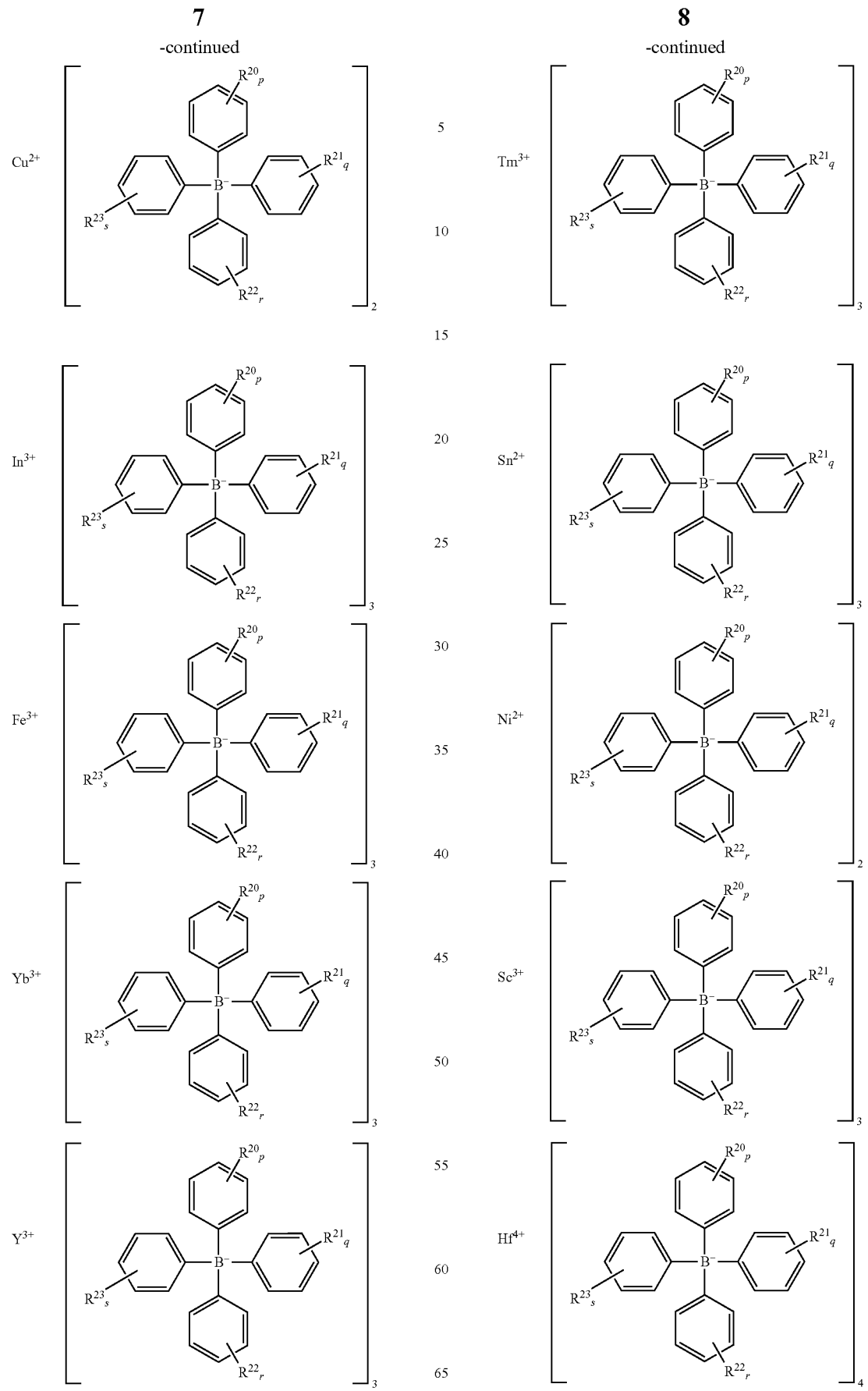

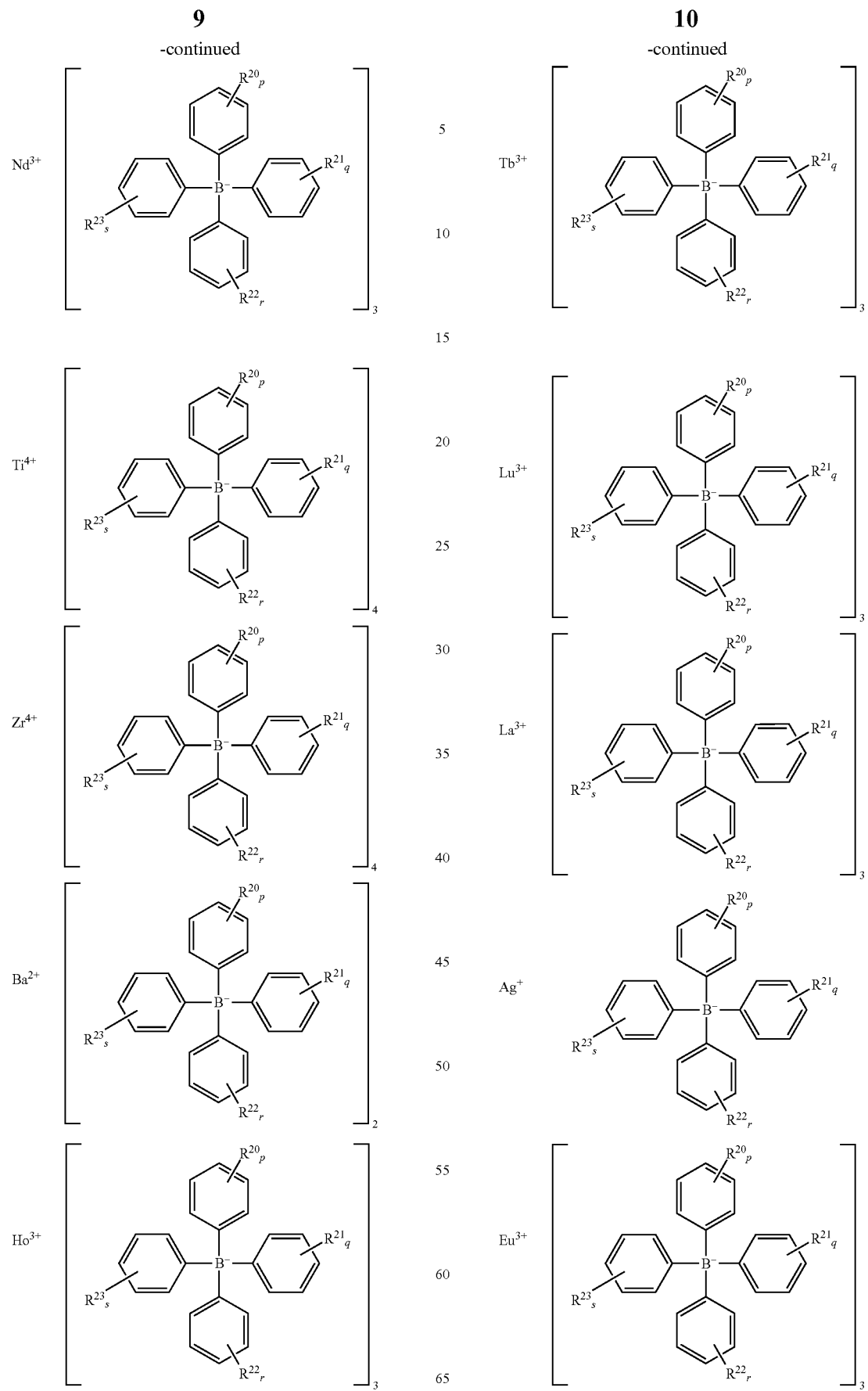

-continued

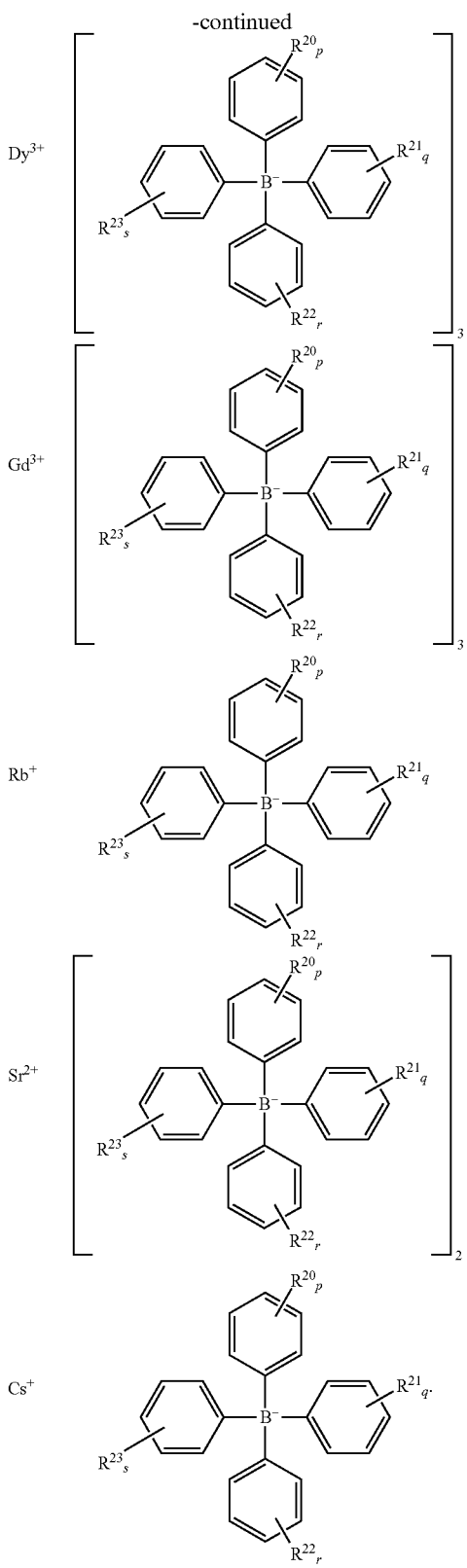

Herein $R^{11}$ is fluorine or an organic group selected from the group consisting of trifluoromethyl, pentafluoroethyl, trifluoroethyl, octafluorobutyl, nonafluorobutyl, 2-fluorophenyl, 3-fluorophenyl, 4-fluorophenyl, 2,4-difluorophenyl, 2,3-difluorophenyl, 3,4-difluorophenyl, 3,5-difluorophenyl, 2,4,5-trifluorophenyl, 2,3,4-trifluorophenyl, 2,3,4,5-tetrafluorophenyl, 2,3,5,6-tetrafluorophenyl, 2,3,4,5,6-pentafluorophenyl, 2-trifluoromethylphenyl, 3-trifluoromethylphenyl, 4-trifluoromethylphenyl, 2,4-di(trifluoromethyl)phenyl, 4-hydroxy-2,3,5,6-tetrafluorophenyl, 4-methoxy-2,3,5,6-tetrafluorophenyl, 4-acetoxy-2,3,5,6-tetrafluorophenyl, 4-pivaloyloxy-2,3,5,6-tetrafluorophenyl, 4-cyclohexylcarbonyloxy-2,3,5,6-tetrafluorophenyl, 4-adamantylcarbonyloxy-2,3,5,6-tetrafluorophenyl, 4-phenylcarbonyloxy-2,3,5,6-tetrafluorophenyl, 4-cyclohexylsulfonyl-2,3,5,6-tetrafluorophenyl, and 4-phenylsulfonyl-2,3,5,6-tetrafluorophenyl; $R^{15}$, $R^{16}$, $R^{17}$, $R^{18}$, and $R^{19}$ are each independently fluorine, trifluoromethyl, pentafluoroethyl, trifluoroethyl, octafluorobutyl, or nonafluorobutyl, $R^{15}$ and $R^{16}$ may bond together to form a ring; $R^{20}$, $R^{21}$, $R^{22}$, and $R^{23}$ are each independently fluorine or trifluoromethyl, each of p, q, r and s is an integer of 1 to 5.

Typically, the resist composition is a chemically amplified positive resist composition.

The resist composition may further comprise at least one component selected from among an organic solvent, a dissolution inhibitor, an acid generator, a basic compound, and a surfactant.

In another aspect, the invention provides a pattern forming process comprising the steps of coating the resist composition defined above onto a substrate, baking, exposing the resulting resist film to high-energy radiation, and developing with a developer.

Preferably, the high-energy radiation is EUV radiation having a wavelength of 3 to 15 nm or an EB at an accelerating voltage of 1 to 150 keV.

In the step of exposing the resist film to high-energy radiation, preferably the surface of the substrate underneath the resist film is electrically charged positive.

Advantageous Effects of Invention

The resist composition has many advantages including a significantly high contrast of alkaline dissolution rate before and after exposure, a high sensitivity, a high resolution, a satisfactory pattern profile after exposure, a controlled rate of acid diffusion, and a minimal line edge roughness. The resist composition, typically chemically amplified positive resist composition is suited as the micropatterning material for VLSIs and photomasks, and the patterning material in the EB and EUV lithography.

DESCRIPTION OF EMBODIMENTS

The singular forms "a," "an" and "the" include plural referents unless the context clearly dictates otherwise. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.
UV: ultraviolet radiation
DUV: deep ultraviolet
EUV: extreme ultraviolet
EB: electron beam
Mw: weight average molecular weight
Mn: number average molecular weight
Mw/Mn: molecular weight distribution or dispersity
GPC: gel permeation chromatography PEB: post-exposure bake LER: line edge roughness LWR: line width roughness While the effort to reduce the pattern rule is in rapid progress to meet the demand for higher integration density and operating speed of LSIs as alluded to previously, there is a need for a resist composition which has a high resolution and a high sensitivity and forms a pattern with a satisfactory profile and minimal line edge roughness through exposure and development.

Seeking for a resist material having a high resolution, high sensitivity and minimal line edge roughness, the inventor has found that a resist composition, typically chemically amplified positive resist composition, comprising a polymer comprising recurring units having an acid labile group gives better results of lithography when a complex of a specific metal with a fluorinated alkylsulfonic acid, fluorinated arylsulfonic acid, fluorinated tetraphenylboric acid, fluorinated alkylsulfonimidic acid or fluorinated alkylsulfonemethide acid is added thereto.

More particularly, when a polymer obtained from polymerization of an acid labile group-substituted (meth)acrylic acid, styrenecarboxylic acid or vinylnaphthalenecarboxylic acid monomer and/or a monomer having an acid labile group-substituted phenolic hydroxyl group or a copolymer obtained from copolymerization of the foregoing monomer or monomers with a sulfonium salt monomer having polymerizable olefin is used as the base resin and a complex of a specific metal with a selected acid is added thereto, there is formulated a resist composition, typically chemically amplified positive resist composition which has many advantages including a high sensitivity, a satisfactory pattern profile after exposure, and a minimal line edge roughness. In addition, the resist composition is effective for preventing electrostatic charges during EB image writing. The resist composition is thus suited as the micropatterning material for the fabrication of VLSIs and photomasks.

One embodiment of the invention is a resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and a complex of a metal with an acid, the metal being selected from among cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from among an alkylsulfonic acid, arylsulfonic acid, tetraphenylboric acid, alkylsulfonimidic acid, and alkylsulfonemethide acid each of which has at least one fluorine atom, preferably being selected from among a $C_1$-$C_4$ fluoroalkylsulfonic acid, $C_6$-$C_{12}$ arylsulfonic acid having at least one fluorine atom, tetraphenylboric acid having at least one fluorine atom, $C_1$-$C_4$ fluoroalkylsulfonimidic acid, and $C_1$-$C_4$ fluoroalkylsulfonemethide acid.

Specifically, the polymer comprises recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, which may be represented by the general formula (1).

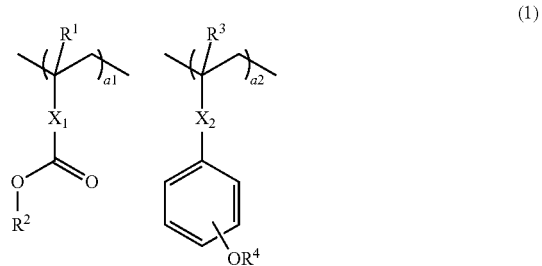

Herein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety and naphthylene moiety, a phenylene group, or a naphthylene group, $X_2$ is a single bond or an ester or amide group, a1 and a2 are numbers in the range: $0 \leq a1 \leq 0.9$, $0 \leq a2 \leq 0.9$, and $0 < a1+a2 < 1$.

In addition to the recurring units (a1) and (a2), the polymer may comprise recurring units (b1), (b2) or (b3) of a sulfonium salt having the general formula (2).

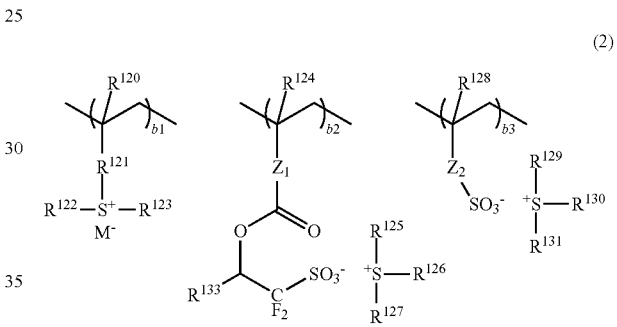

Herein $R^{120}$, $R^{124}$, and $R^{128}$ each are hydrogen or methyl. $R^{121}$ is a single bond, phenylene, —O—R—, or —C(=O)—Y—R— wherein Y is oxygen or NH, and R is a straight, branched or cyclic $C_1$-$C_6$ alkylene group, $C_3$-$C_{10}$ alkenylene or phenylene group, which may contain a carbonyl (—CO—), ester (—COO—), ether (—O—) or hydroxyl moiety. $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or phenylthio group which may contain a straight, branched or cyclic $C_1$-$C_{10}$ alkyl, halogen, trifluoromethyl, cyano, nitro, hydroxyl, alkoxy, alkoxycarbonyl or acyloxy radical. $Z_1$ is a single bond or —C(=O)—$Z_3$—$R^{132}$—. $Z_2$ is a single bond, methylene, ethylene, phenylene, fluorinated phenylene, —O—$R^{132}$— or —C(=O)—$Z_3$—$R^{132}$— wherein $Z_3$ is oxygen or NH, and $R^{132}$ is a straight, branched or cyclic $C_1$-$C_6$ alkylene group, alkenylene, or phenylene group, which may contain a carbonyl, ester, ether or hydroxyl moiety. A pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom. $R^{133}$ is hydrogen or trifluoromethyl. M⁻ is a non-nucleophilic counter ion. The subscripts b1, b2 and b3 are in the range of $0 \leq b1 \leq 0.5$, $0 \leq b2 \leq 0.5$, $0 \leq b3 \leq 0.5$, and $0 < b1+b2+b3 \leq 0.5$.

The binding of the acid generator with the polymer is effective for shortening the distance of acid diffusion and reducing edge roughness. Of the recurring units (b1), (b2) and (b3) of sulfonium salt represented by formula (2), units (b2) are most preferred.

According to the invention, a complex of a specific metal having high absorption of EUV radiation with an alkylsulfonic acid having at least one fluorine atom, arylsulfonic acid having at least one fluorine atom, tetraphenylboric acid having at least one fluorine atom, alkylsulfonimidic acid having at least one fluorine atom or alkylsulfonemethide acid having at least one fluorine atom is added to the polymer comprising acid labile group-bearing recurring units (a1) and/or (a2) and optionally acid generator-bearing recurring units (b1), (b2) or (b3) in the resist composition. The addition of the specific metal-acid complex is effective for increasing the sensitivity of the resist film by the mechanism that secondary electrons are generated from the metal during exposure and act to induce decomposition of the acid generator. Although a sensitivity increase can be achieved by elevating the PEB temperature or prolonging the PEB time, the acid diffusion distance is increased in either case, resulting in exaggerated LWR. In contrast, the addition of the specific metal-acid complex ensures a high sensitivity and low LWR because of suppressed acid diffusion and a high efficiency of acid generation.

Accordingly, the resist composition has many advantages including a high dissolution contrast, a high resolution, a high sensitivity, exposure latitude, process adaptability, a good pattern profile after exposure, and minimized LWR. Because of these advantages, the resist composition is fully viable in practice and best suited as the micropatterning resist material for the fabrication of VLSIs. The resist composition, typically chemically amplified positive resist composition is used not only in the lithography for forming semiconductor circuits, but also in the formation of mask circuit patterns, micromachines, and thin-film magnetic head circuits.

In the resist composition, a complex of a specific metal with an alkylsulfonic acid having at least one fluorine atom, arylsulfonic acid having at least one fluorine atom, tetraphenylboric acid having at least one fluorine atom, alkylsulfonimidic acid having at least one fluorine atom or alkylsulfonemethide acid having at least one fluorine atom is added to the polymer. Specifically, a complex of a metal selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, with an acid selected from the group consisting of an alkylsulfonic acid, arylsulfonic acid, tetraphenylboric acid, alkylsulfonimidic acid, and alkylsulfonemethide acid, preferably a $C_1$-$C_4$ fluoroalkylsulfonic acid, $C_6$-$C_{12}$ arylsulfonic acid having at least one fluorine atom, tetraphenylboric acid having at least one fluorine atom, $C_1$-$C_4$ fluoroalkylsulfonimidic acid, and $C_1$-$C_4$ fluoroalkylsulfonemethide acid is added. Throughout the disclosure, this complex is sometimes referred to as "specific metal-acid complex" for simplicity's sake.

A sulfonic acid having fluorine substituted at α-position, imidic acid or methide acid generated from an acid generator does not undergo ion exchange with the specific metal-acid complex. If ion exchange occurs, the metal functions as a quencher, suggesting that the addition of the metal-acid complex invites a sensitivity lowering. When on exchange does not occur, any sensitivity lowering is avoided and the sensitivity is rather improved by secondary electrons generated from the metal.

The specific metal-acid complexes (i.e., complexes of a metal selected from among cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, with an alkylsulfonic acid having at least one fluorine atom, arylsulfonic acid having at least one fluorine atom, tetraphenylboric acid having at least one fluorine atom, alkylsulfonimidic acid having at least one fluorine atom, or alkylsulfonemethide acid having at least one fluorine atom, preferably a $C_1$-$C_4$ fluoroalkylsulfonic acid, $C_6$-$C_{12}$ arylsulfonic acid having at least one fluorine atom, tetraphenylboric acid having at least one fluorine atom, $C_1$-$C_4$ fluoroalkylsulfonimidic acid, or $C_1$-$C_4$ fluoroalkylsulfonemethide acid) may be classified into the following four Groups A, B, C and D wherein complexes are represented by general formulae. The $C_6$-$C_{12}$ arylsulfonic acid may be substituted with hydroxy group, $C_1$-$C_{12}$ alkoxy group or acyloxy group, or sulfonyl group.

Group A

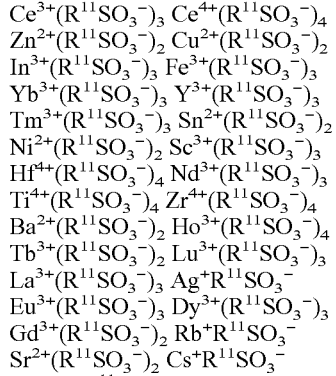

$Ce^{3+}(R^{11}SO_3^-)_3$  $Ce^{4+}(R^{11}SO_3^-)_4$
$Zn^{2+}(R^{11}SO_3^-)_2$  $Cu^{2+}(R^{11}SO_3^-)_2$
$In^{3+}(R^{11}SO_3^-)_3$  $Fe^{3+}(R^{11}SO_3^-)_3$
$Yb^{3+}(R^{11}SO_3^-)_3$  $Y^{3+}(R^{11}SO_3^-)_3$
$Tm^{3+}(R^{11}SO_3^-)_3$  $Sn^{2+}(R^{11}SO_3^-)_2$
$Ni^{2+}(R^{11}SO_3^-)_2$  $Sc^{3+}(R^{11}SO_3^-)_3$
$Hf^{4+}(R^{11}SO_3^-)_4$  $Nd^{3+}(R^{11}SO_3^-)_3$
$Ti^{4+}(R^{11}SO_3^-)_4$  $Zr^{4+}(R^{11}SO_3^-)_4$
$Ba^{2+}(R^{11}SO_3^-)_2$  $Ho^{3+}(R^{11}SO_3^-)_4$
$Tb^{3+}(R^{11}SO_3^-)_2$  $Lu^{3+}(R^{11}SO_3^-)_3$
$La^{3+}(R^{11}SO_3^-)_3$  $Ag^+R^{11}SO_3^-$
$Eu^{3+}(R^{11}SO_3^-)_3$  $Dy^{3+}(R^{11}SO_3^-)_3$
$Gd^{3+}(R^{11}SO_3^-)_2$  $Rb^+R^{11}SO_3^-$
$Sr^{2+}(R^{11}SO_3^-)_2$  $Cs^+R^{11}SO_3^-$

Herein $R^{11}$ is fluorine or an organic group selected from among trifluoromethyl, pentafluoroethyl, trifluoroethyl, octafluorobutyl, nonafluorobutyl, 2-fluorophenyl, 3-fluorophenyl, 4-fluorophenyl, 2,4-difluorophenyl, 2,3-difluorophenyl, 3,4-difluorophenyl, 3,5-difluorophenyl, 2,4,5-trifluorophenyl, 2,3,4-trifluorophenyl, 2,3,4,5-tetrafluorophenyl, 2,3,5,6-tetrafluorophenyl, 2,3,4,5,6-pentafluorophenyl, 2-trifluoromethylphenyl, 3-trifluoromethylphenyl, 4-trifluoromethylphenyl, 2,4-di(trifluoromethyl)phenyl, 4-hydroxy-2,3,5,6-tetrafluorophenyl, 4-methoxy-2,3,5,6-tetrafluorophenyl, and 4-acetoxy-2,3,5,6-tetrafluorophenyl.

Group B

$Ce^{3+}(R^{15}SO_2N^-SO_2R^{16})_3$  $Ce^{4+}(R^{15}SO_2N^-SO_2R^{16})_4$
$Zn^{2+}(R^{15}SO_2N^-SO_2R^{16})_2$  $Cu^{2+}(R^{15}SO_2N^-SO_2R^{16})_2$
$In^{3+}(R^{15}SO_2N^-SO_2R^{16})_3$  $Fe^{3+}(R^{14}SO_2N^-SO_2R^{16})_3$
$Yb^{3+}(R^{15}SO_2N^-SO_2R^{16})_3$  $Y^{3+}(R^{15}SO_2N^-SO_2R^{16})_3$
$Tm^{3+}(R^{15}SO_2N^-SO_2R^{16})_2$  $Sn^{2+}(R^{15}SO_2N^-SO_2R^{16})_3$
$Ni^{2+}(R^{15}SO_2N^-SO_2R^{16})_4$  $Nd^{3+}(R^{15}SO_2N^-SO_2R^{16})_3$
$Hf^{4+}(R^{15}SO_2N^-SO_2R^{16})_4$  $Nd^{3+}(R^{15}SO_2N^-SO_2R^{16})_3$
$Ti^{4+}(R^{15}SO_2N^-SO_2R^{16})_4$  $Zr^{4+}(R^{15}SO_2N^-SO_2R^{16})_4$
$Ba^{2+}(R^{15}SO_2N^-SO_2R^{16})_2$  $Ho^{3+}(R^{15}SO_2N^-SO_2R^{16})_3$
$Tb^{3+}(R^{15}SO_2N^-SO_2R^{16})_3$  $Lu^{3+}(R^{15}SO_2N^-SO_2R)_3$
$La^{3+}(R^{15}SO_2N^-SO_2R^{16})_3$  $Ag^+(R^{15}SO_2N^-SO_2R^{16}$
$Eu^{3+}(R^{15}SO_2N^-SO_2R^{16})_3$  $Dy^{3+}(R^{15}SO_2N^-SO_2R^{16})_3$
$Gd^{3+}(R^{15}SO_2N^-SO_2R^{16})_3$  $Rb^+R^{15}SO_2N^-SO_2R^{16}$
$Sr^{2+}(R^{15}SO_2N^-SO_2R^{16})_2$  $Cs^+R^{15}SO_2N^-SO_2R^{16}$

Herein $R^{15}$ and $R^{16}$ each are fluorine, trifluoromethyl, pentafluoroethyl, trifluoroethyl, octafluorobutyl or nonafluorobutyl. $R^{15}$ and $R^{16}$ may bond together to form a ring with $SO_2N^-SO_2$. In this case, $R^{15}$ and $R^{16}$ bond together to form —$(CF_2)_n$— wherein n is an integer of 2 to 5.

Group C

Ce$^{3+}$ (R$^{17}$SO$_2$C$^-$SO$_2$R$^{18}$)$_3$     Ce$^{4+}$ (R$^{17}$SO$_2$C$^-$SO$_2$R$^{18}$)$_4$
        |                                       |
    SO$_2$R$^{19}$                       SO$_2$R$^{19}$

Zn$^{2+}$ (R$^{17}$SO$_2$C$^-$SO$_2$R$^{18}$)$_2$     Cu$^{2+}$ (R$^{17}$SO$_2$C$^-$SO$_2$R$^{18}$)$_2$
        |                                    |
    SO$_2$R$^{19}$                       SO$_2$R$^{19}$

In$^{3+}$ (R$^{17}$SO$_2$C$^-$SO$_2$R$^{18}$)$_3$     Fe$^{3+}$ (R$^{17}$SO$_2$C$^-$SO$_2$R$^{18}$)$_3$
        |                                    |
    SO$_2$R$^{19}$                       SO$_2$R$^{19}$

Yb$^{3+}$ (R$^{17}$SO$_2$C$^-$SO$_2$R$^{18}$)$_3$     Y$^{3+}$ (R$^{17}$SO$_2$C$^-$SO$_2$R$^{18}$)$_3$
        |                                    |
    SO$_2$R$^{19}$                       SO$_2$R$^{19}$

Tm$^{3+}$ (R$^{17}$SO$_2$C$^-$SO$_2$R$^{18}$)$_3$     Sn$^{2+}$ (R$^{17}$SO$_2$C$^-$SO$_2$R$^{18}$)$_2$
        |                                    |
    SO$_2$R$^{19}$                       SO$_2$R$^{19}$

Ni$^{2+}$ (R$^{17}$SO$_2$C$^-$SO$_2$R$^{18}$)$_2$     Sc$^{3+}$ (R$^{17}$SO$_2$C$^-$SO$_2$R$^{18}$)$_3$
        |                                    |
    SO$_2$R$^{19}$                       SO$_2$R$^{19}$

Hf$^{4+}$ (R$^{17}$SO$_2$C$^-$SO$_2$R$^{18}$)$_4$     Nd$^{3+}$ (R$^{17}$SO$_2$C$^-$SO$_2$R$^{18}$)$_3$
        |                                    |
    SO$_2$R$^{19}$                       SO$_2$R$^{19}$

Ti$^{4+}$ (R$^{17}$SO$_2$C$^-$SO$_2$R$^{18}$)$_4$     Zr$^{4+}$ (R$^{17}$SO$_2$C$^-$SO$_2$R$^{18}$)$_4$
        |                                    |
    SO$_2$R$^{19}$                       SO$_2$R$^{19}$

Ba$^{2+}$ (R$^{17}$SO$_2$C$^-$SO$_2$R$^{18}$)$_2$     Ho$^{3+}$ (R$^{17}$SO$_2$C$^-$SO$_2$R$^{18}$)$_3$
        |                                    |
    SO$_2$R$^{19}$                       SO$_2$R$^{19}$

Tb$^{3+}$ (R$^{17}$SO$_2$C$^-$SO$_2$R$^{18}$)$_3$     Lu$^{3+}$ (R$^{17}$SO$_2$C$^-$SO$_2$R$^{18}$)$_3$
        |                                    |
    SO$_2$R$^{19}$                       SO$_2$R$^{19}$

La$^{3+}$ (R$^{17}$SO$_2$C$^-$SO$_2$R$^{18}$)$_3$     Ag$^+$ R$^{17}$SO$_2$C$^-$SO$_2$R$^{18}$
        |                                    |
    SO$_2$R$^{19}$                       SO$_2$R$^{19}$

Eu$^{3+}$ (R$^{17}$SO$_2$C$^-$SO$_2$R$^{18}$)$_3$     Dy$^{3+}$ (R$^{17}$SO$_2$C$^-$SO$_2$R$^{18}$)$_3$
        |                                    |
    SO$_2$R$^{19}$                       SO$_2$R$^{19}$

Gd$^{3+}$ (R$^{17}$SO$_2$C$^-$SO$_2$R$^{18}$)$_3$     Rb$^+$ R$^{17}$SO$_2$C$^-$SO$_2$R$^{18}$
        |                                    |
    SO$_2$R$^{19}$                       SO$_2$R$^{19}$

Sr$^{2+}$ (R$^{17}$SO$_2$C$^-$SO$_2$R$^{18}$)$_2$     Cs$^+$ R$^{17}$SO$_2$C$^-$SO$_2$R$^{18}$
        |                                    |
    SO$_2$R$^{19}$                       SO$_2$R$^{19}$

Herein $R^{17}$, $R^{18}$, and $R^{19}$ are each independently fluorine, trifluoromethyl, pentafluoroethyl, trifluoroethyl, octafluorobutyl or nonafluorobutyl.

Group D

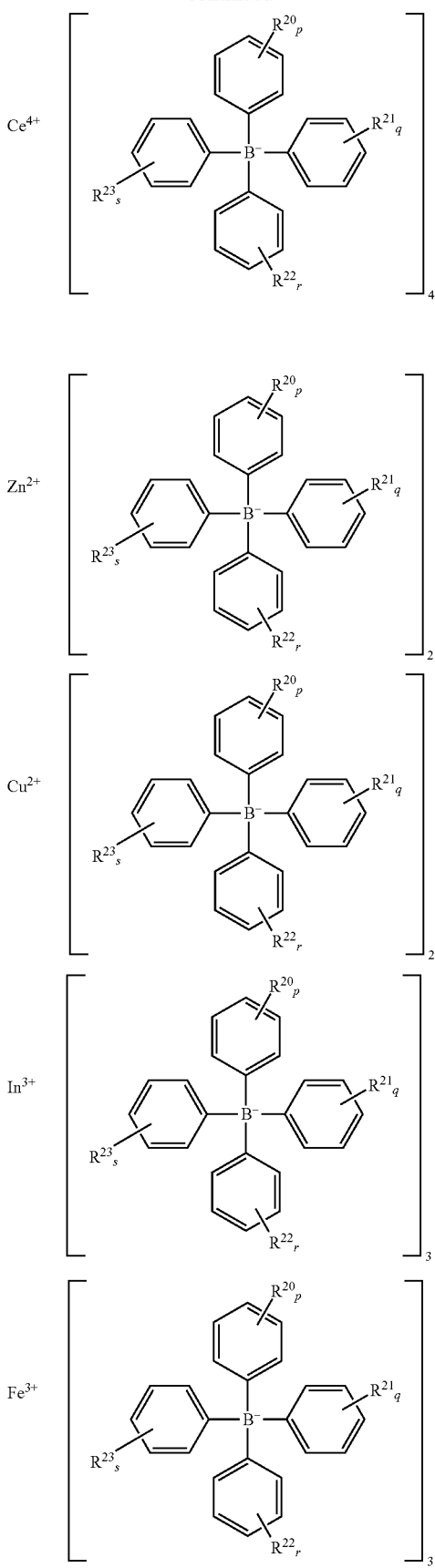

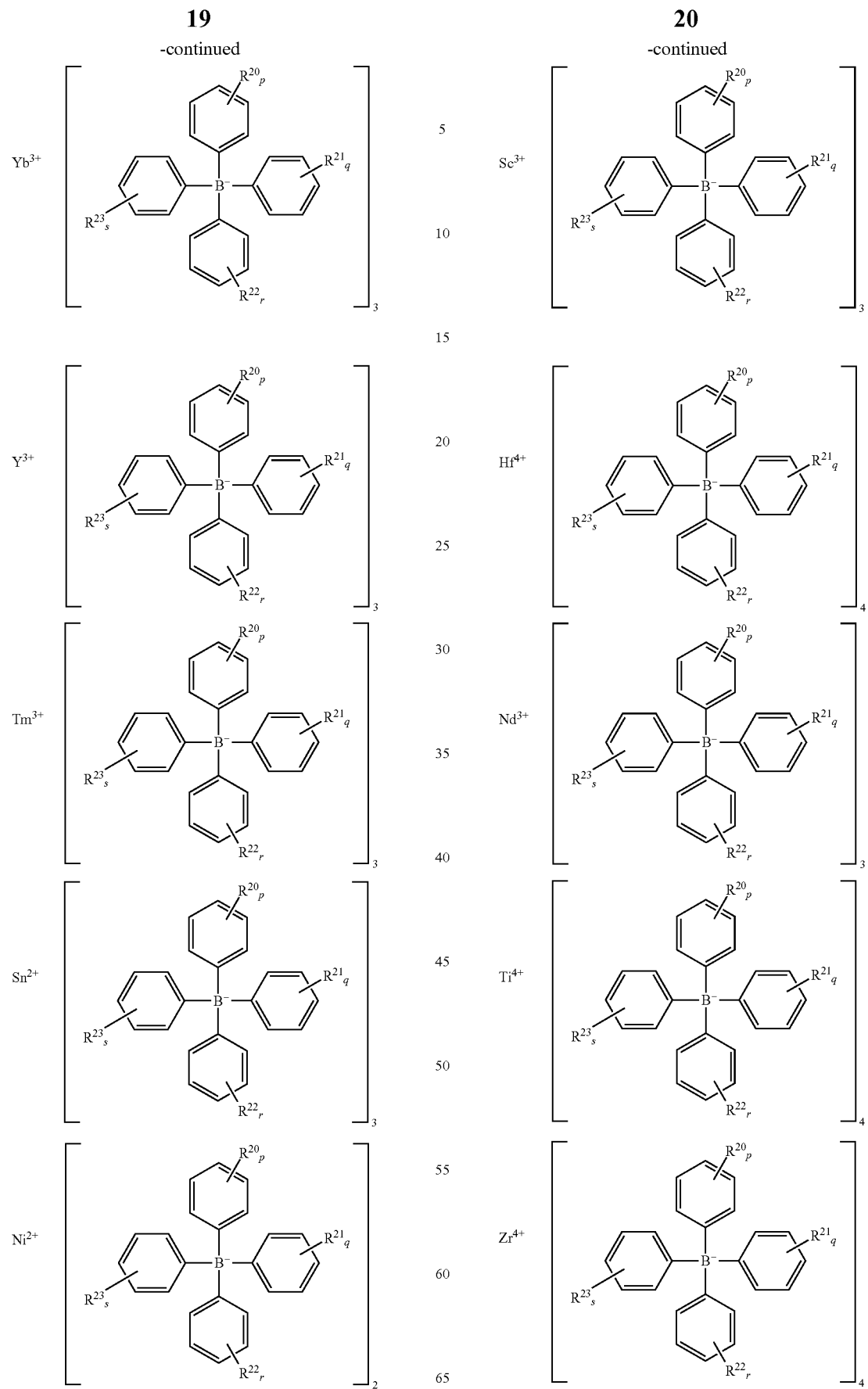

Ba²⁺ 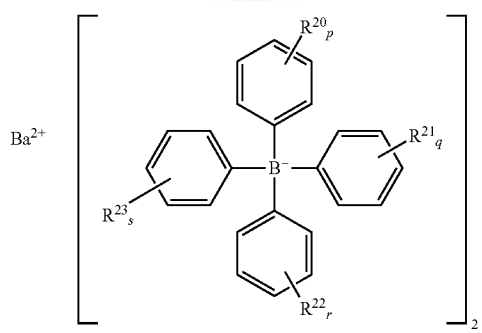
Ho³⁺ 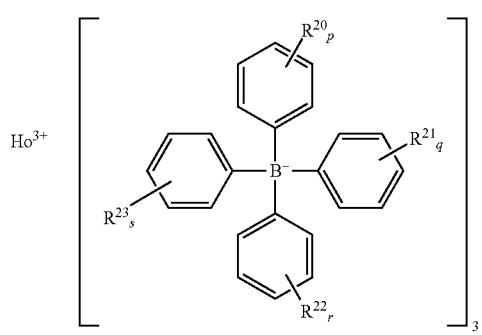
Tb³⁺ 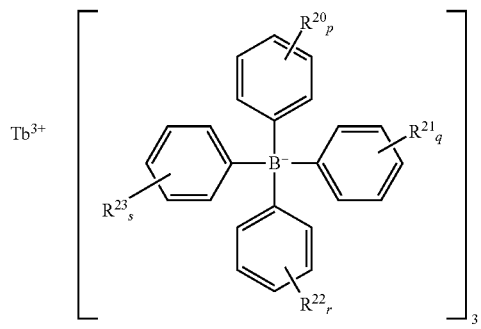
Lu³⁺ 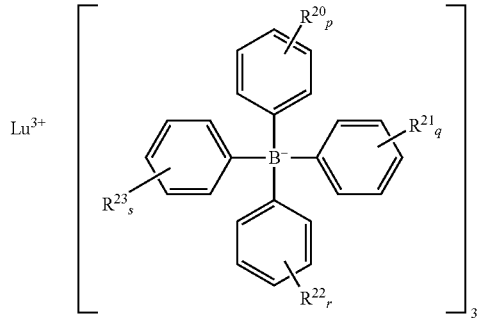
La³⁺ 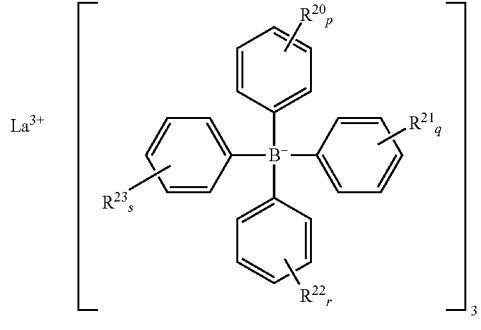
Ag⁺ 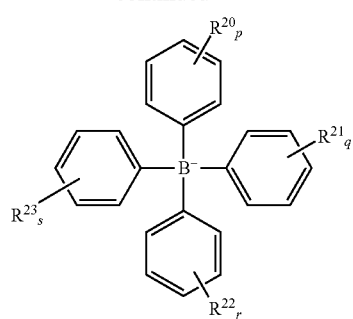
Eu³⁺ 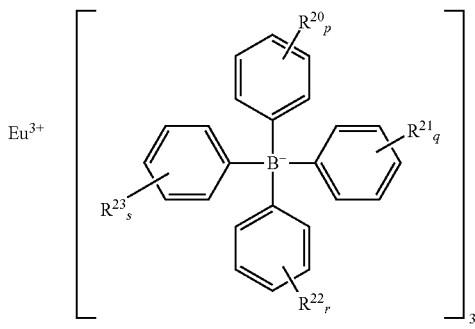
Dy³⁺ 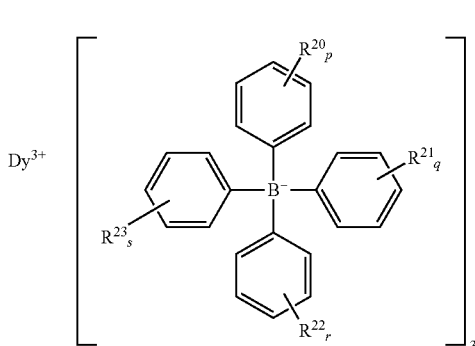
Gd³⁺ 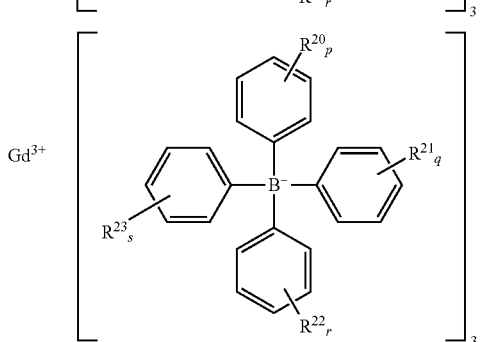
Rb⁺ 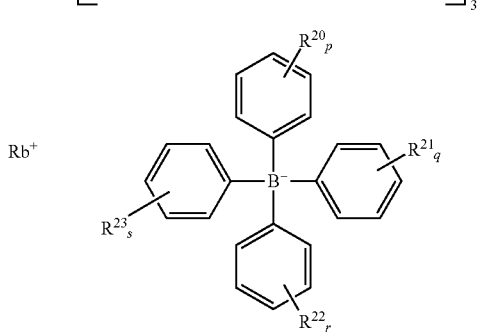

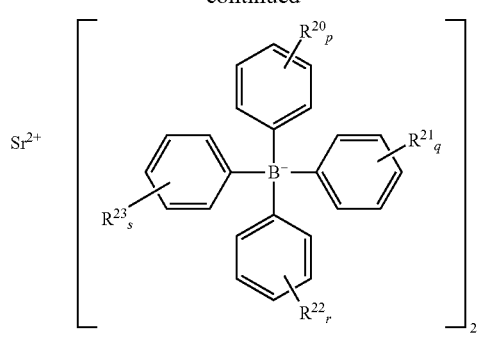

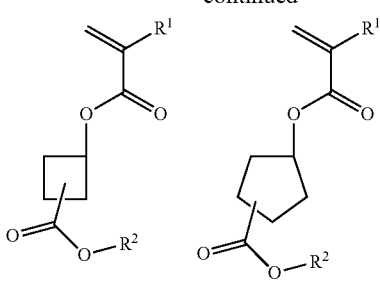

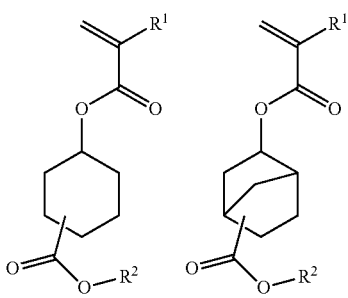

Herein $R^{20}$, $R^{21}$, $R^{22}$, and $R^{23}$ are each independently fluorine or trifluoromethyl, each of p, q, r and s is an integer of 1 to 5.

Of the recurring units in the polymer used herein, the acid labile group-bearing recurring units, that is, the recurring units (a1) in formula (1) are units in which the hydrogen atom of carboxyl group, specifically the hydrogen atom of hydroxyl group on (meth)acrylate is substituted by an acid labile group. Suitable monomers from which these units are derived are exemplified below.

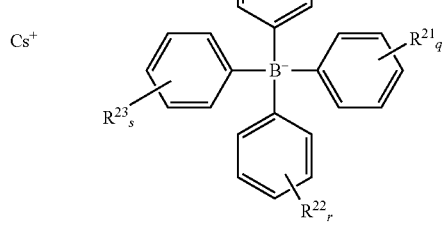

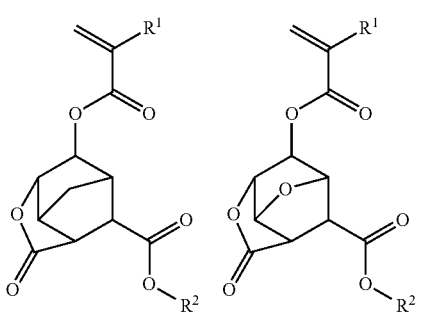

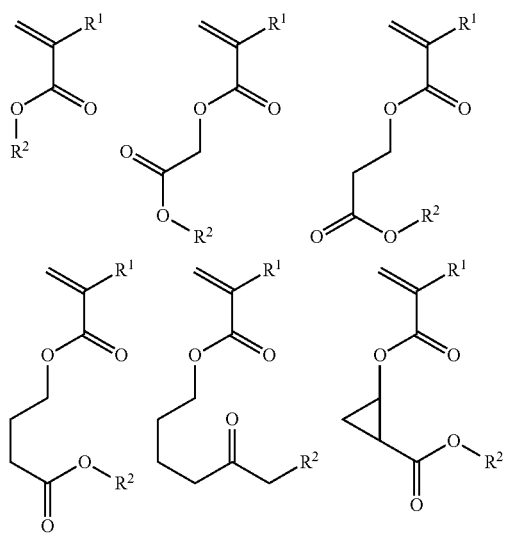

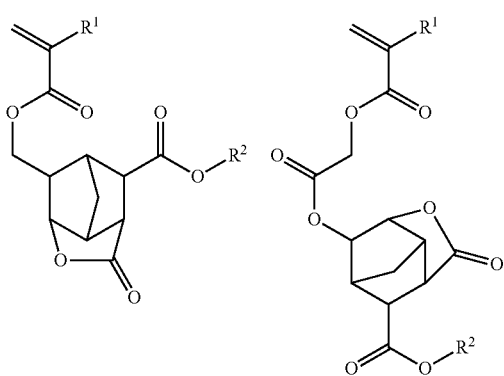

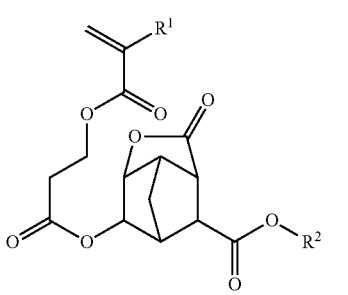

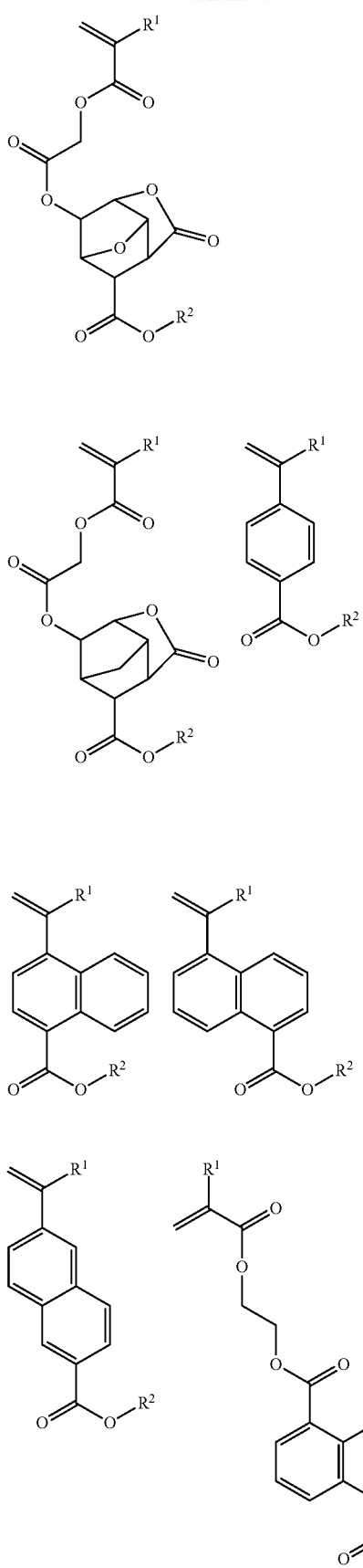

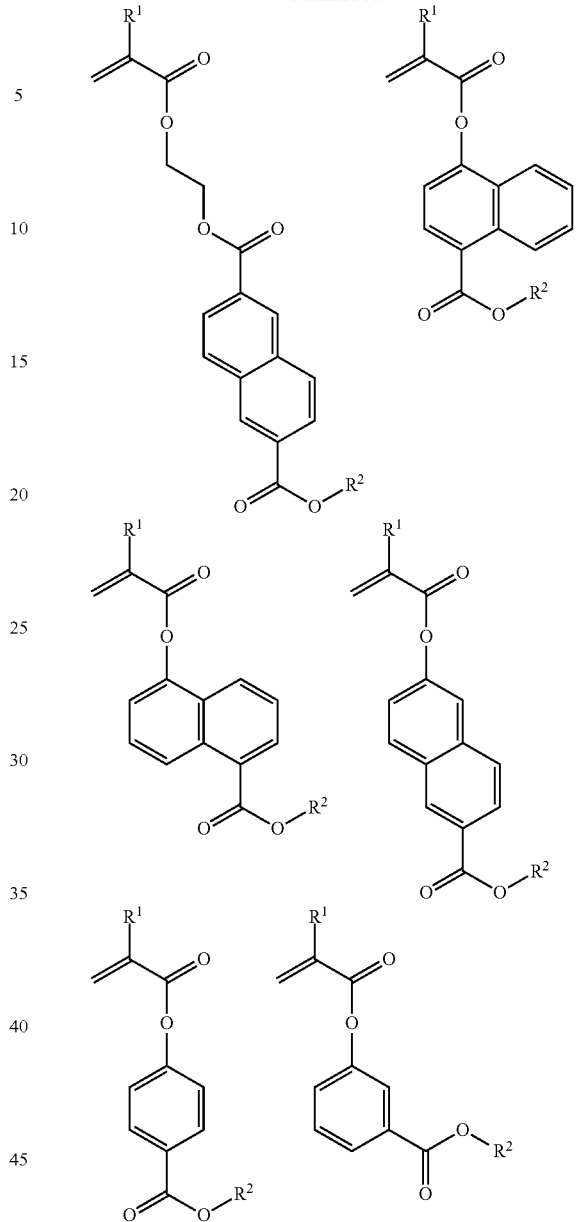

Herein $R^1$ and $R^2$ are as defined above.

The other acid labile group-bearing recurring units, that is, recurring unit (a2) in formula (1) are units in which the hydrogen atom of phenolic hydroxyl group, specifically the hydrogen atom of hydroxyl group on hydroxystyrene or hydroxyphenyl(meth)acrylate is substituted by an acid labile group. Suitable monomers from which these units are derived are exemplified below.

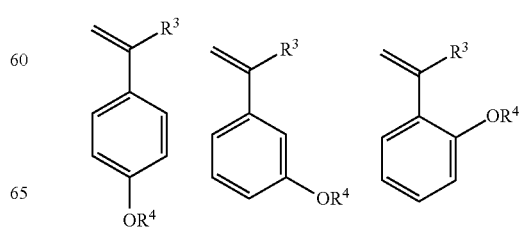

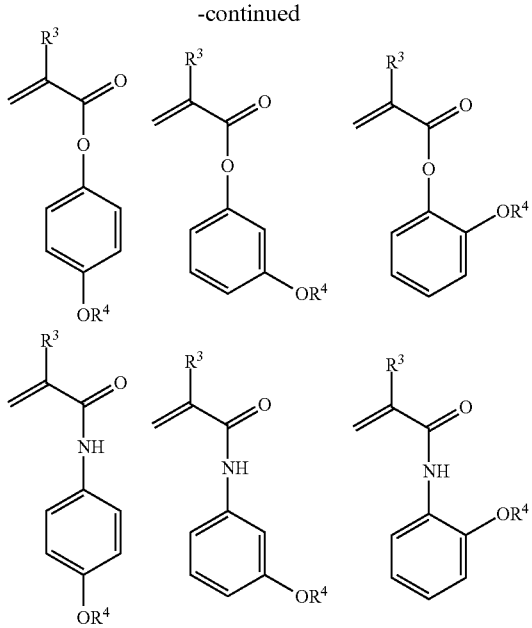

Herein R³ and R⁴ are as defined above.

The acid labile groups represented by R² and R⁴ may be selected from a variety of such groups. The acid labile groups may be the same or different and preferably include groups of the following formulae (A-1) to (A-3).

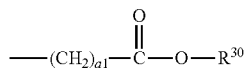 (A-1)

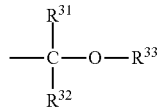 (A-2)

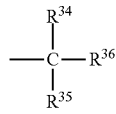 (A-3)

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a1 is an integer of 0 to 6.

In formula (A-2), $R^{31}$ and $R^{32}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

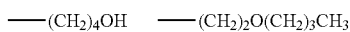

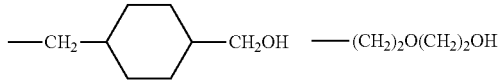

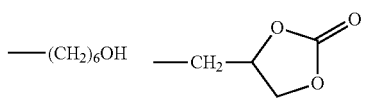

A pair of $R^{31}$ and $R^{32}$, $R^{31}$ and $R^{33}$, or $R^{32}$ and $R^{33}$ may bond together to form a ring with the carbon and oxygen atoms to which they are attached. Each of participant $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

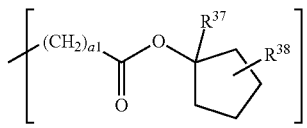 (A-1)-1

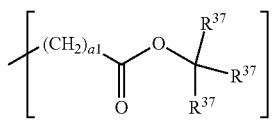 (A-1)-2

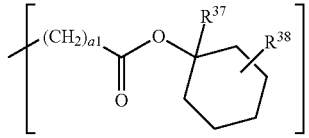 (A-1)-3

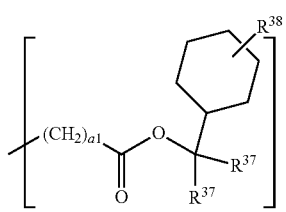 (A-1)-4

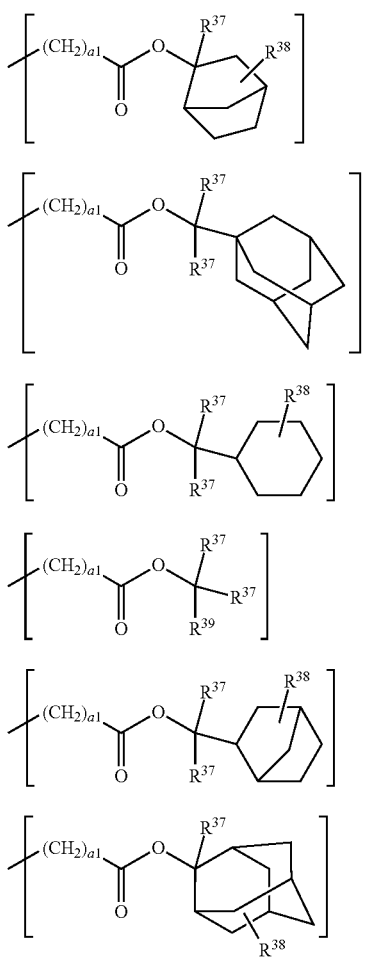

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{19}$ is each independently a straight, branched or cyclic $C_2$-$C_{10}$ alkyl group or $C_6$-$C_{20}$ aryl group, and a1 is as defined above.

Of the acid labile groups of formula (A-2), the straight and branched ones are exemplified by the following groups having formulae (A-2)-1 to (A-2)-69.

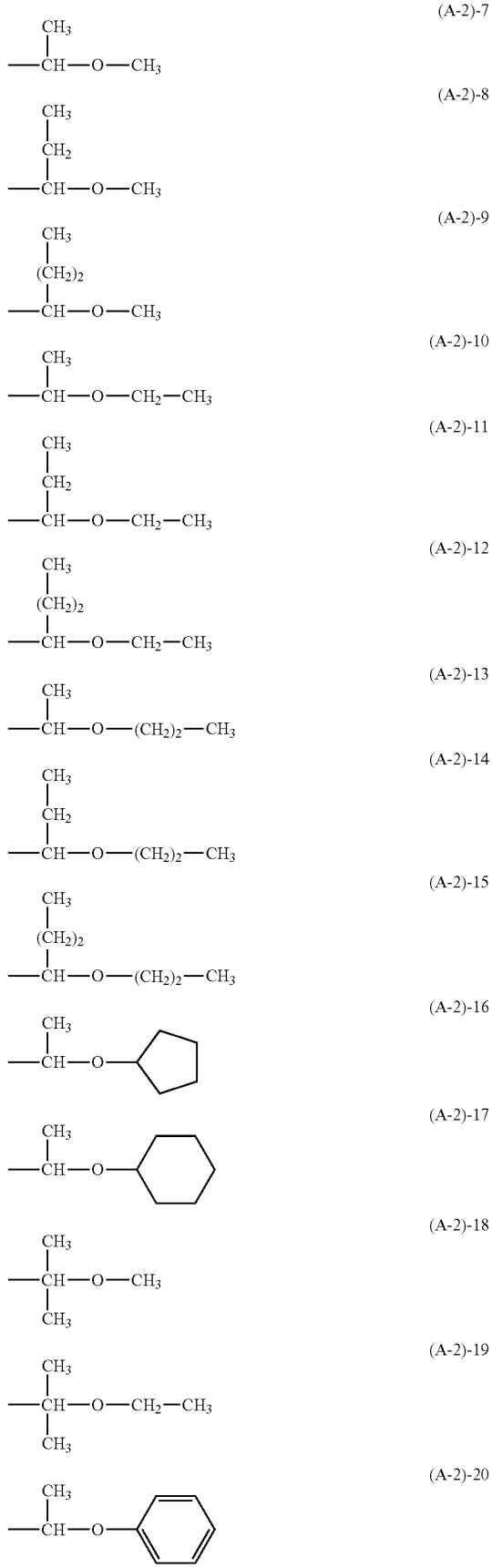

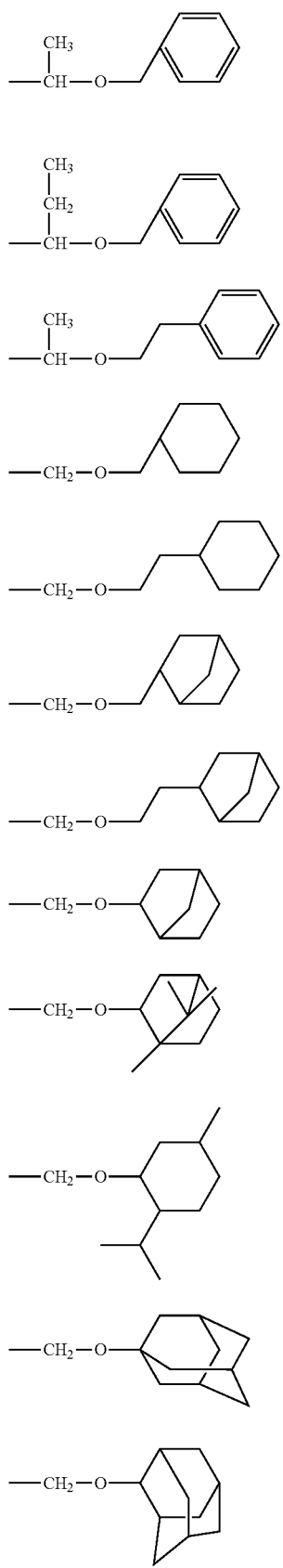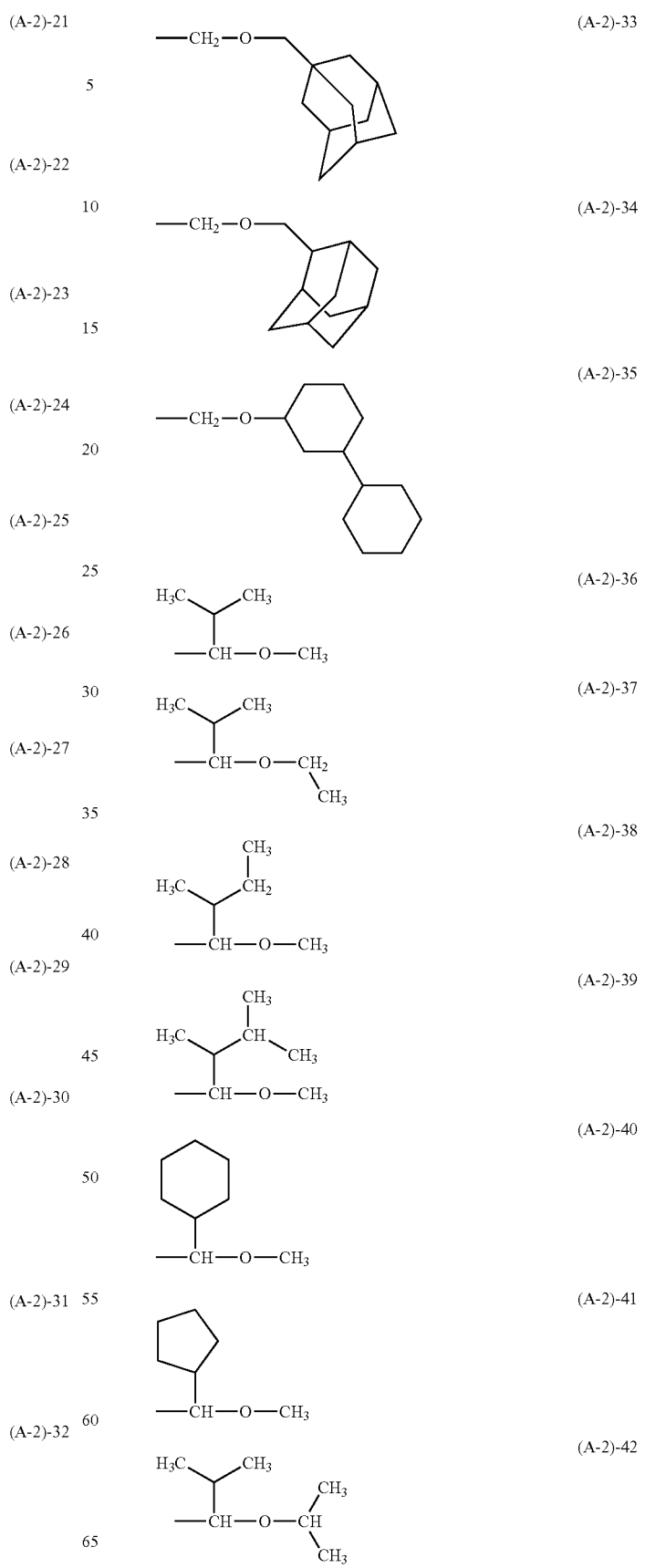

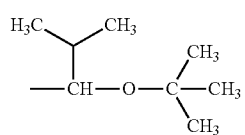 (A-2)-43
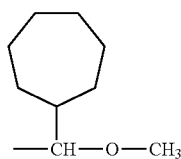 (A-2)-44
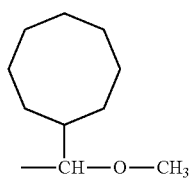 (A-2)-45
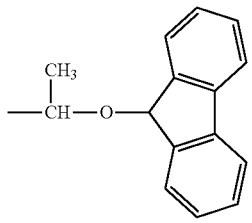 (A-2)-46
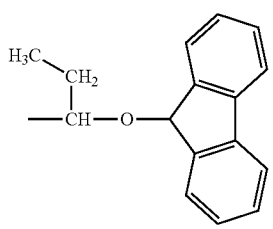 (A-2)-47
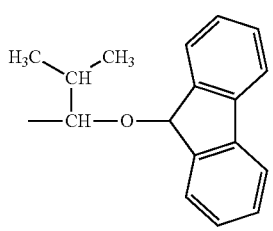 (A-2)-48
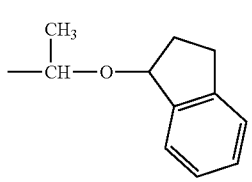 (A-2)-49
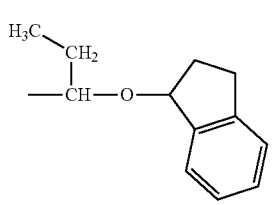 (A-2)-50
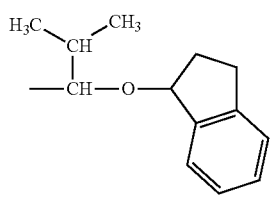 (A-2)-51
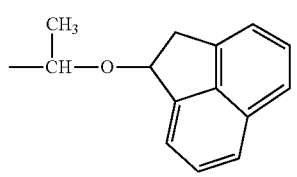 (A-2)-52
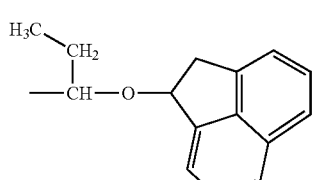 (A-2)-53
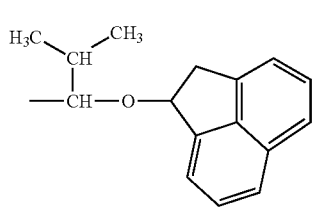 (A-2)-54
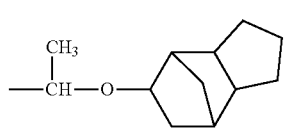 (A-2)-55
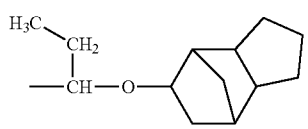 (A-2)-56
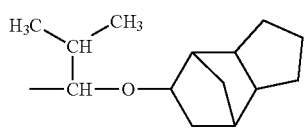 (A-2)-57
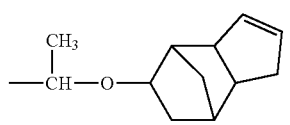 (A-2)-58
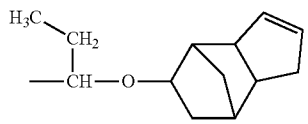 (A-2)-59
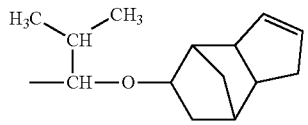 (A-2)-60

(A-2)-61 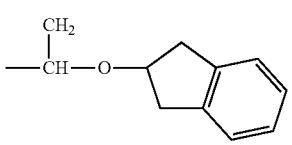

(A-2)-62 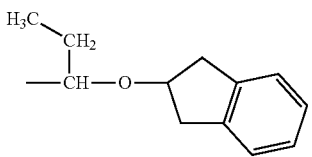

(A-2)-63 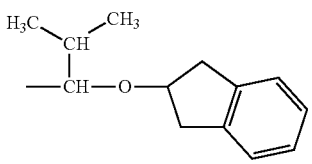

(A-2)-64 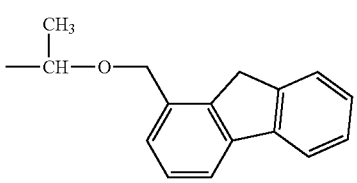

(A-2)-65 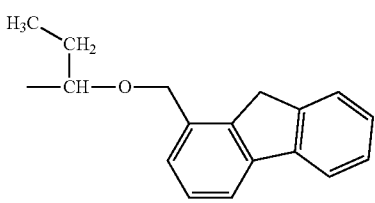

(A-2)-66 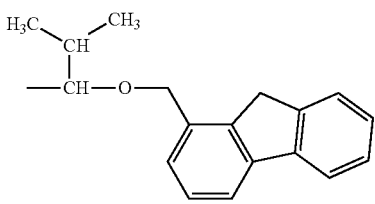

(A-2)-67 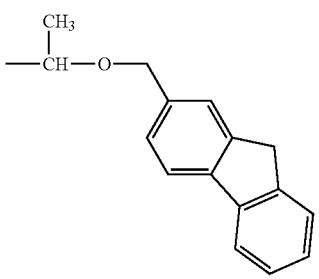

(A-2)-68 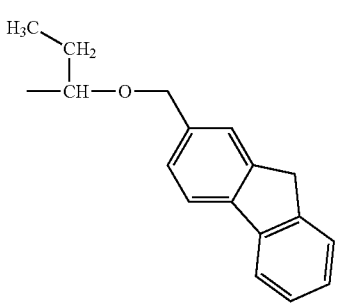

(A-2)-69 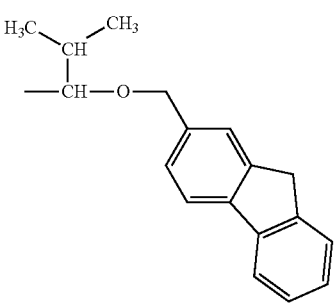

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

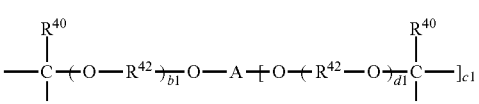
(A-2a)

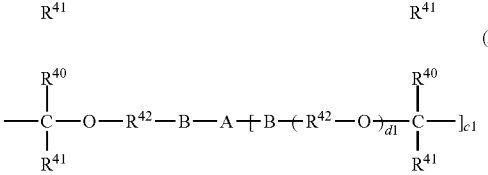
(A-2b)

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some carbon-bonded hydrogen atoms may be substituted by hydroxyl, carboxyl, carbonyl moieties or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom or in which some carbon-bonded hydrogen atoms may be substituted by hydroxyl, carboxyl, acyl moieties or halogen atoms. The subscript c1 is preferably an integer of 1 to 3.

The crosslinking acetal groups of formulae (A-2a) and (A-2b) are exemplified by the following formulae (A-2)-70 through (A-2)-77.

(A-2)-70
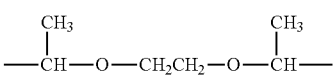

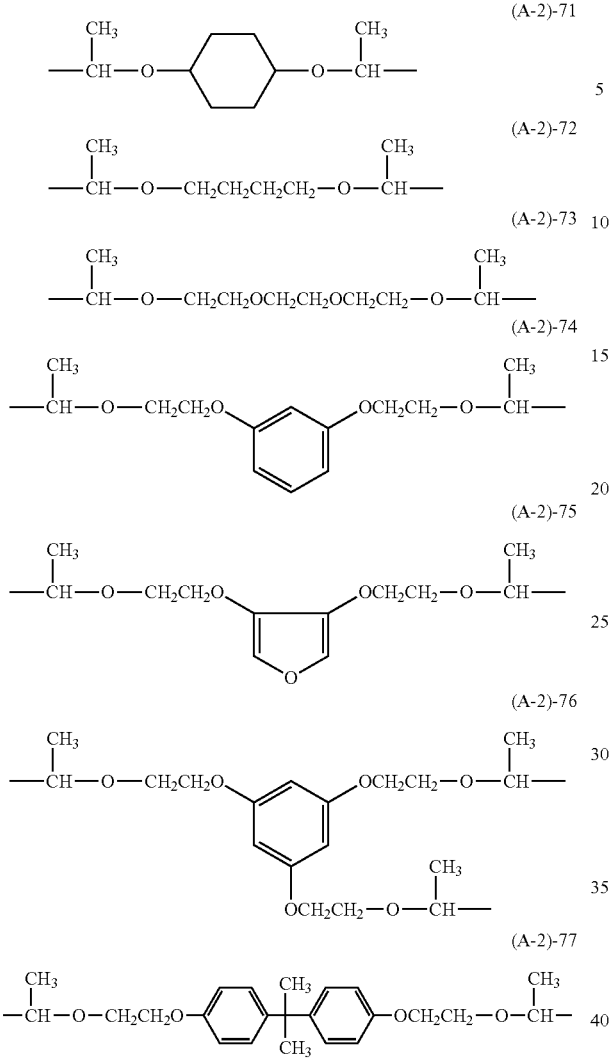

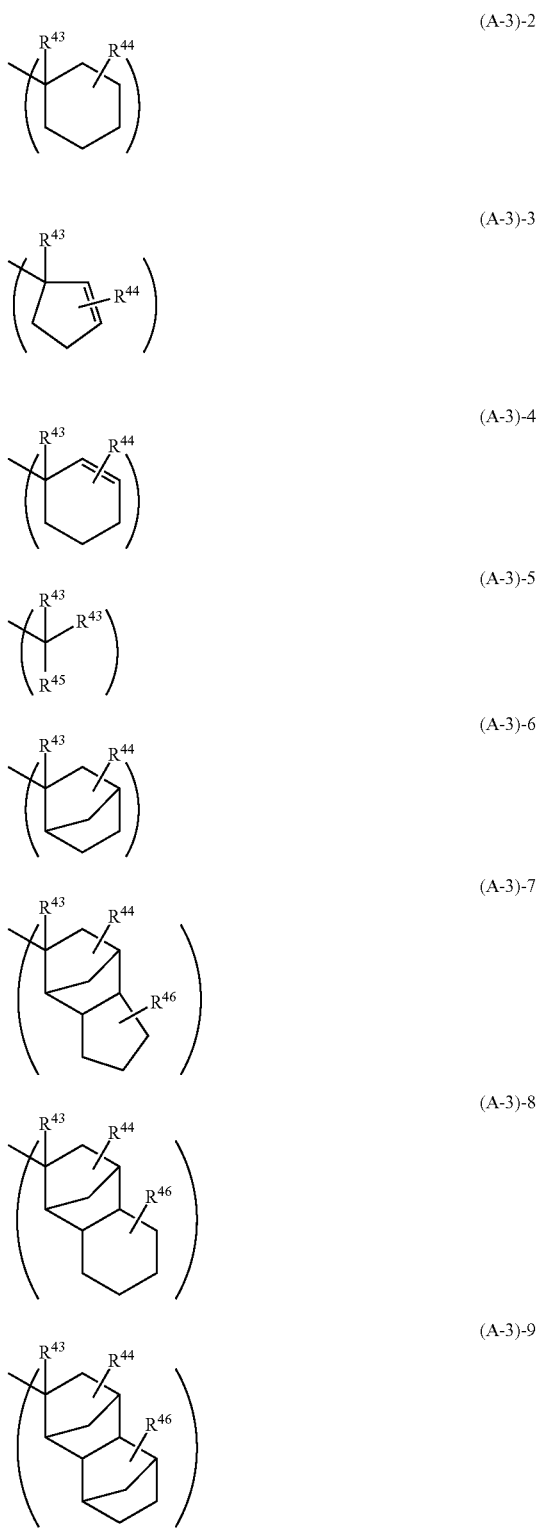

In formula (A-3), $R^{34}$, $R^{35}$ and $R^{36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{36}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

(A-3)-11 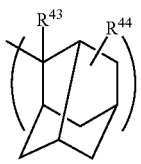

(A-3)-12 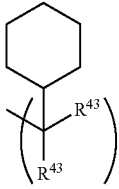

(A-3)-13 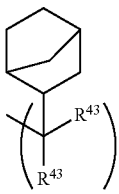

(A-3)-14 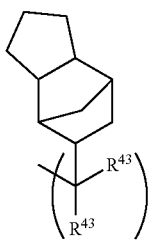

(A-3)-15 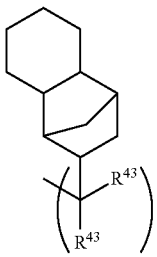

(A-3)-16 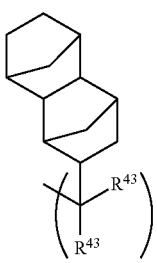

(A-3)-17 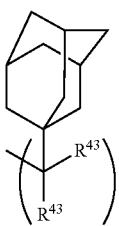

(A-3)-18 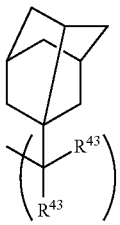

Herein $R^{43}$ is each independently a straight, branched or cyclic $C_1$-$C_8$ alkyl group or $C_6$-$C_{20}$ aryl group, typically phenyl, $R^{44}$ and $R^{46}$ each are hydrogen or a straight, branched or cyclic $C_1$-$C_{20}$ alkyl group, and $R^4$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

(A-3)-19 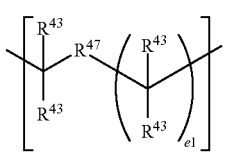

(A-3)-20 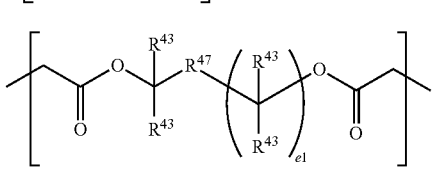

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

Of recurring units having acid labile groups of formula (A-3), recurring units of (meth)acrylate having an exo-form structure represented by the formula (A-3)-21 are preferred as recurring unit (a1).

(A-3)-21 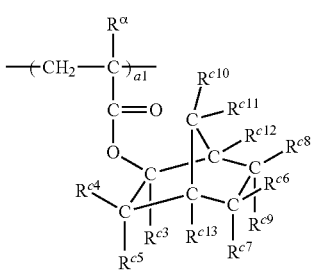

Herein, $R^{\alpha}$ is hydrogen or methyl; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

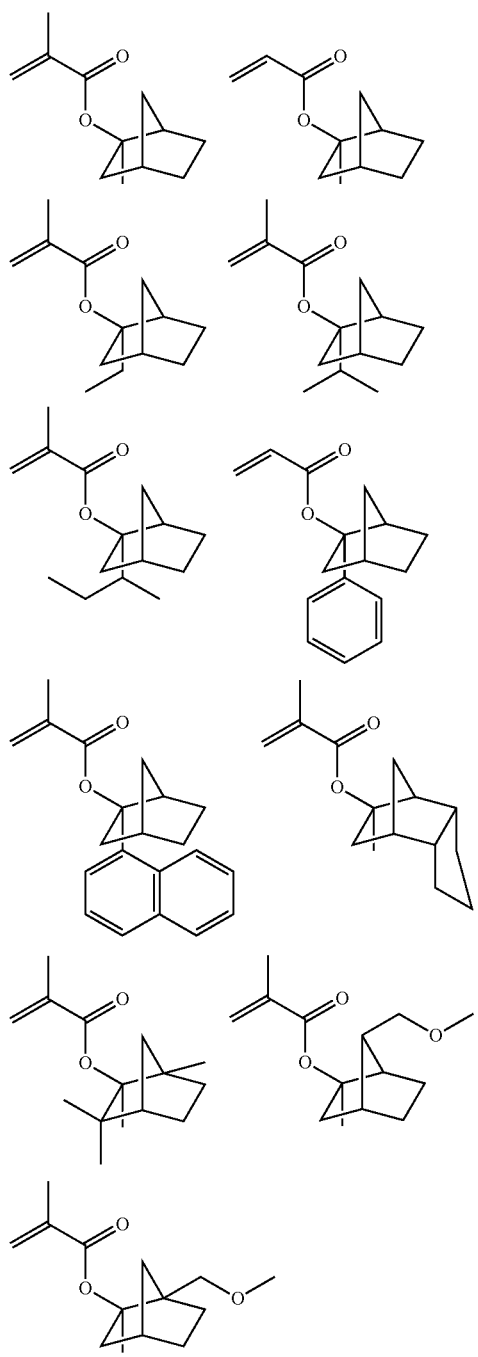

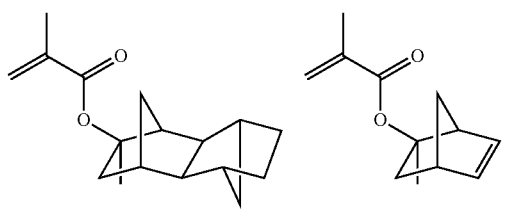

-continued

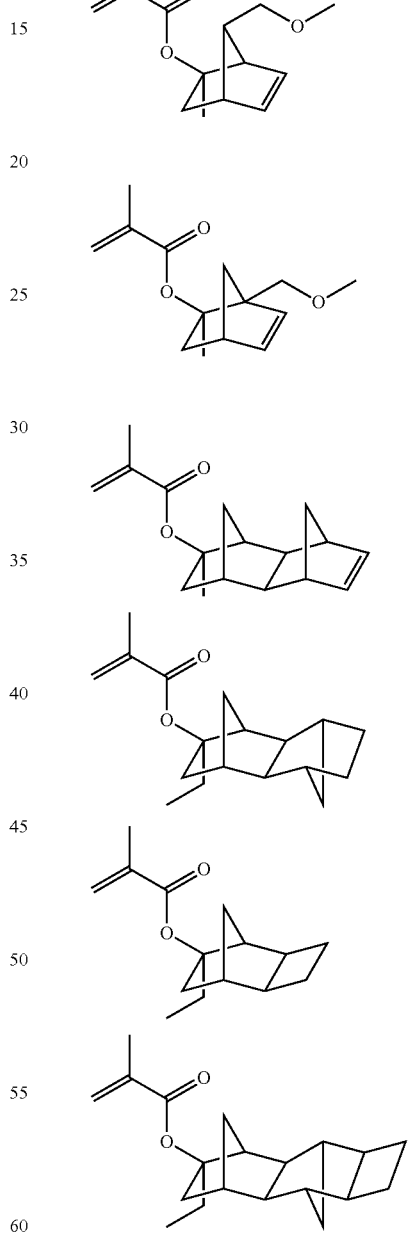

Also included in the acid labile groups of formula (A-3) in recurring units (a1) are acid labile groups of (meth)acrylate having furandiyl, tetrahydrofurandiyl or oxanorbornanediyl as represented by the following formula (A-3)-22.

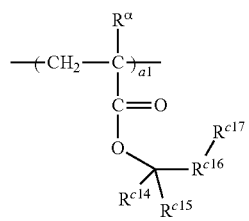
(A-3)-22

Herein, $R^\alpha$ is as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

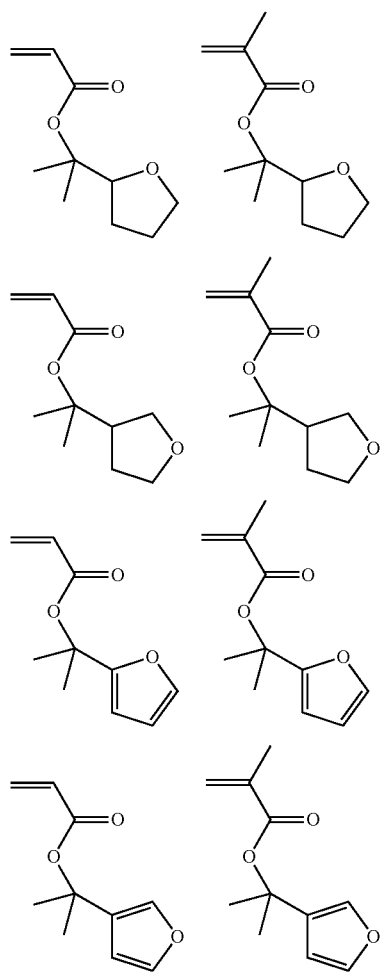
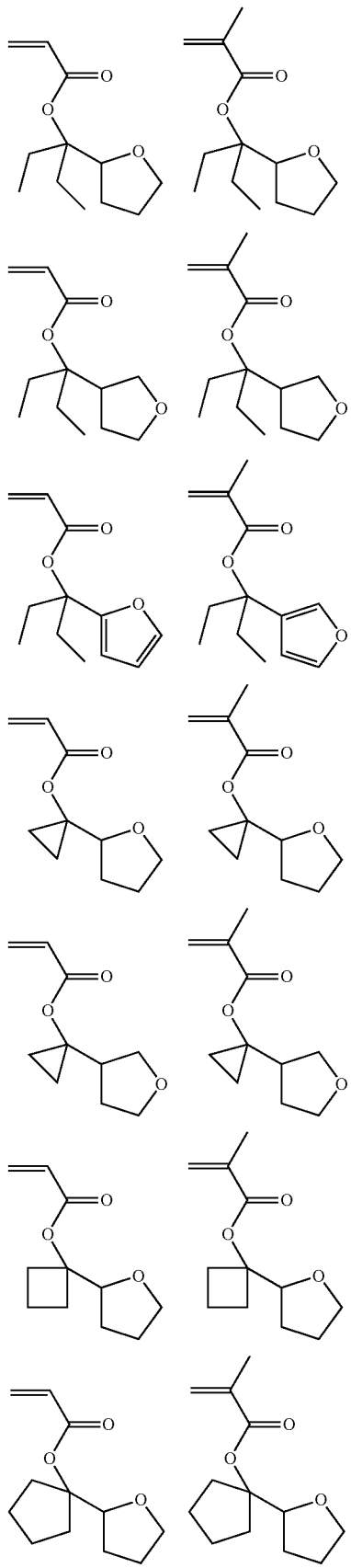

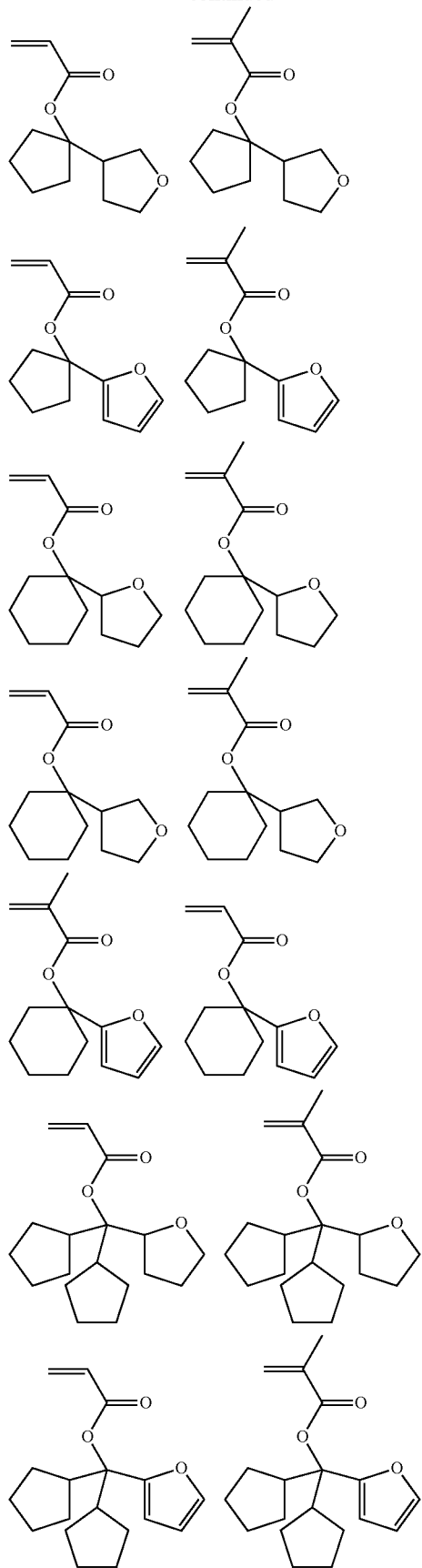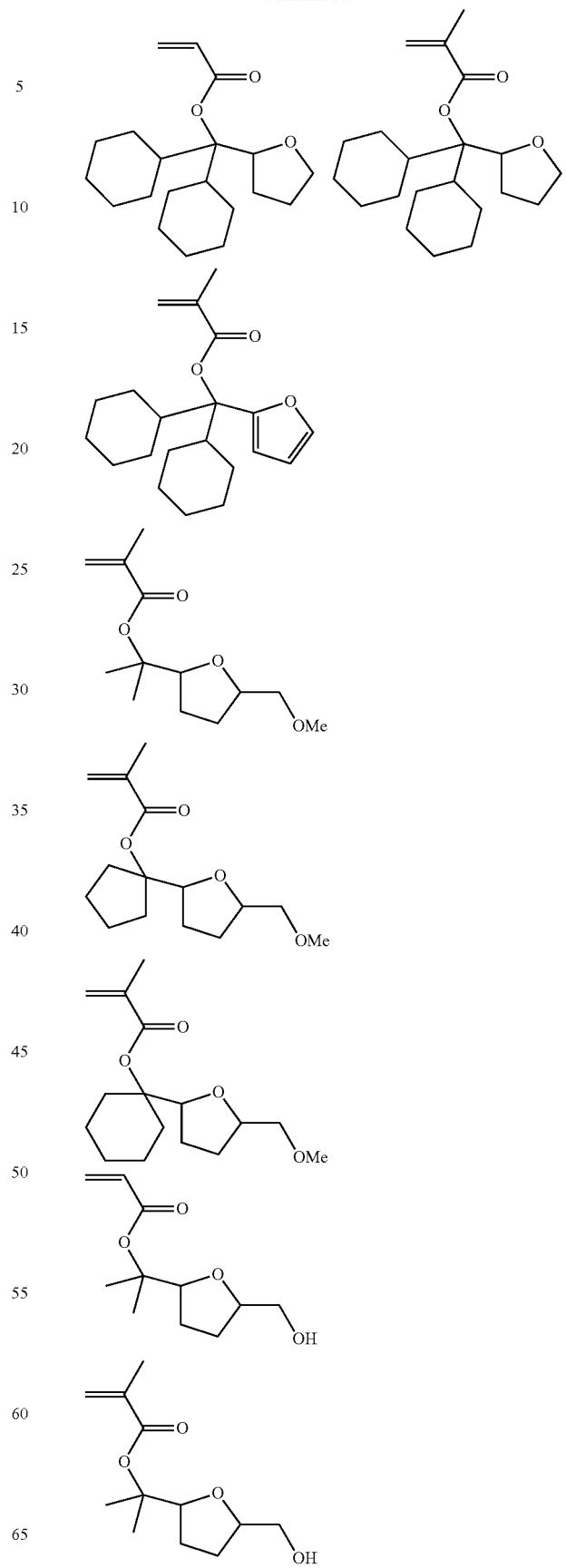

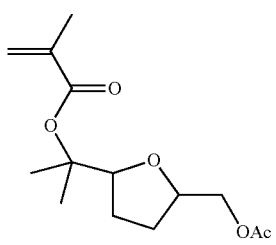
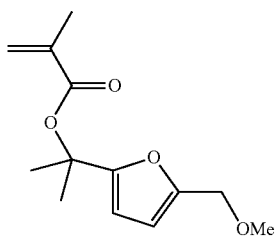
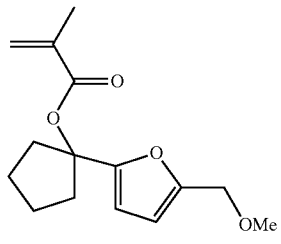
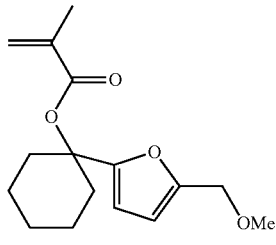
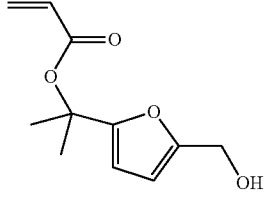
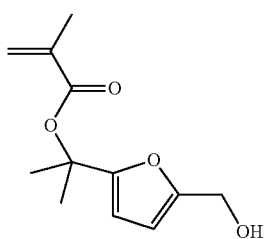
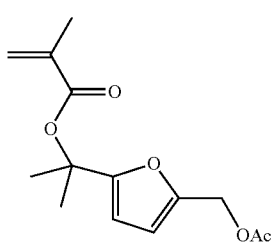
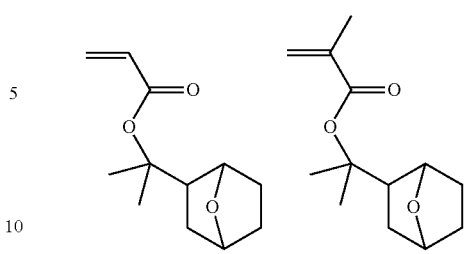
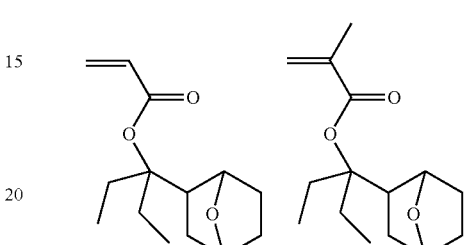
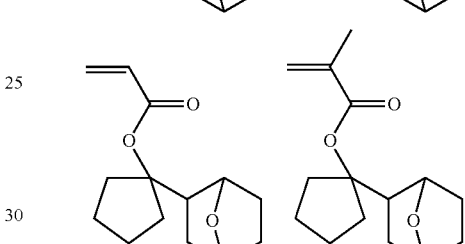
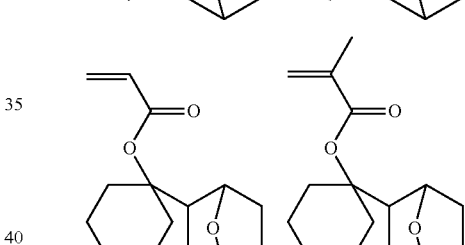
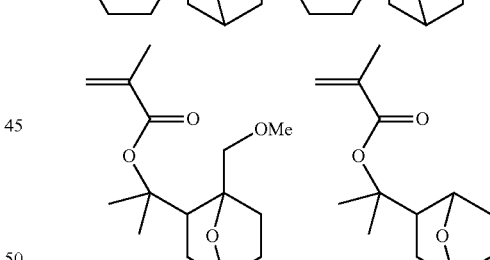
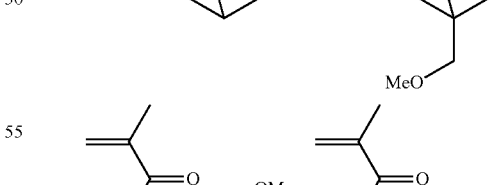
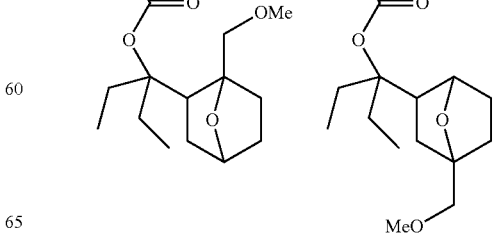

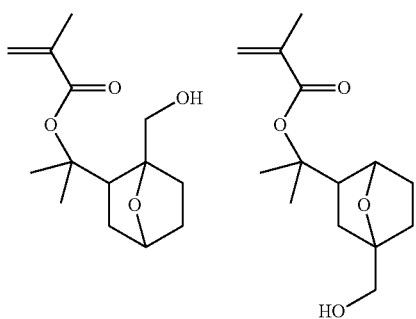
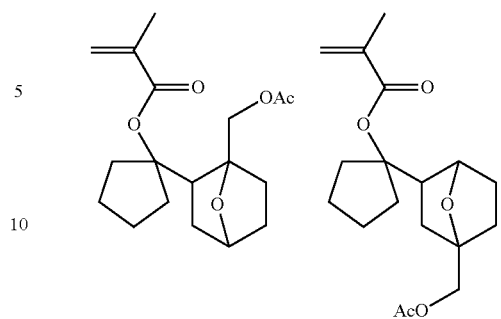

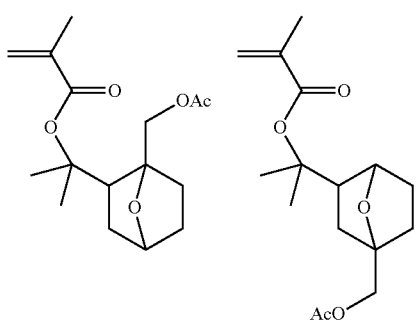

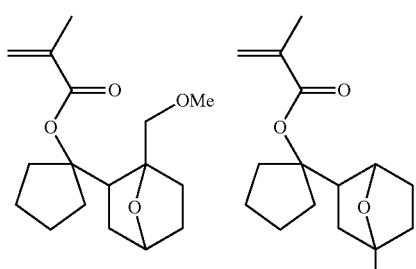

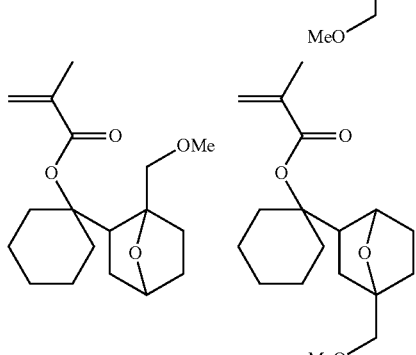

The acid labile group $R^2$ in recurring units (a1) may be a group having the general formula (A-3)-23.

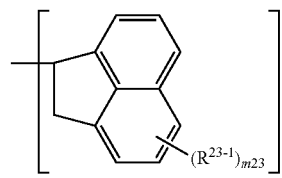

Herein $R^{23-1}$ is hydrogen, a $C_1$-$C_4$ alkyl, alkoxy, alkanoyl or alkoxycarbonyl, $C_6$-$C_{10}$ aryl, halogen or cyano group, and m23 is an integer of 1 to 4.

Examples of the monomer from which recurring units (a1) having an acid labile group of formula (A-3)-23 substituted thereon are derived are shown below.

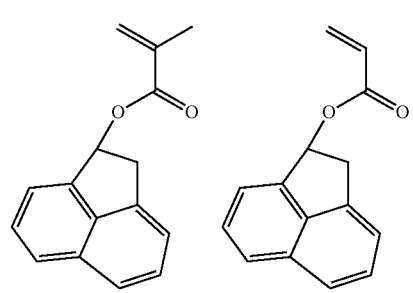

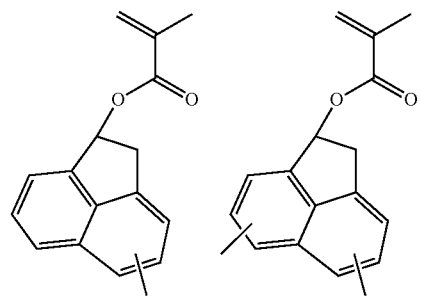

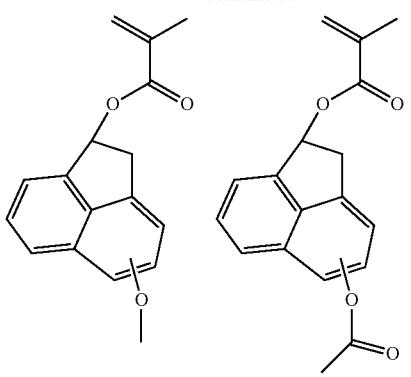
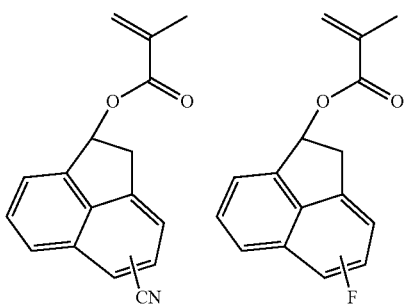
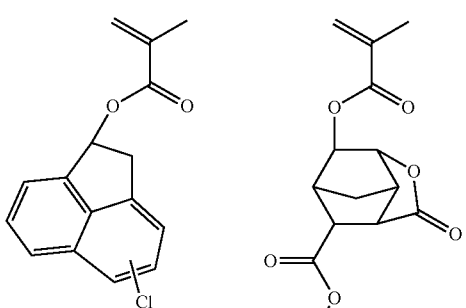
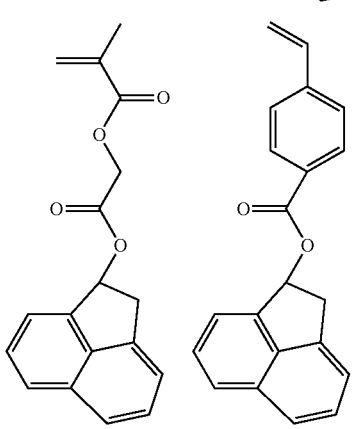
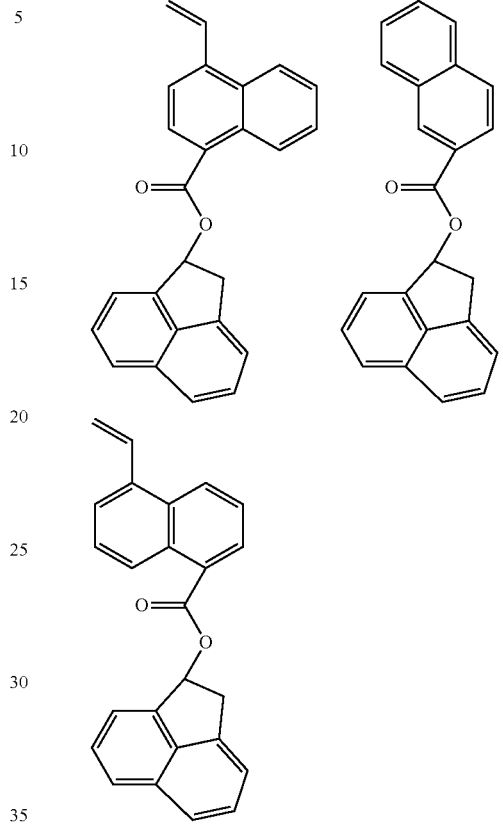

The acid labile group $R^2$ in recurring units (a1) may be a group having the general formula (A-3)-24.

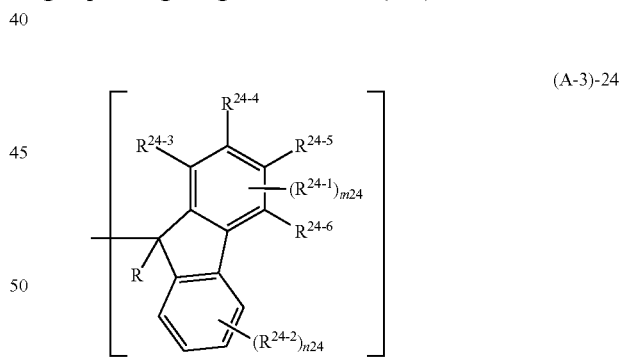

(A-3)-24

Herein $R^{24-1}$ and $R^{24-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is hydrogen, a straight, branched or cyclic $C_1$-$C_{12}$ alkyl group, $C_2$-$C_{12}$ alkenyl group, $C_2$-$C_{12}$ alkynyl group, or $C_6$-$C_{10}$ aryl group which may contain oxygen or sulfur, $R^{24-3}$, $R^{24-4}$, $R^{24-5}$, and $R^{24-6}$ are hydrogen or a pair of $R^{24-3}$ and $R^{24-4}$, $R^{24-4}$ and $R^{24-5}$, or $R^{24-5}$ and $R^{24-6}$, taken together, may form a benzene ring, and m24 and n24 each are an integer of 1 to 4.

Examples of the monomer from which recurring units (a1) having an acid labile group of formula (A-3)-24 substituted thereon are derived are shown below.

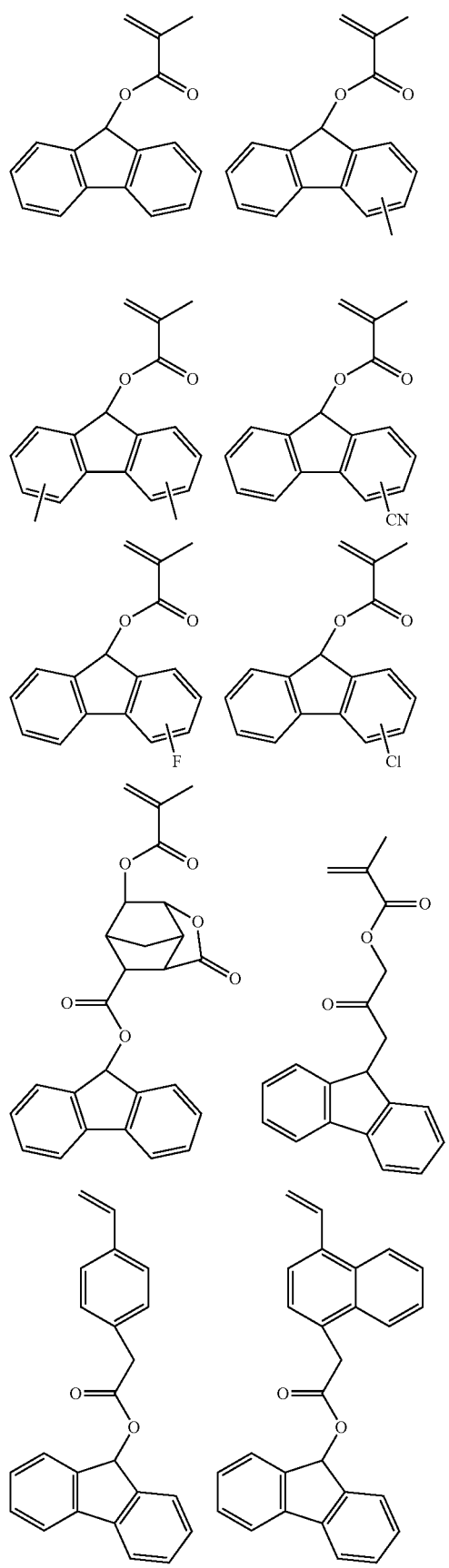
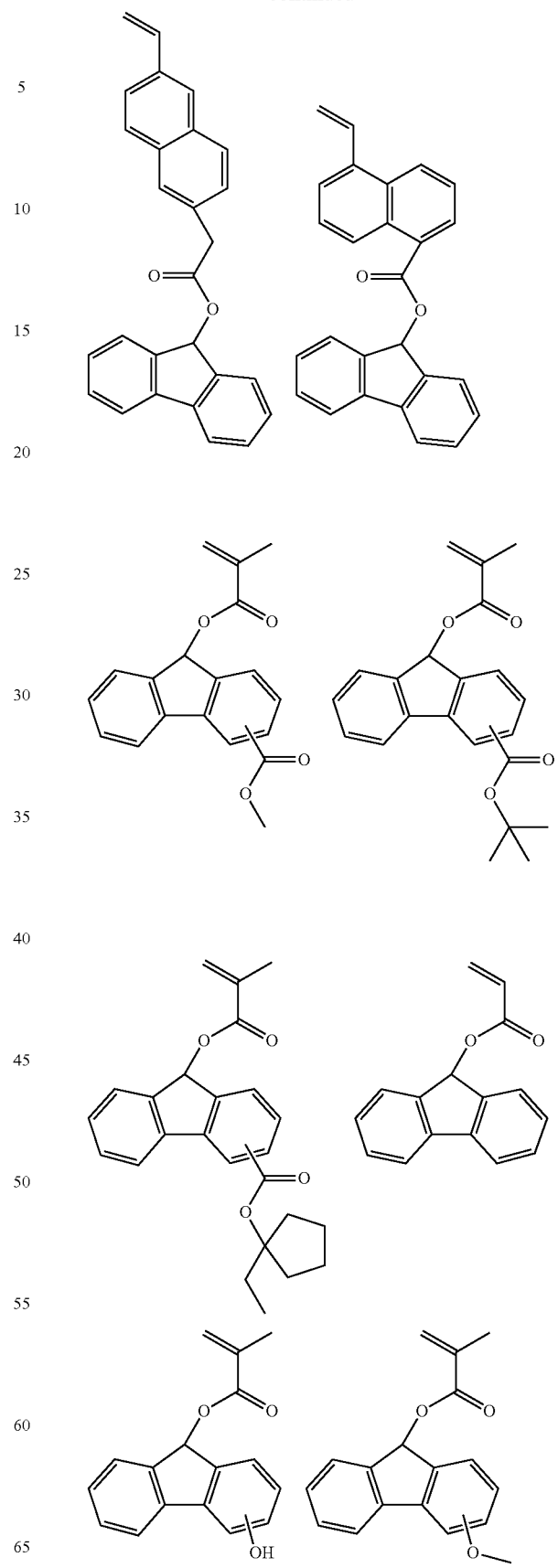

55
-continued
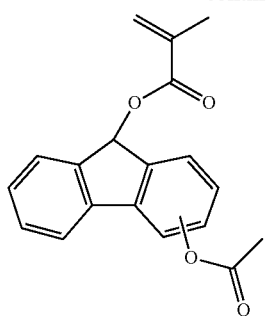
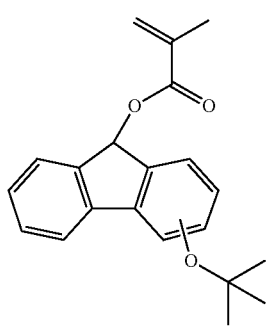
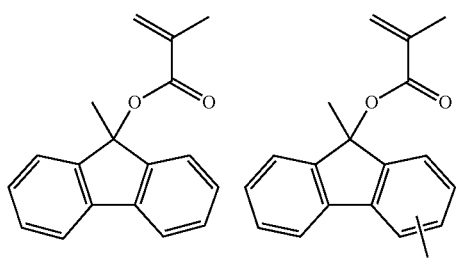
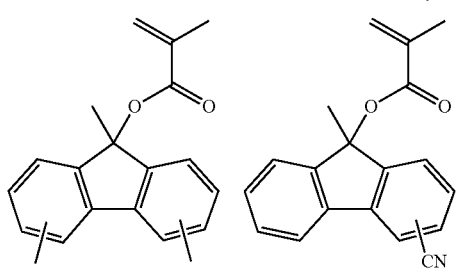
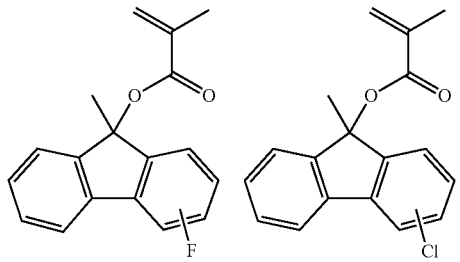
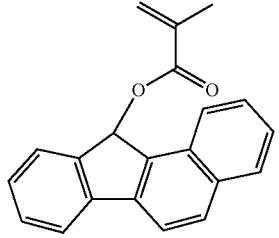
56
-continued
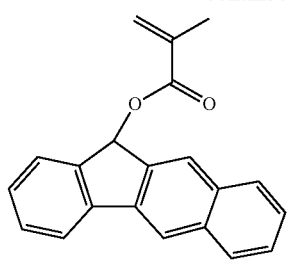
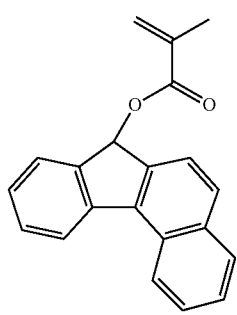
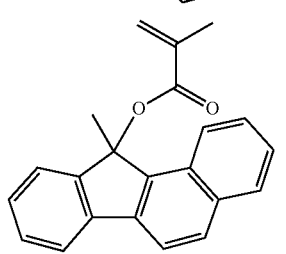
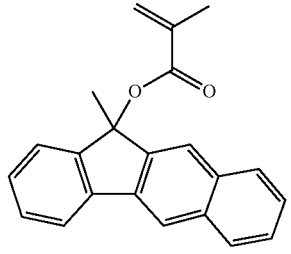
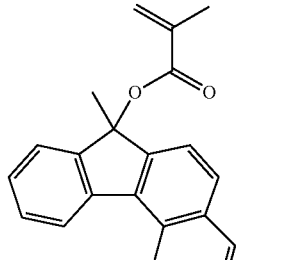
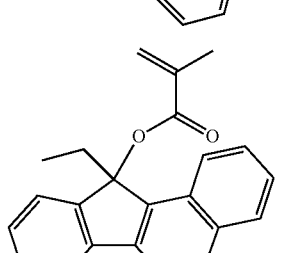

57
-continued
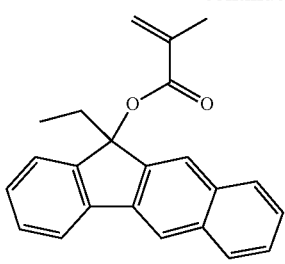
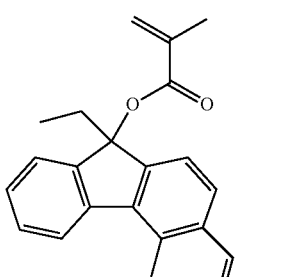
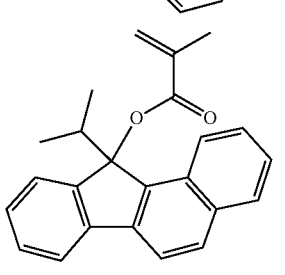
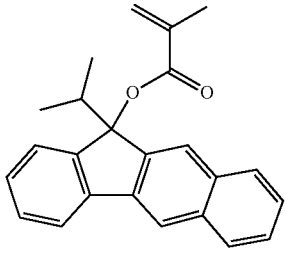
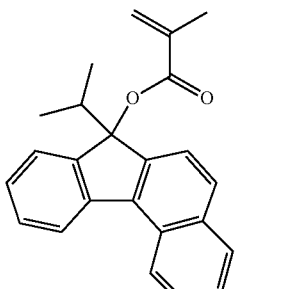
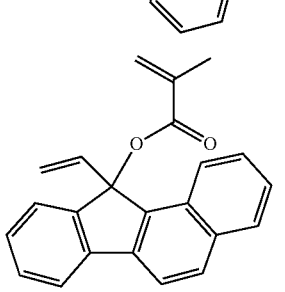
58
-continued
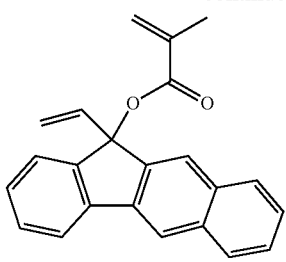
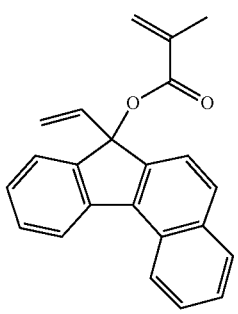
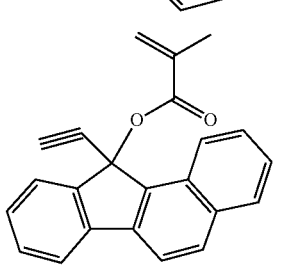
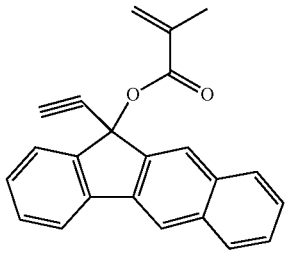
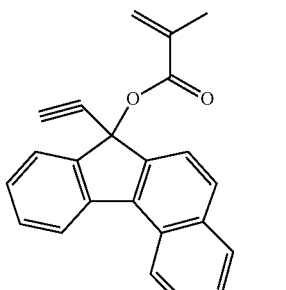
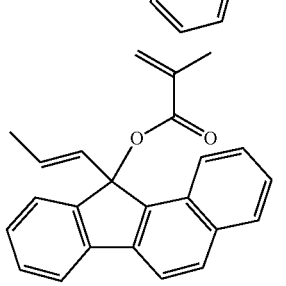

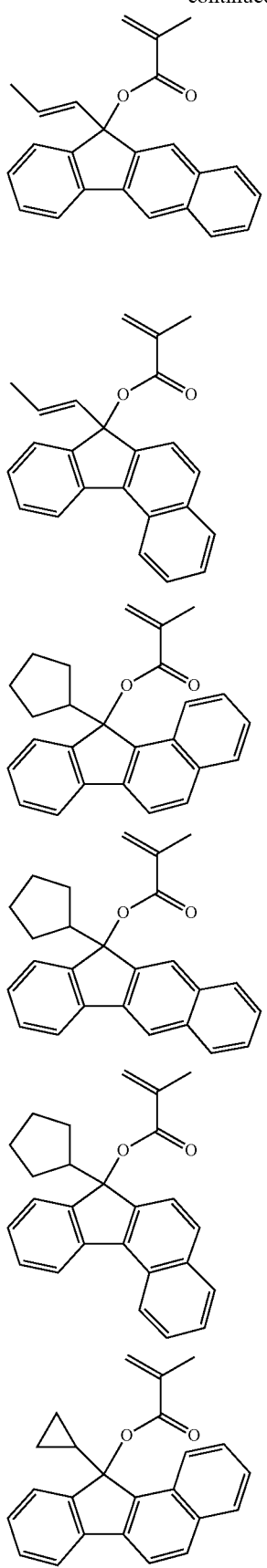
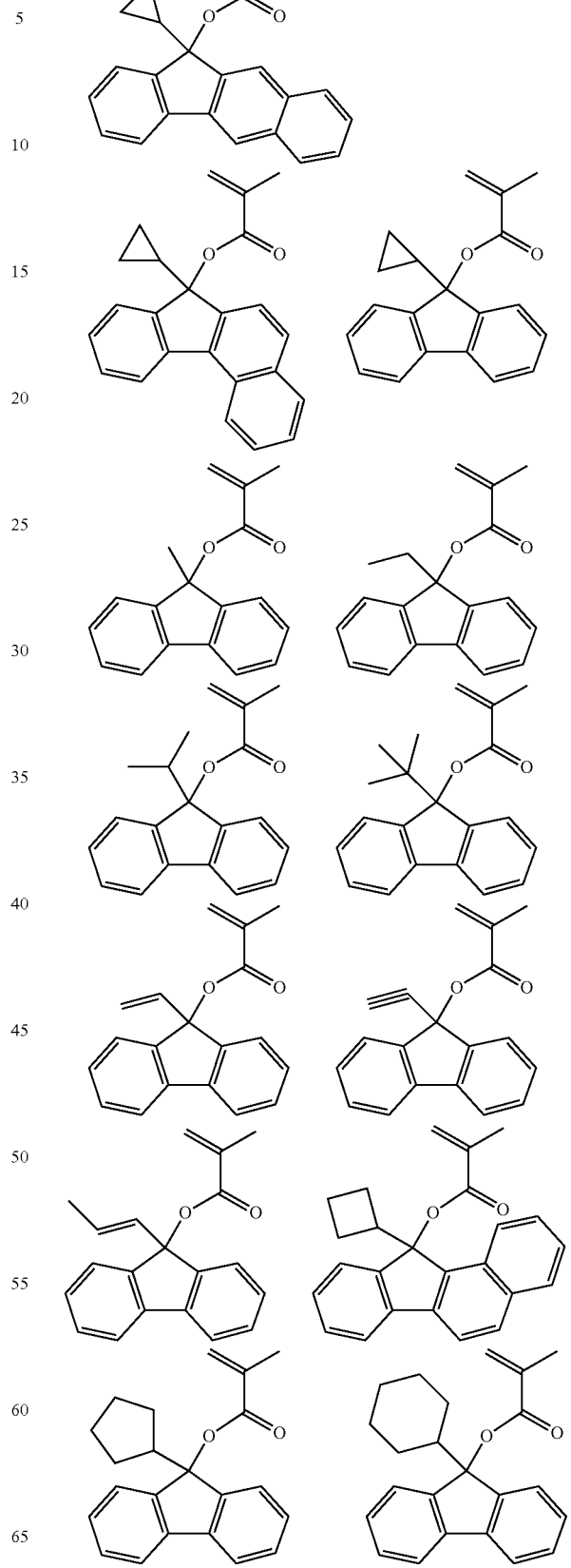

-continued

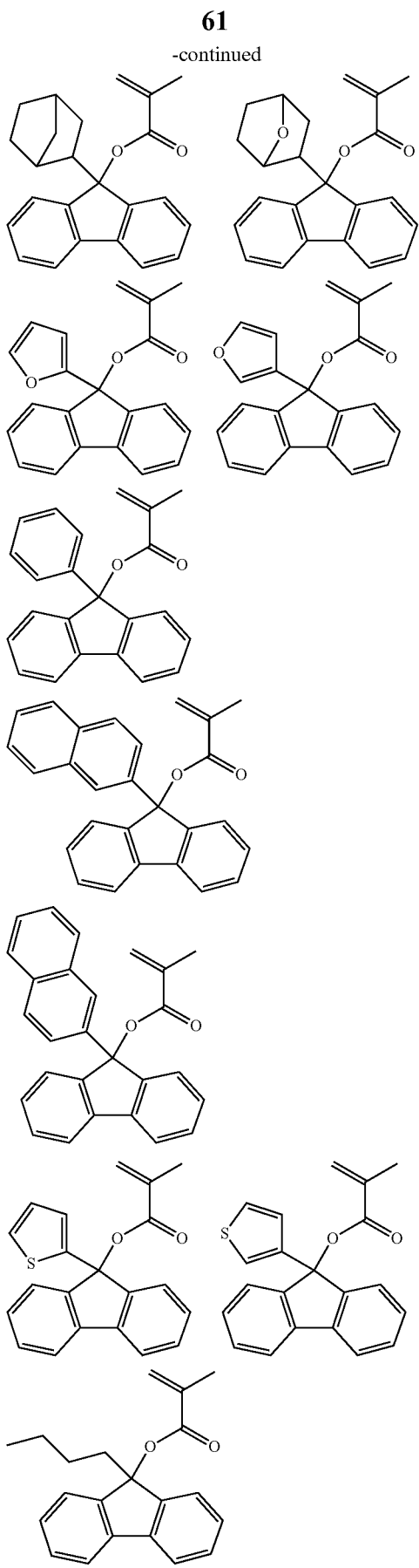

-continued

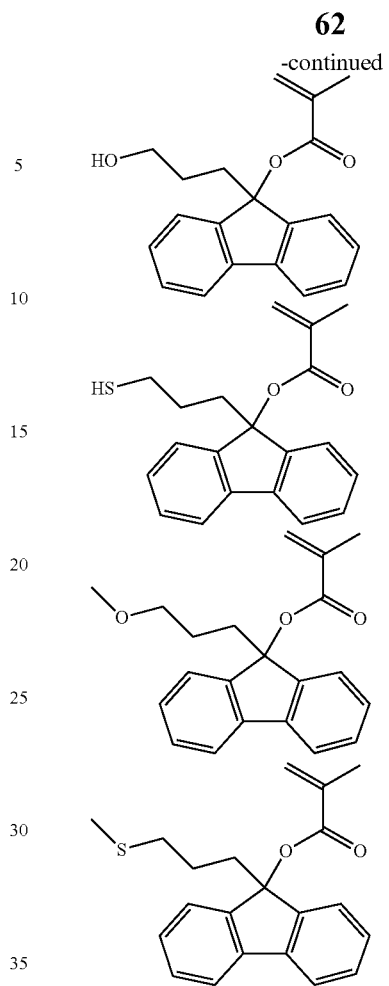

The acid labile group $R^2$ in recurring units (a1) may be a group having the general formula (A-3)-25.

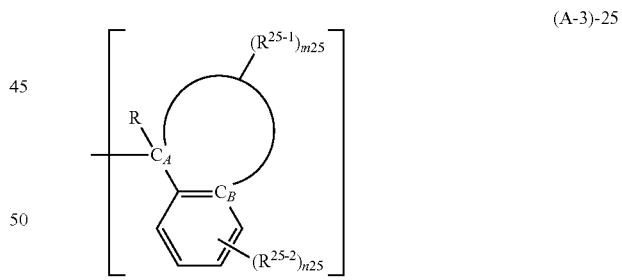

(A-3)-25

Herein $R^{25-1}$ is each independently hydrogen or a straight, branched or cyclic $C_1$-$C_6$ alkyl group. When m25 is 2 or more, two $R^{25-1}$ taken together may form a non-aromatic ring of 2 to 8 carbon atoms. The circle denotes a link between carbons $C_A$ and $C_B$, selected from among ethylene, propylene, butylene and pentylene. $R^{25-2}$ is a $C_1$-$C_4$ alkyl, alkoxy, alkanoyl or alkoxycarbonyl, hydroxyl, nitro, $C_6$-$C_{10}$ aryl, halogen or cyano group. R is as defined above. $R^{25-1}$ is not hydrogen when the circle is ethylene or propylene. The subscripts m25 and n25 are an integer of 1 to 4.

Examples of the monomer from which recurring units (a1) having an acid labile group of formula (A-3)-25 substituted thereon are derived are shown below.

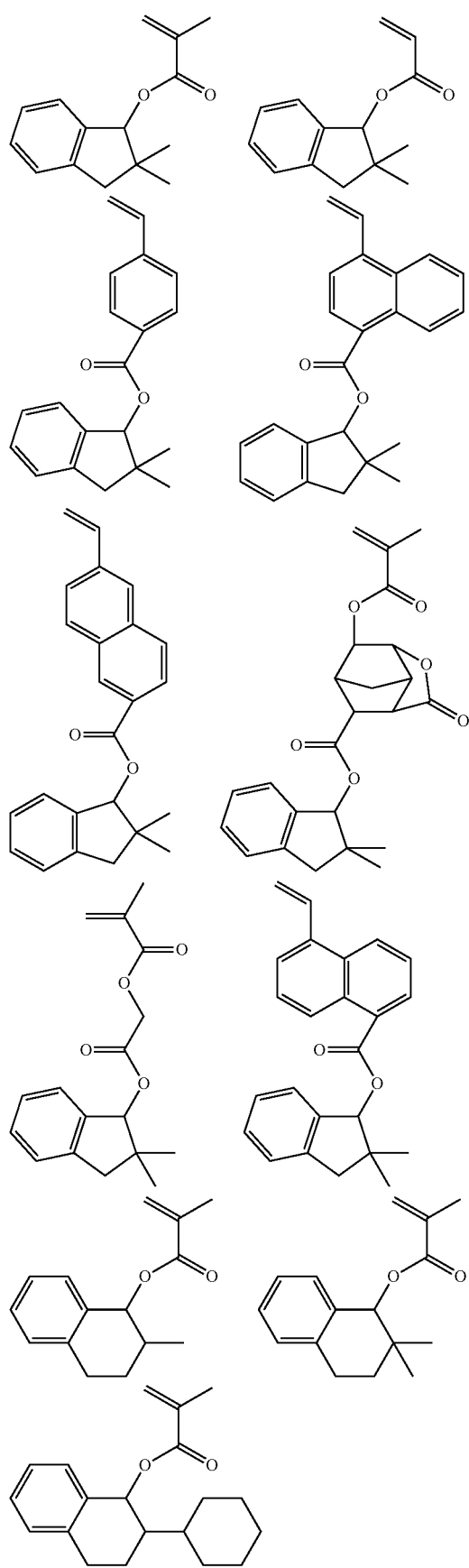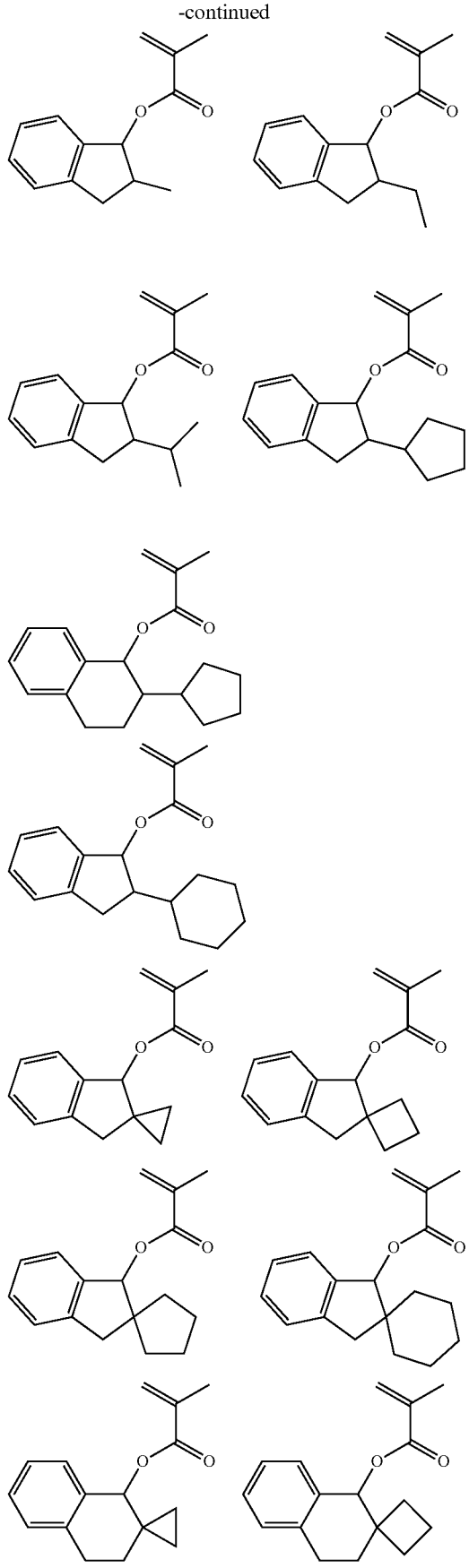
-continued

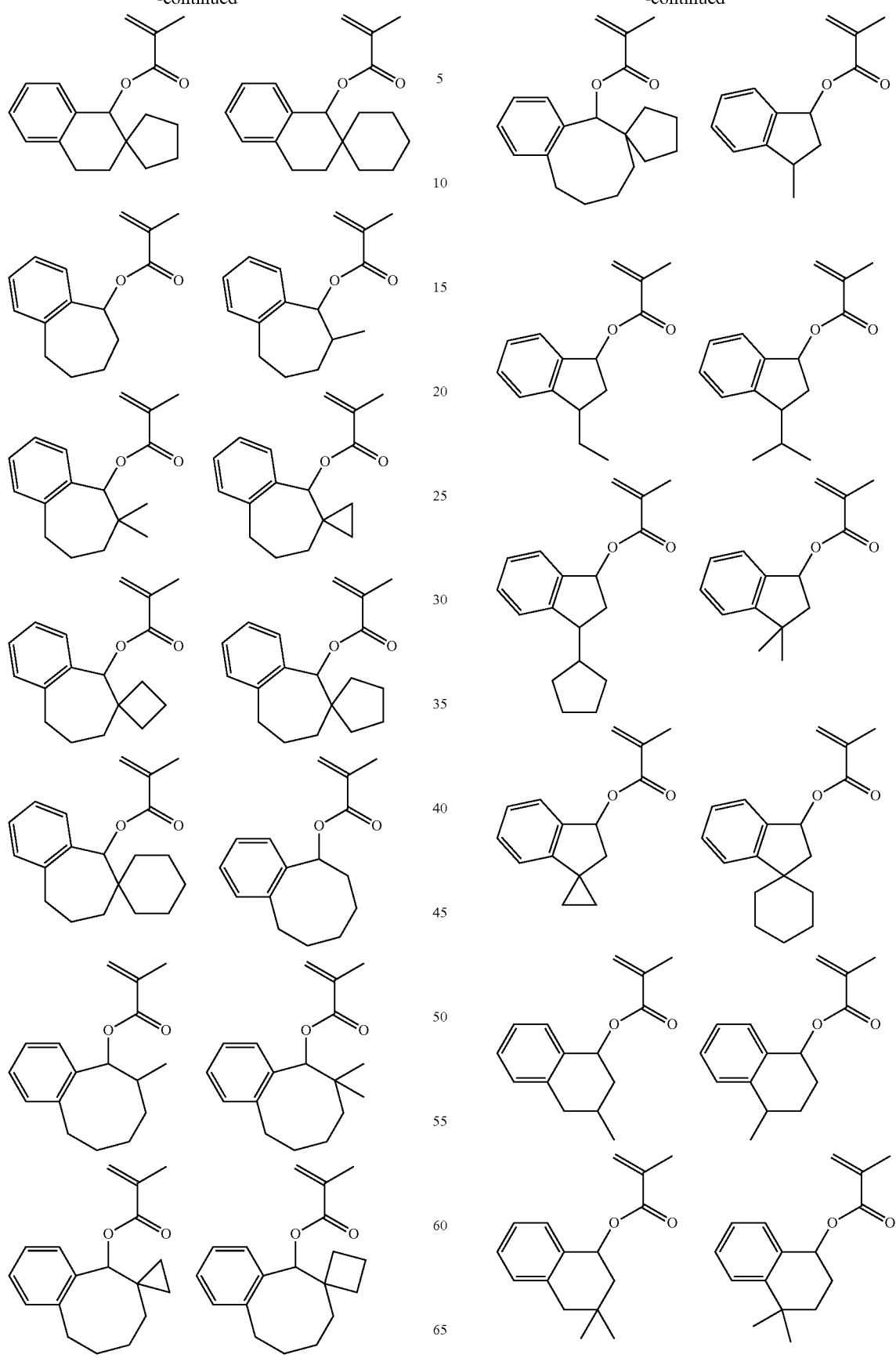

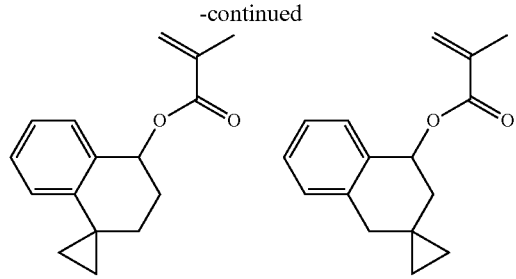
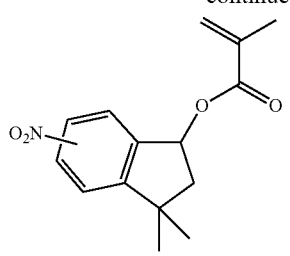
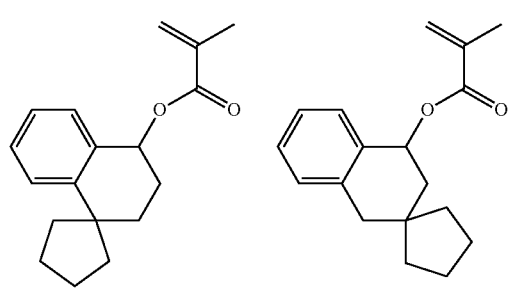
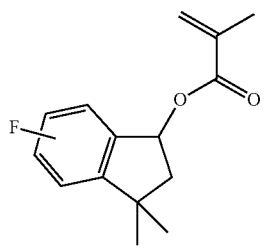
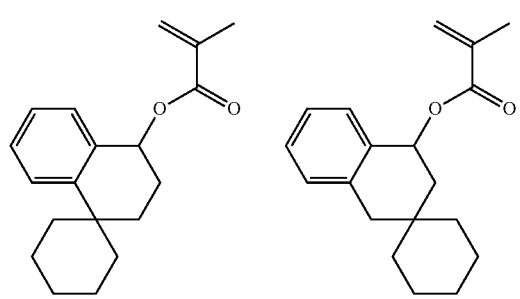
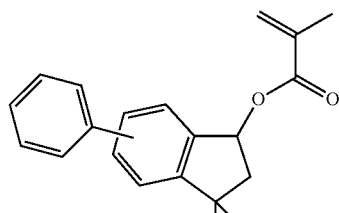
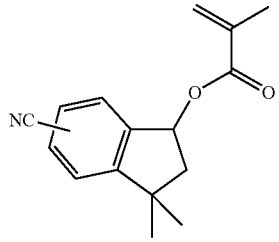
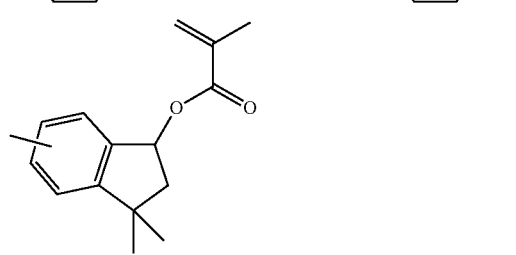
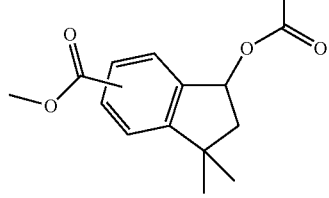
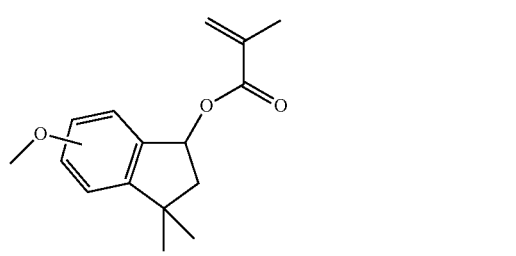
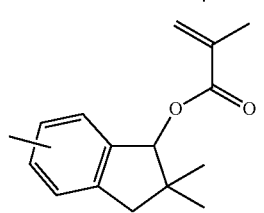
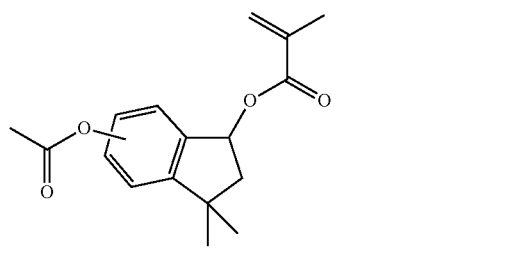
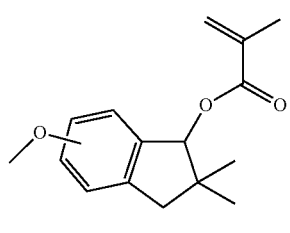

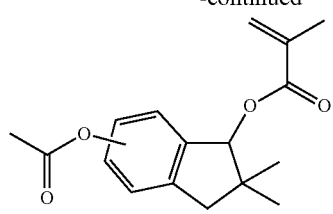
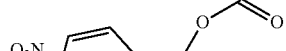
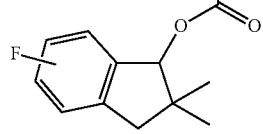
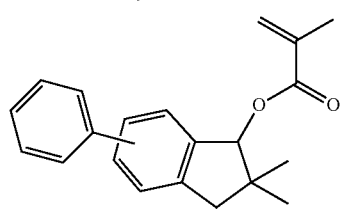
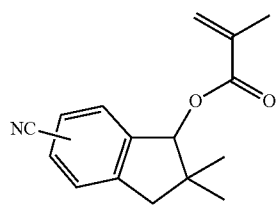
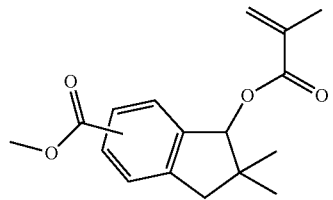
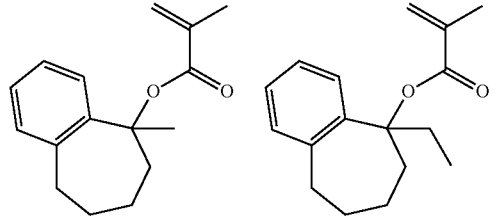
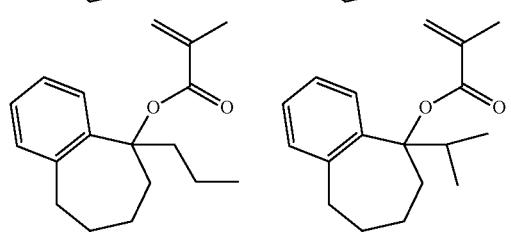
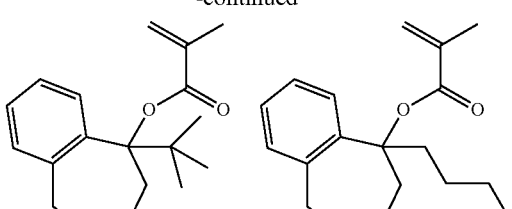
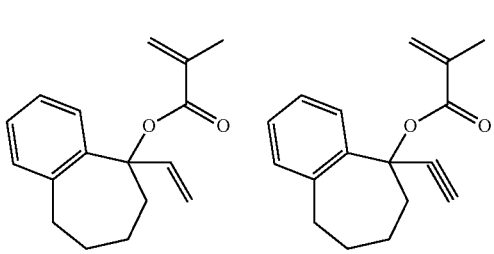
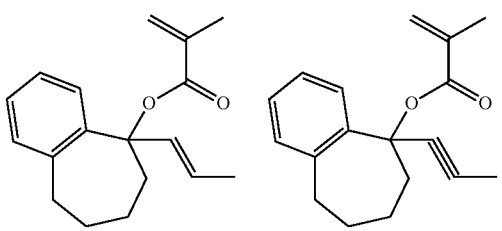
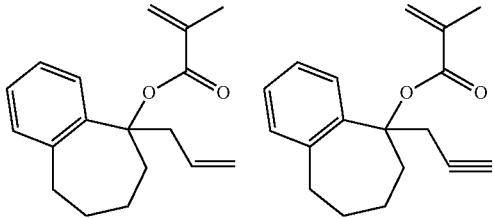
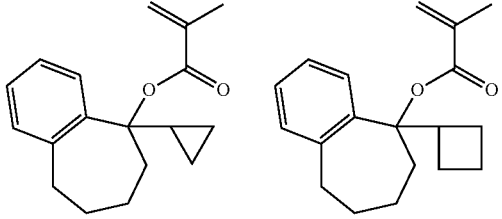
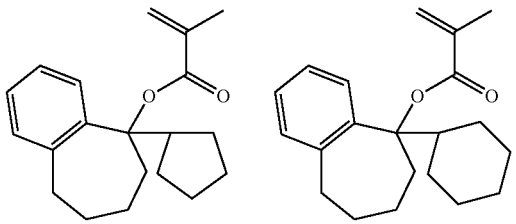
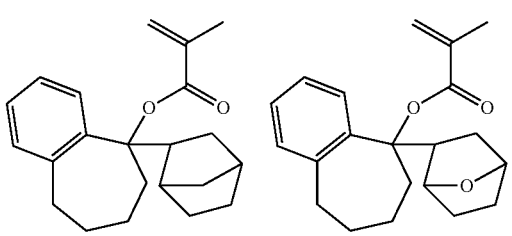

-continued
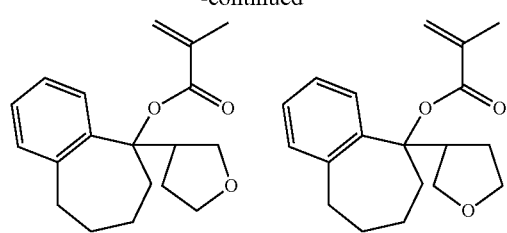
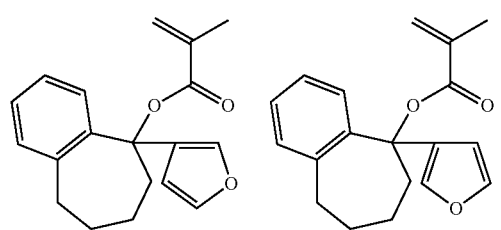
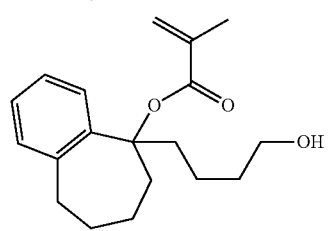
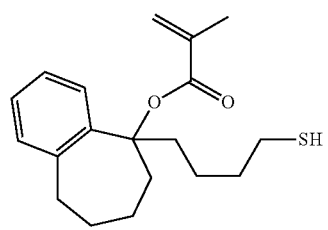
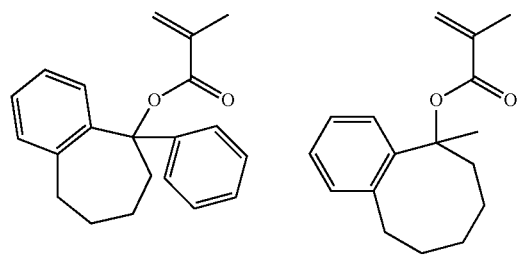
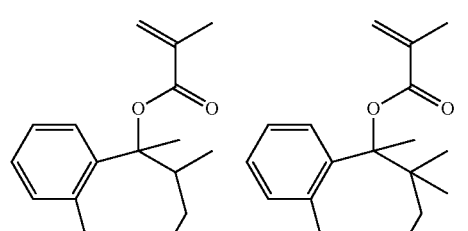
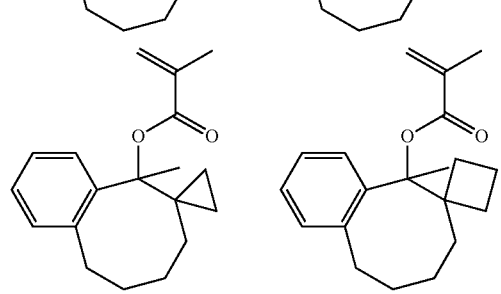
-continued
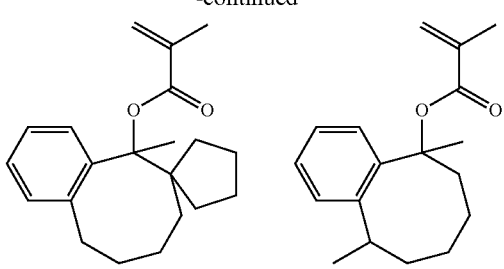
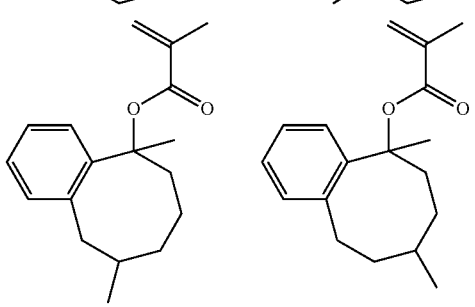
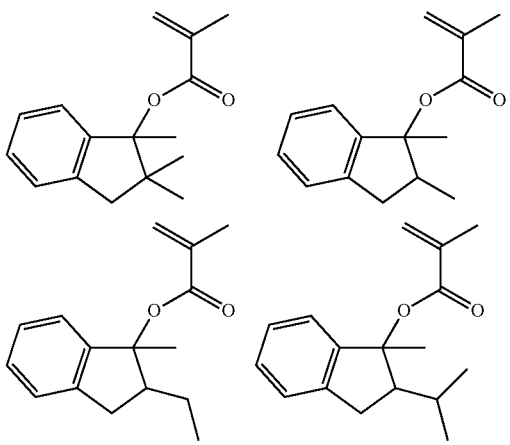
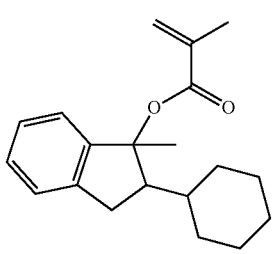
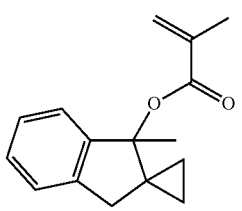
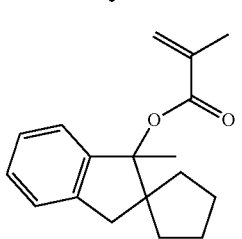
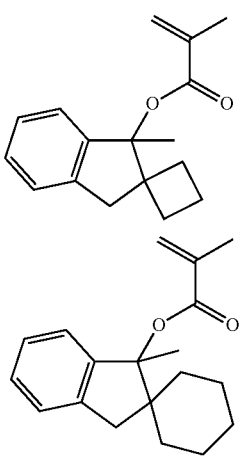

-continued
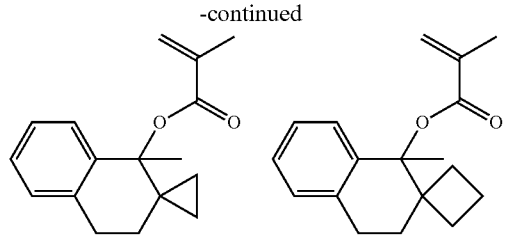
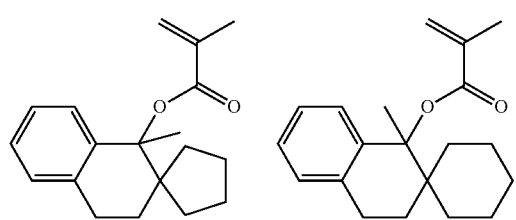
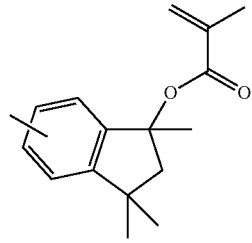
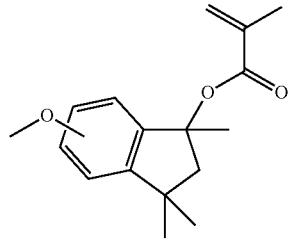
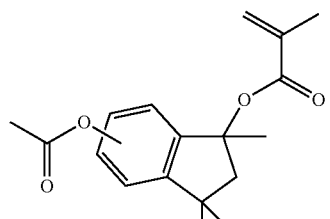
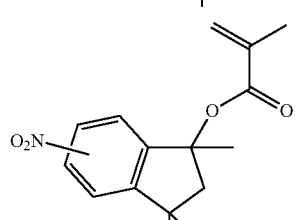
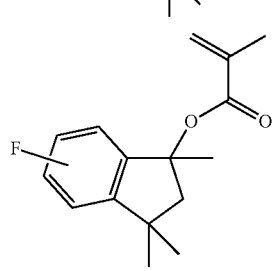
-continued
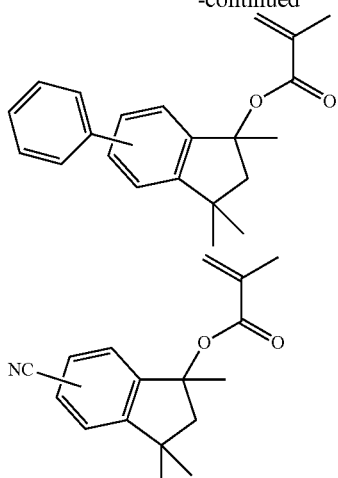
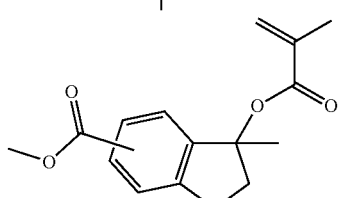
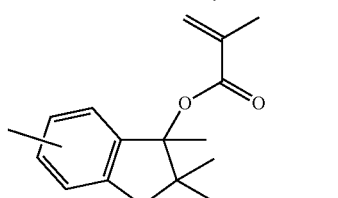
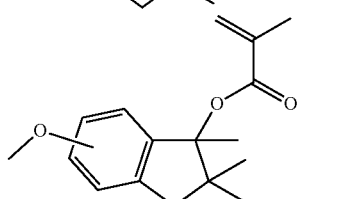
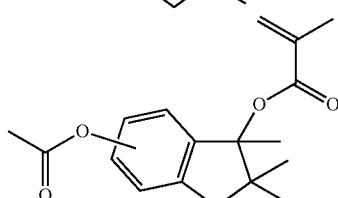
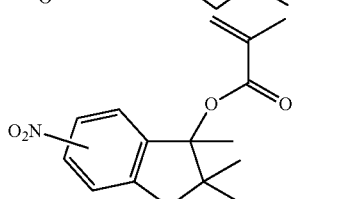
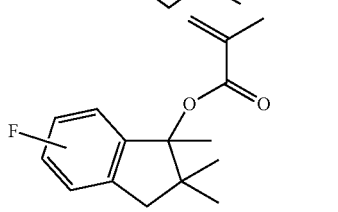

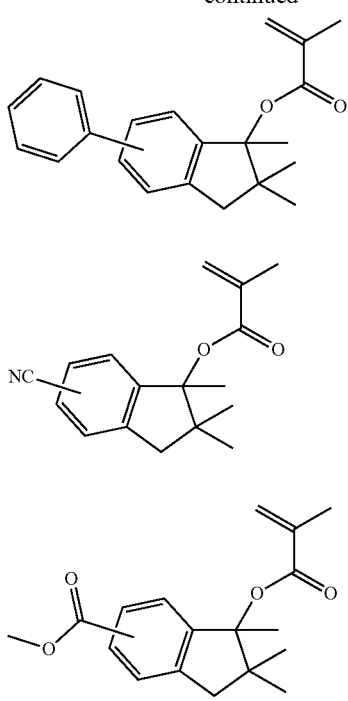

The acid labile group R² in recurring units (a1) may be a group having the general formula (A-3)-26.

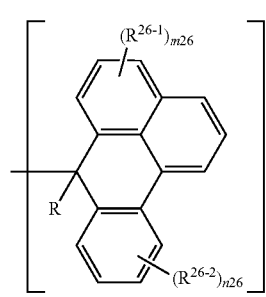

(A-3)-26

Herein $R^{26-1}$ and $R^{26-2}$ each are hydrogen, a $C_1$-$C_4$ alkyl, alkoxy, alkanoyl or alkoxycarbonyl, hydroxyl, nitro, $C_6$-$C_{10}$ aryl, halogen or cyano group, R is as defined above, and m26 and n26 are an integer of 1 to 4.

Examples of the monomer from which recurring units (a1) having an acid labile group of formula (A-3)-26 substituted thereon are derived are shown below.

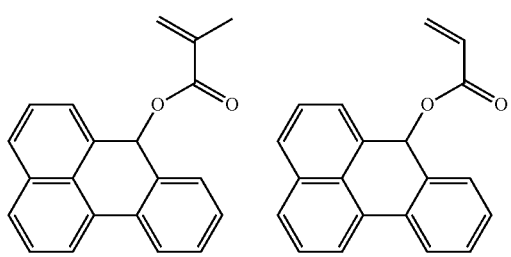

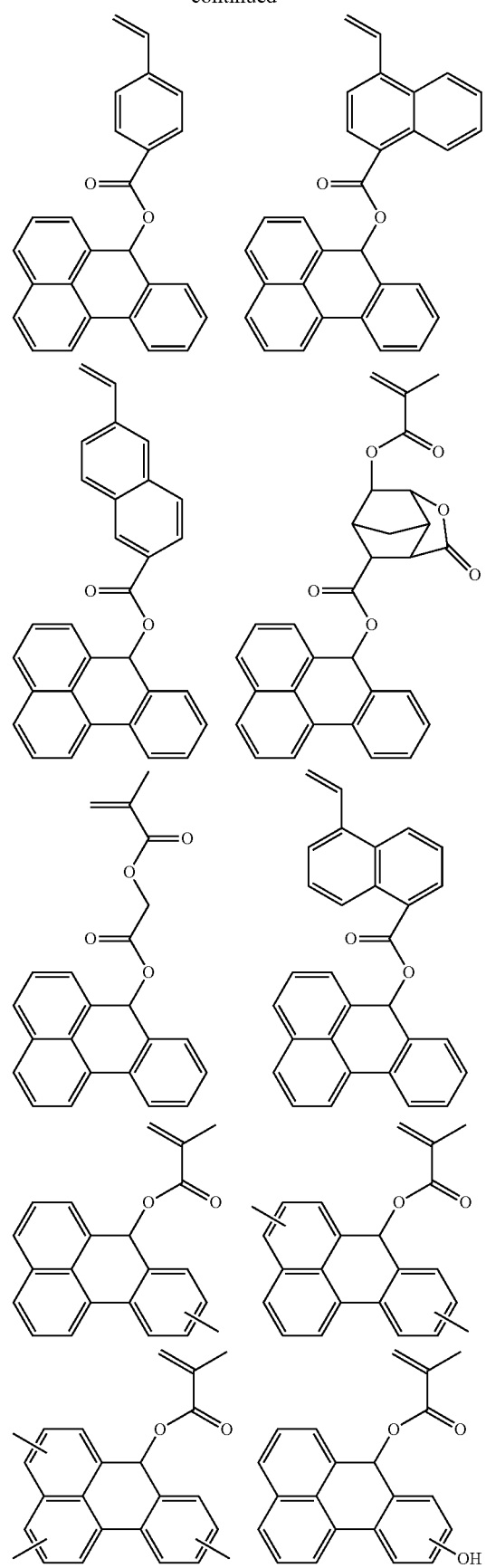

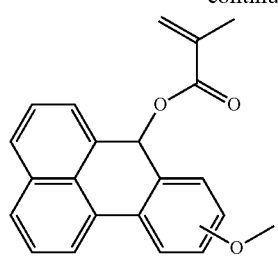
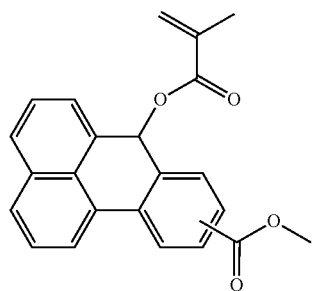
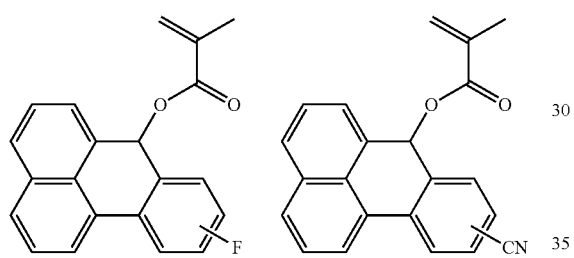
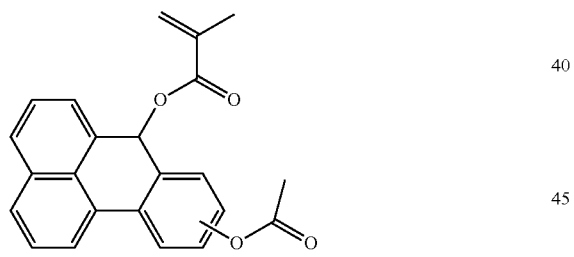
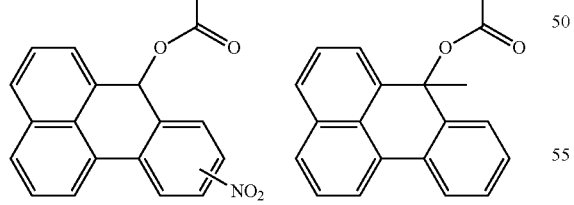
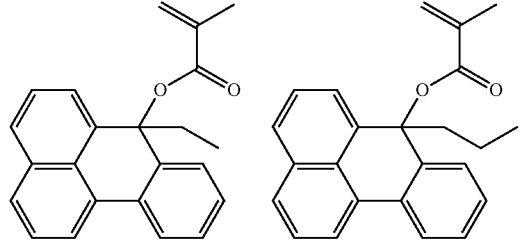
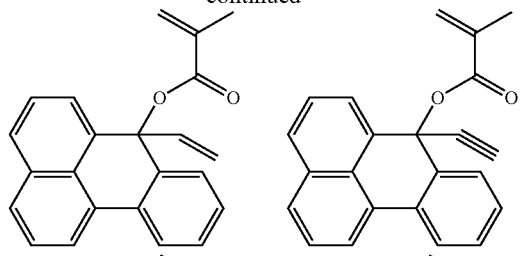
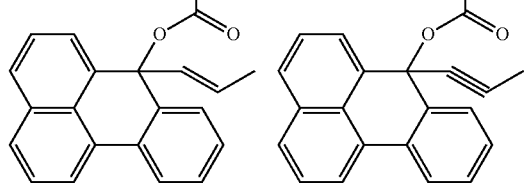
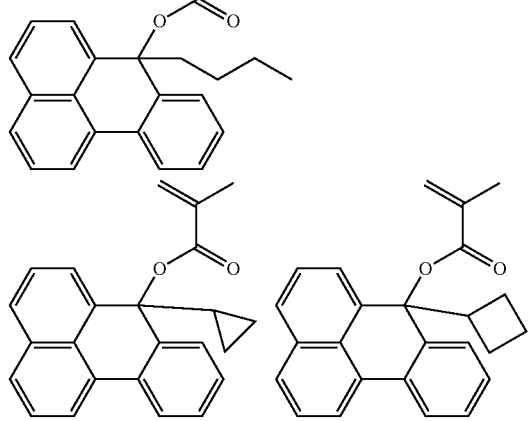
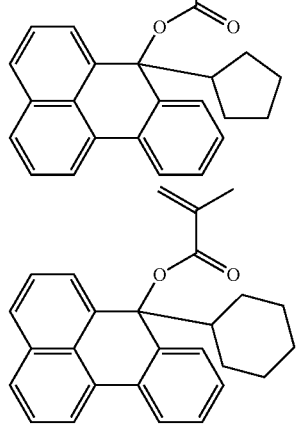
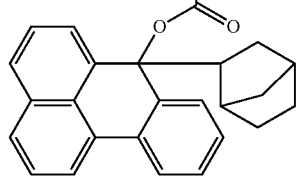

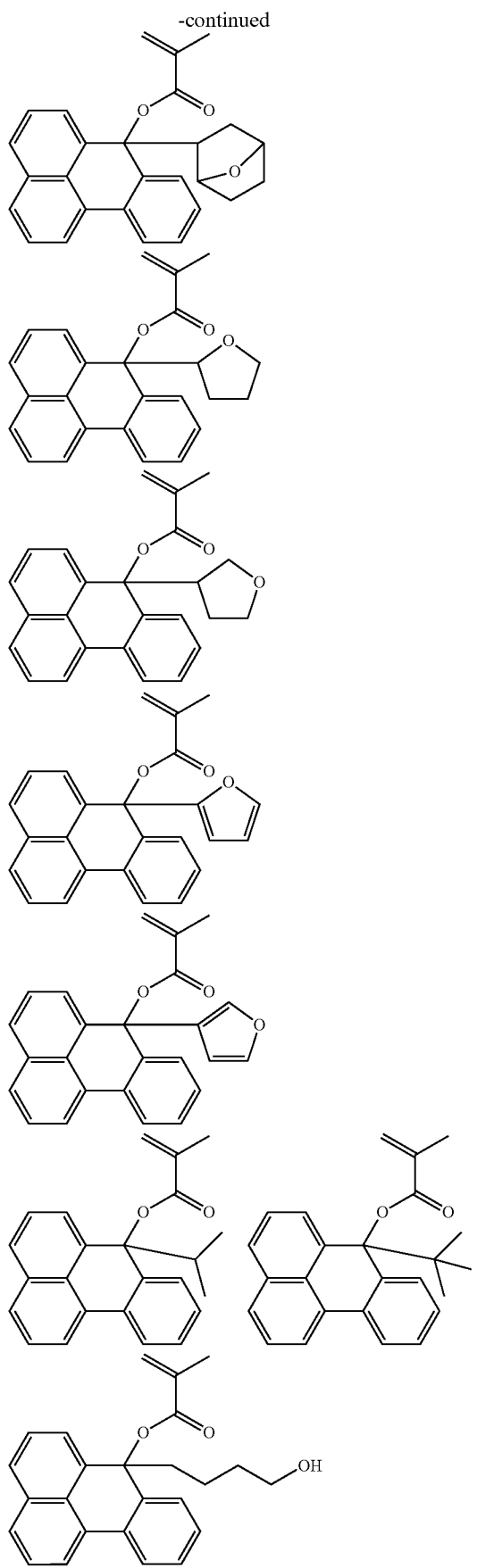
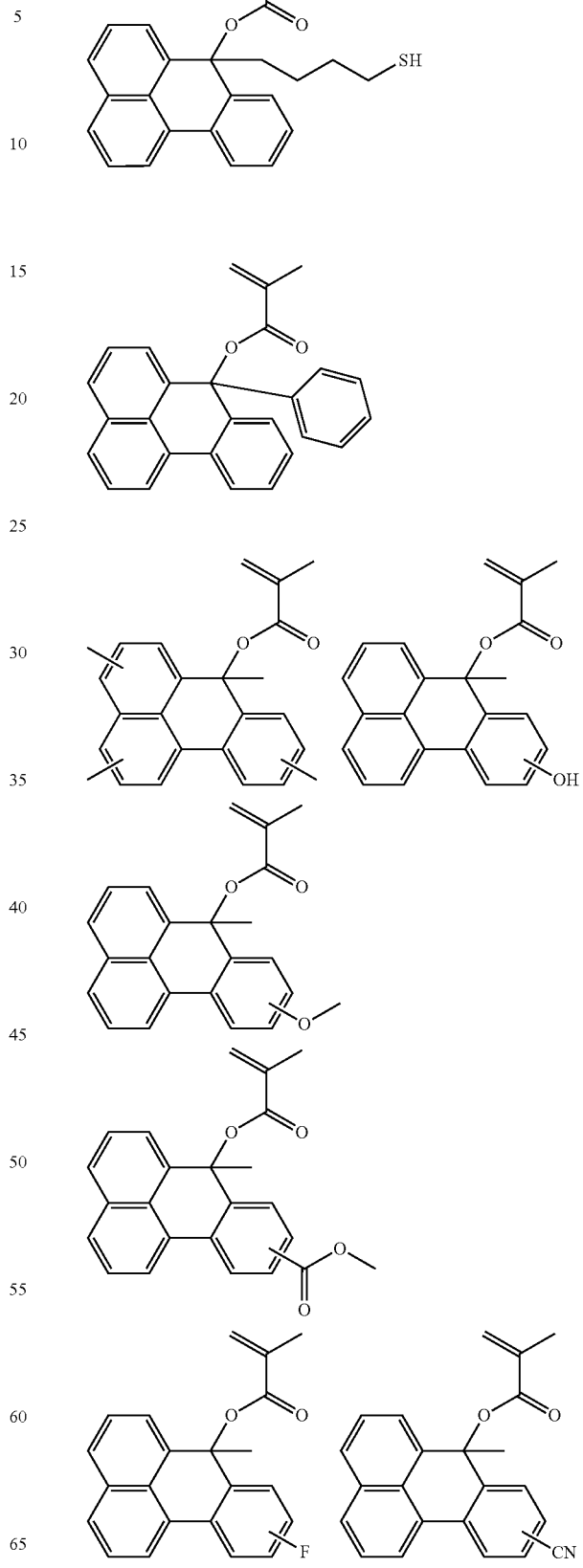

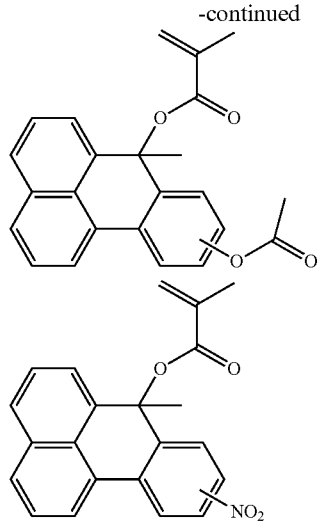
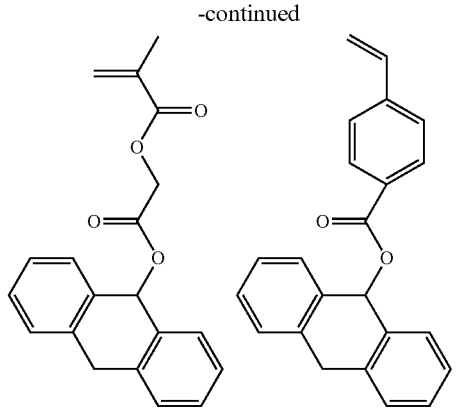

The acid labile group $R^2$ in recurring units (a1) may be a group having the general formula (A-3)-27.

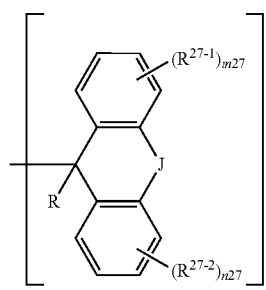

(A-3)-27

Herein $R^{27-1}$ and $R^{27-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is as defined above, J is methylene, ethylene, vinylene or —$CH_2$—S—, and m27 and n27 are an integer of 1 to 4.

Examples of the monomer from which recurring units (a1) having an acid labile group of formula (A-3)-27 substituted thereon are derived are shown below.

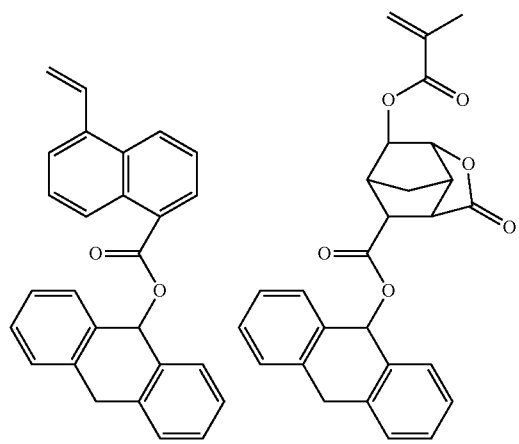
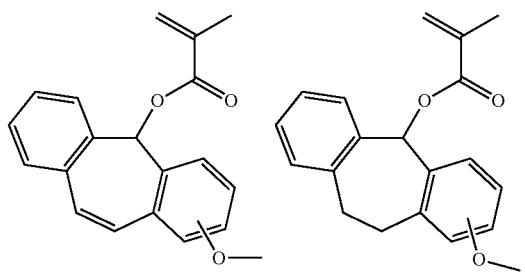
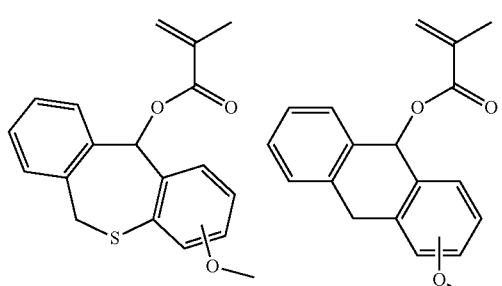
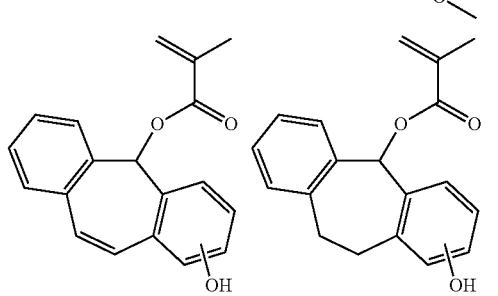

83
-continued
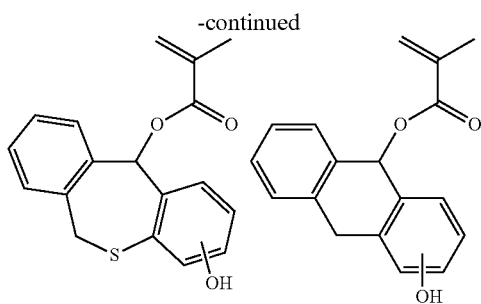
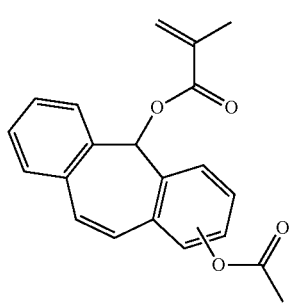
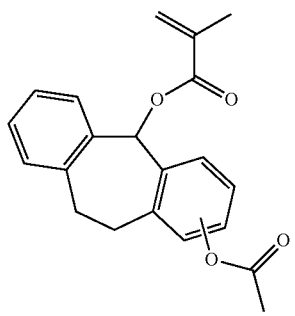
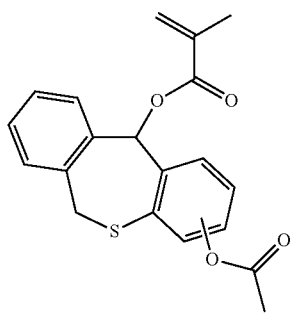
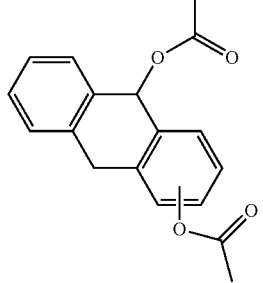
84
-continued
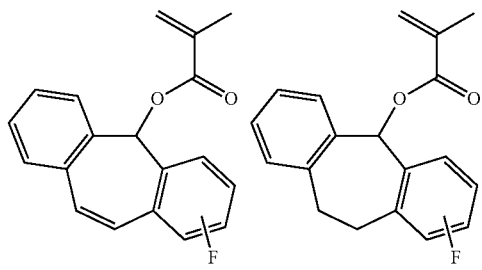
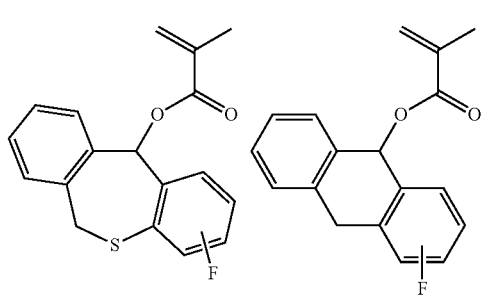
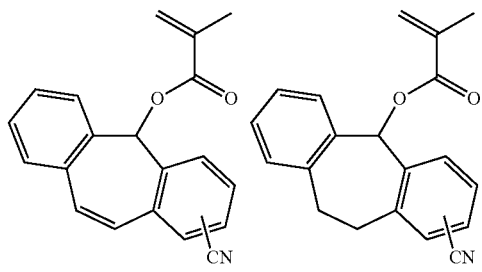
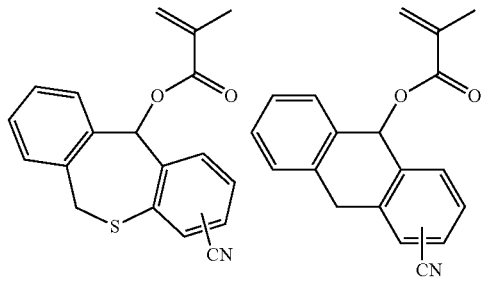
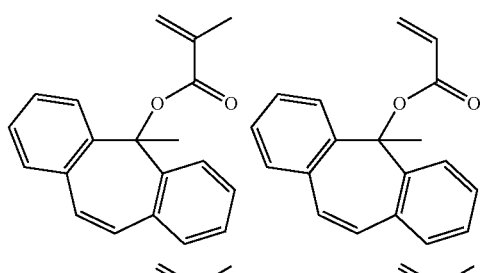
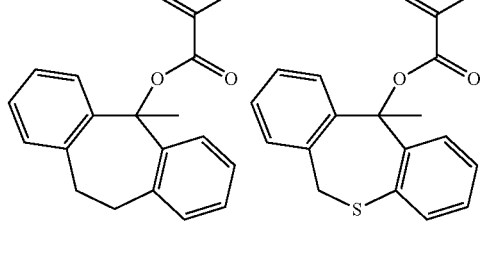

85
-continued
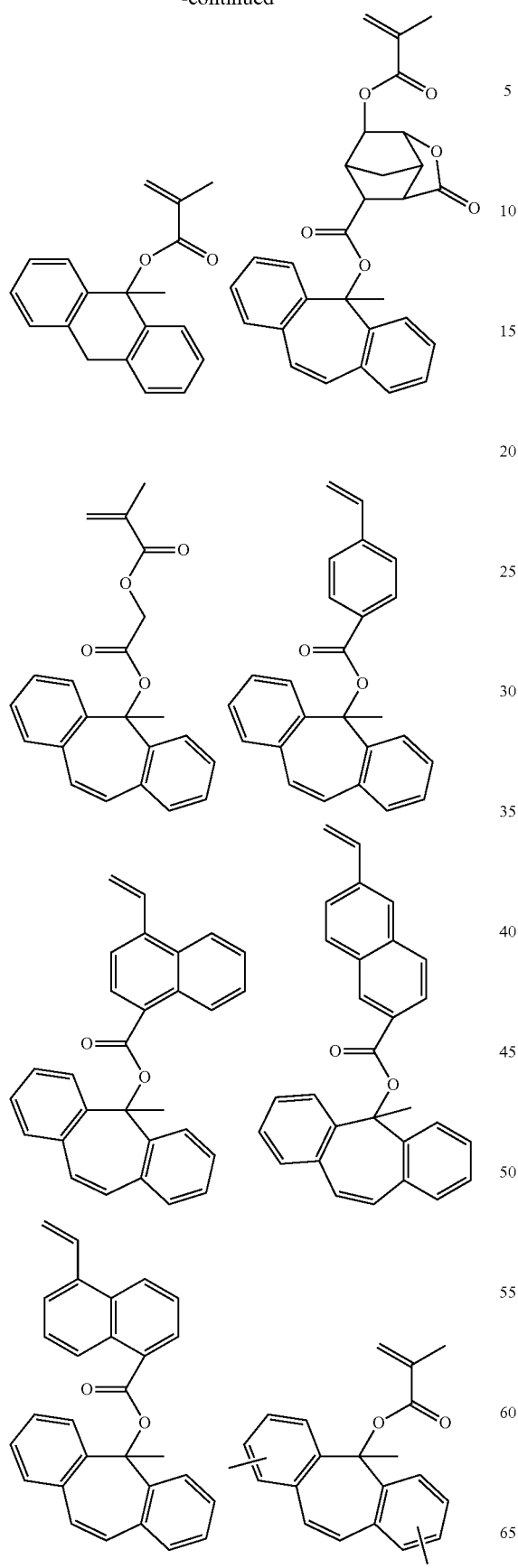
86
-continued
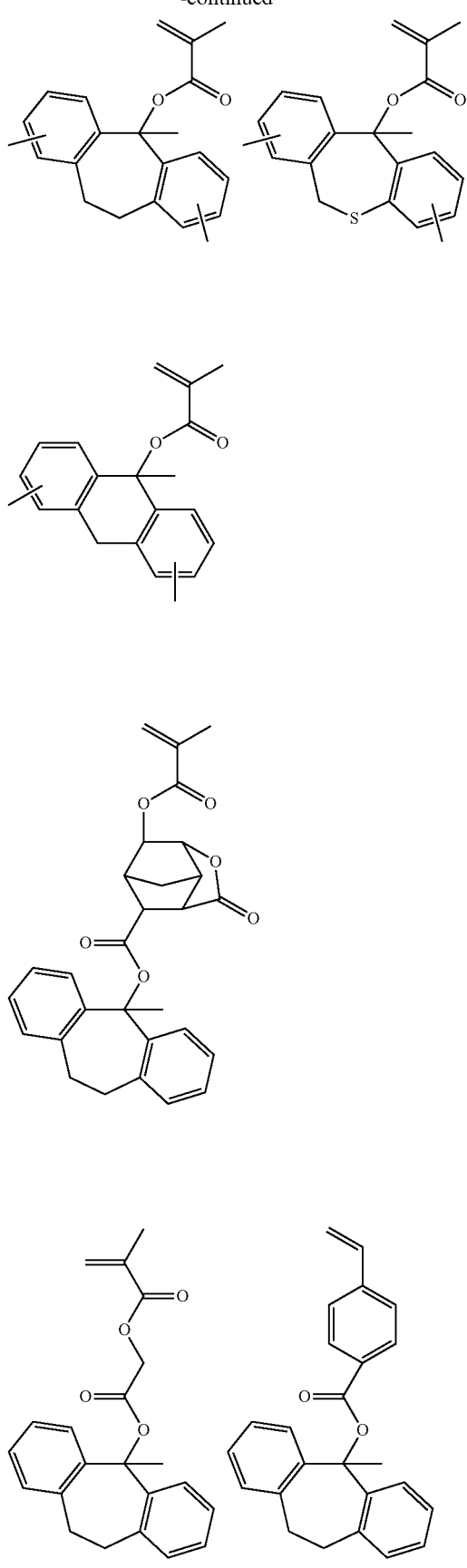

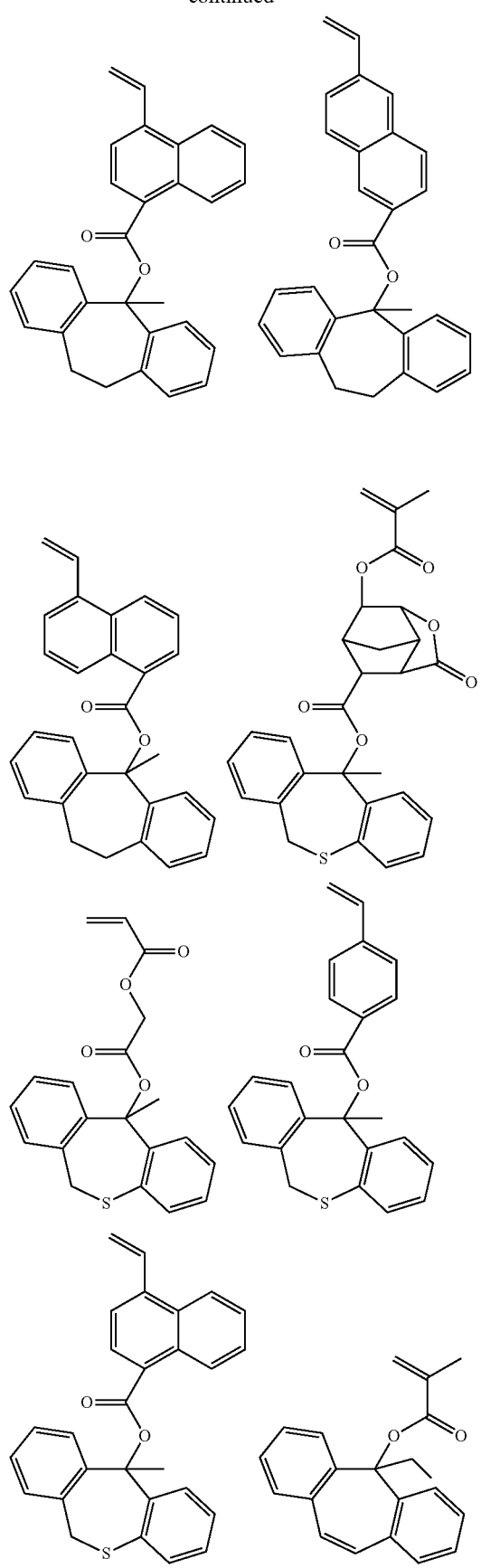
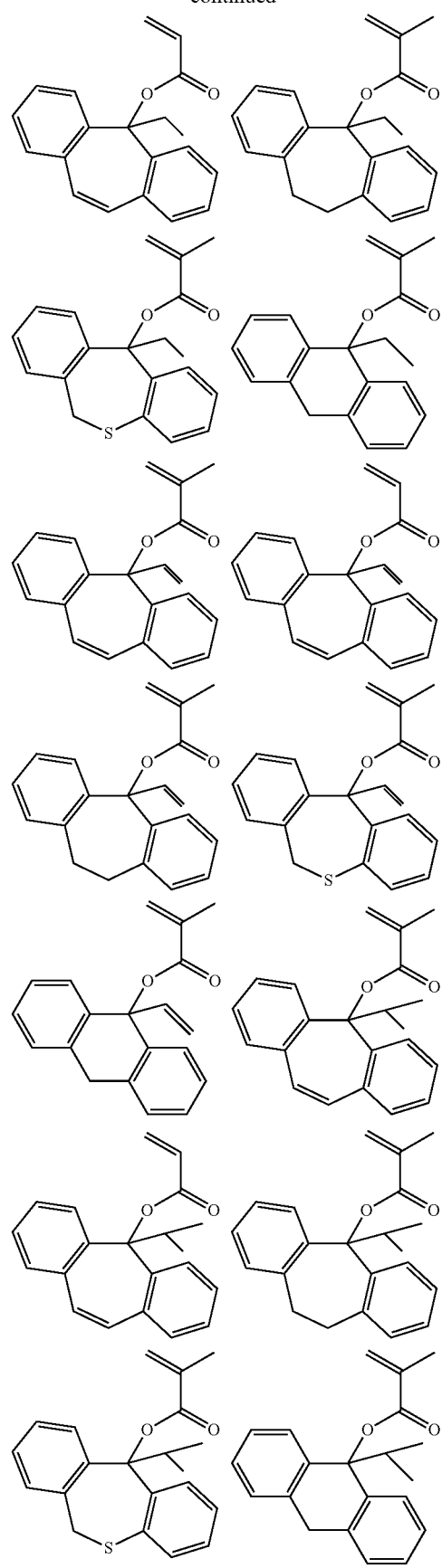

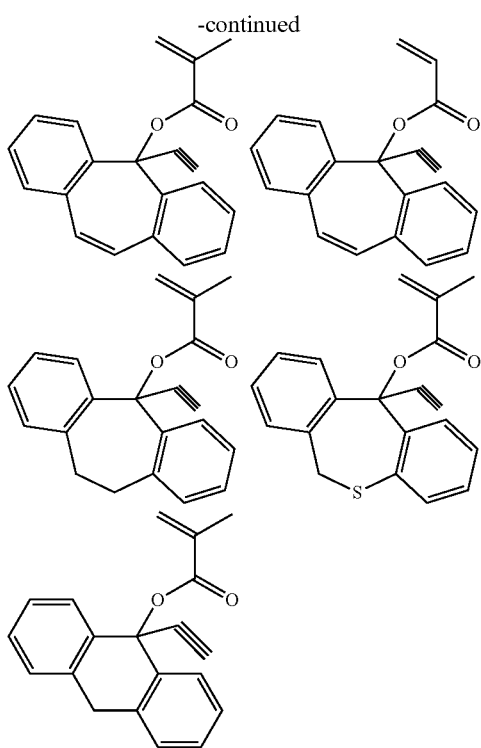

The acid labile group R² in recurring units (a1) may be a group having the general formula (A-3)-28.

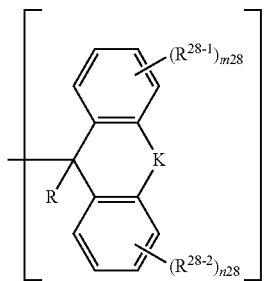

(A-3)-28

Herein $R^{28-1}$ and $R^{28-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is as defined above, K is carbonyl, ether, sulfide, —S(=O)— or —S(=O)$_2$—, and m28 and n28 are an integer of 1 to 4.

Examples of the monomer from which recurring units (a1) having an acid labile group of formula (A-3)-28 substituted thereon are derived are shown below.

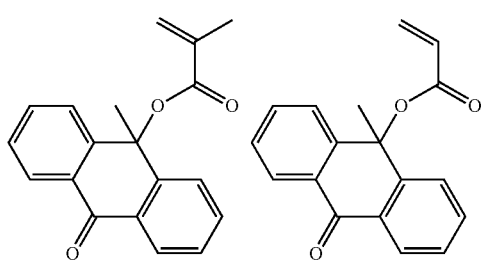

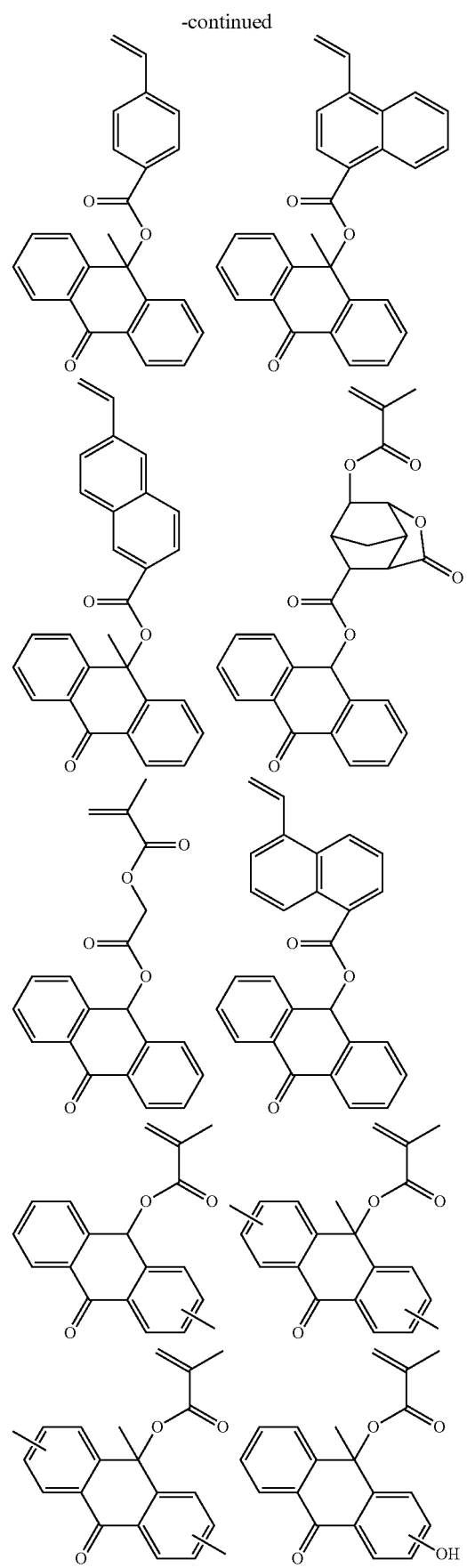

-continued
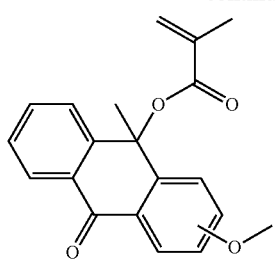
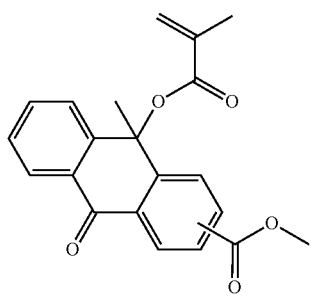
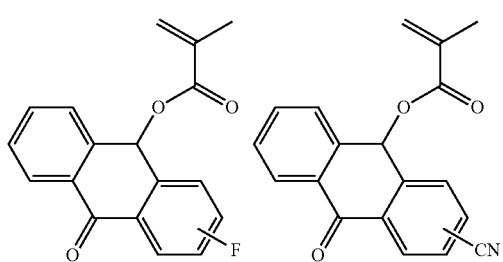
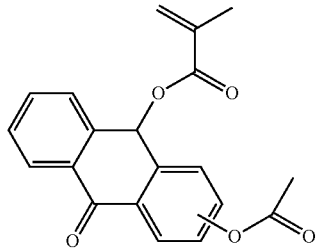
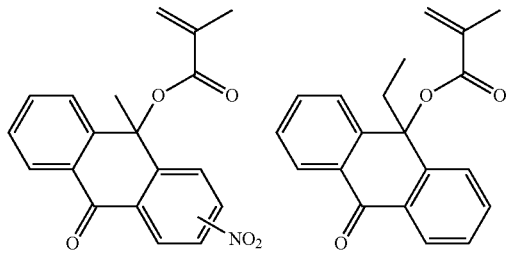
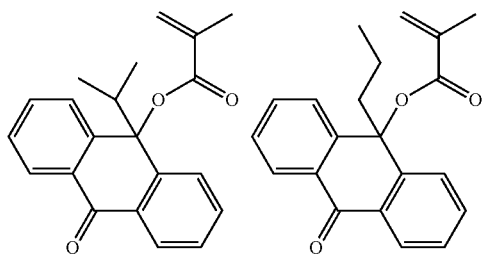
-continued
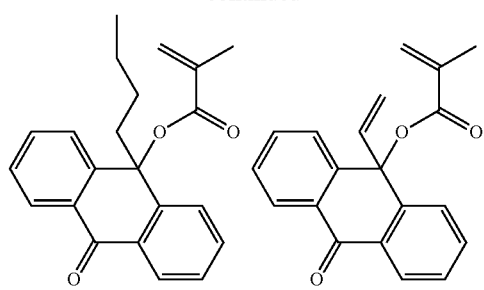
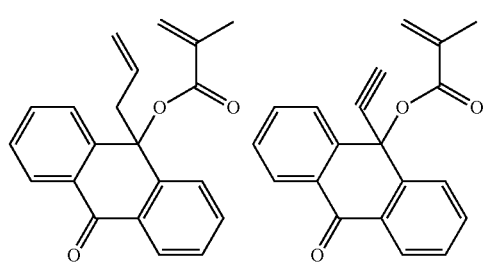
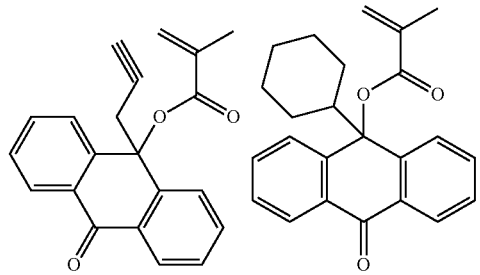
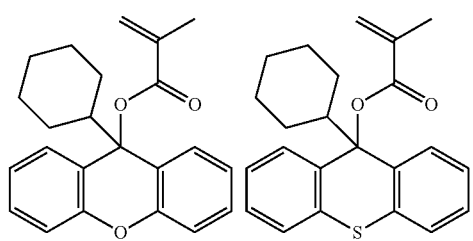
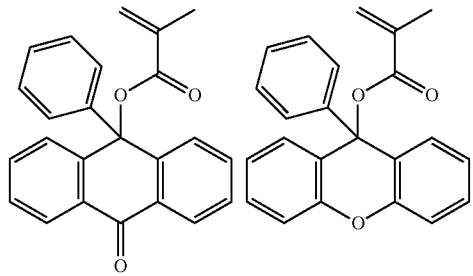
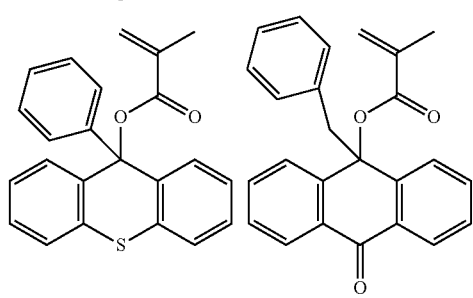

93
-continued
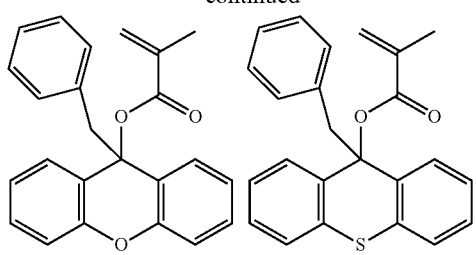
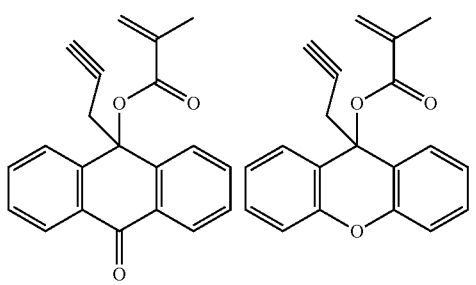
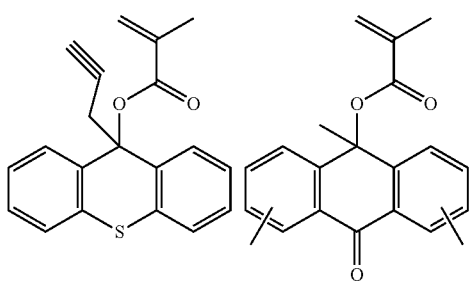
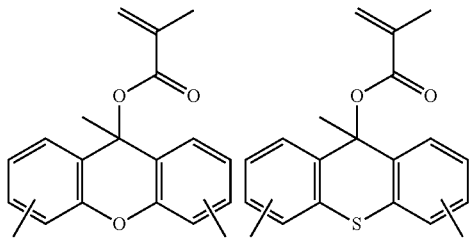
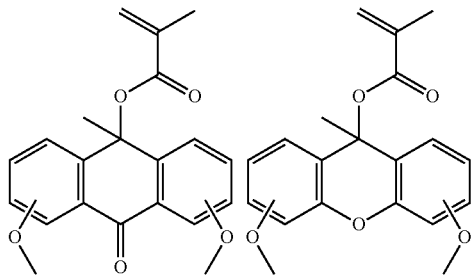
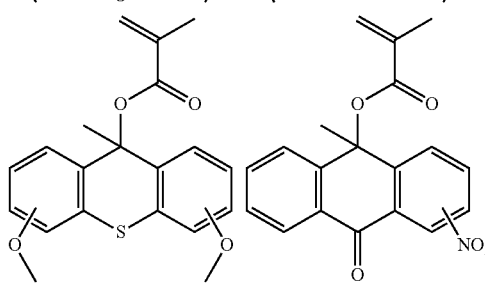
94
-continued
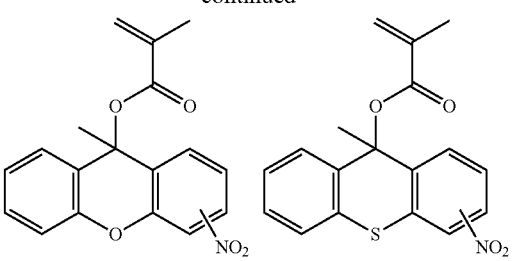
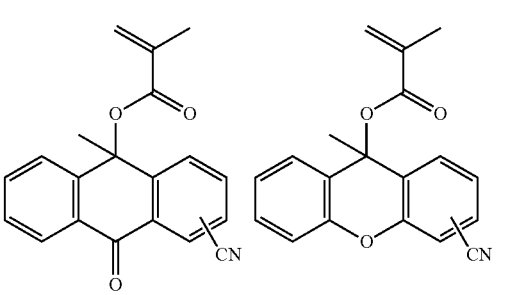
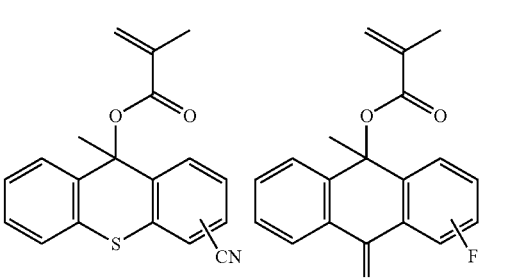
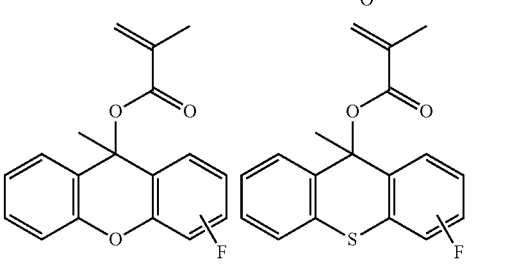
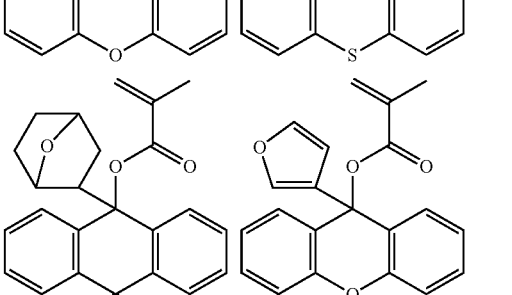

95 96
-continued -continued
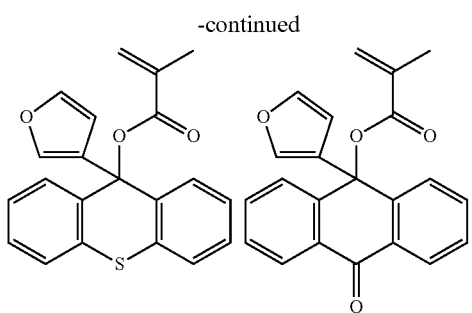 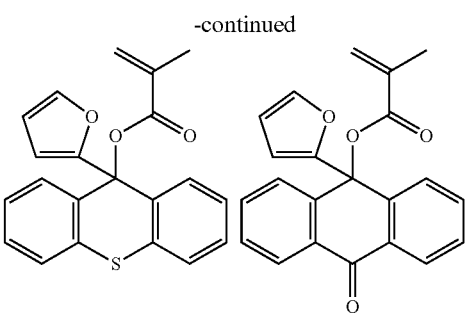
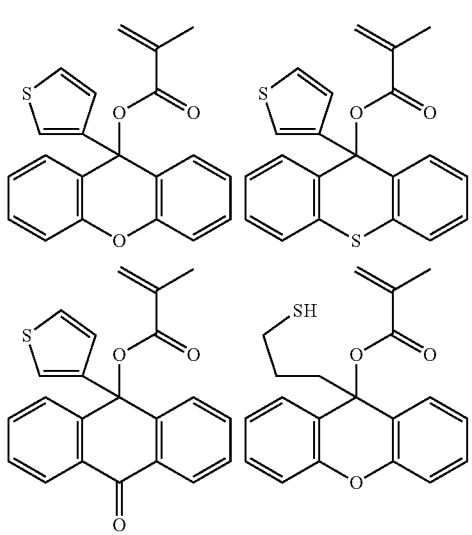 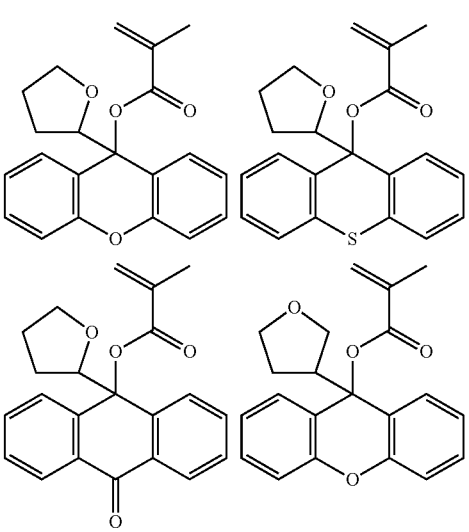
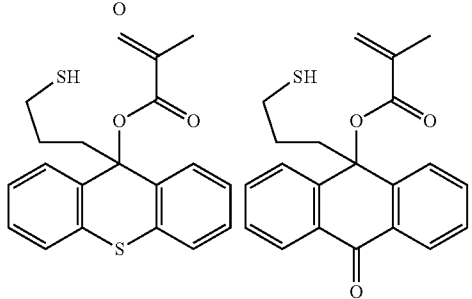 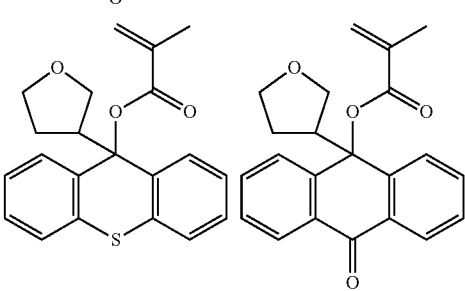
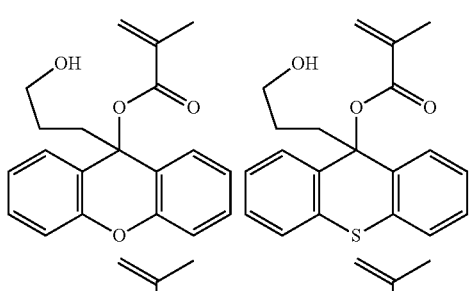 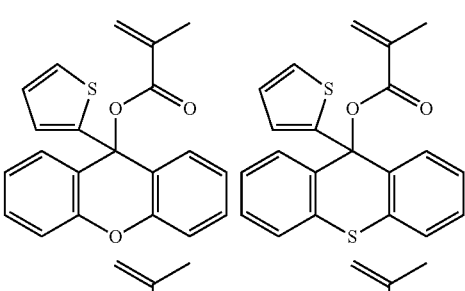
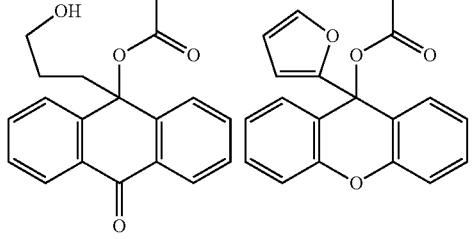

97
-continued
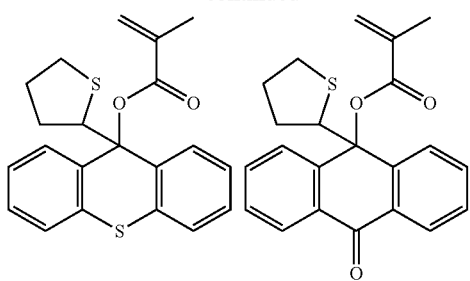
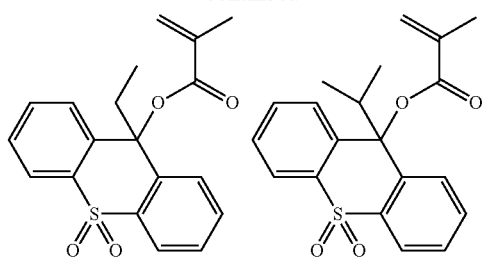
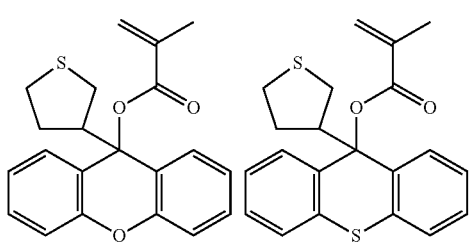
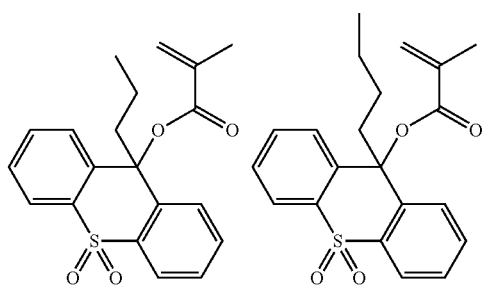
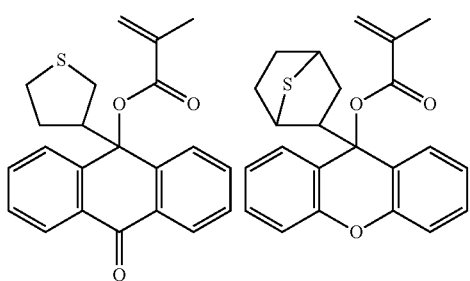
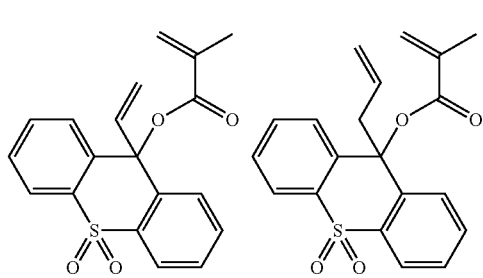
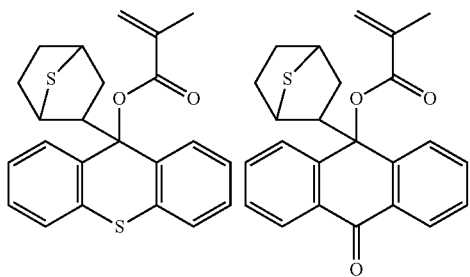
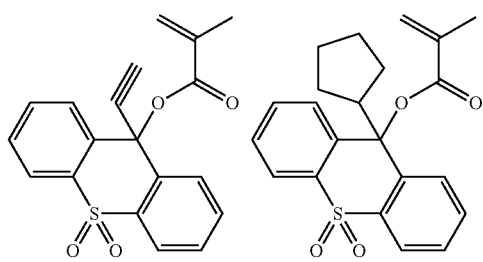
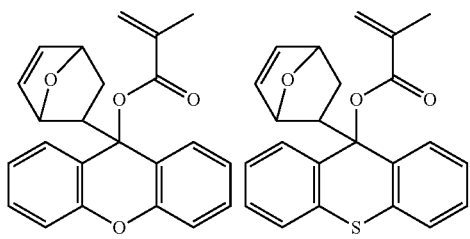
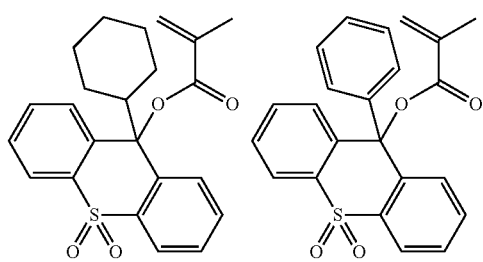
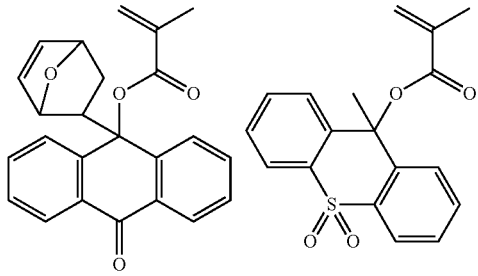
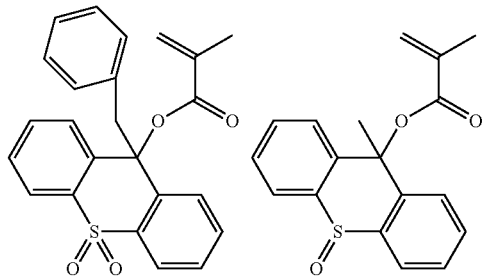

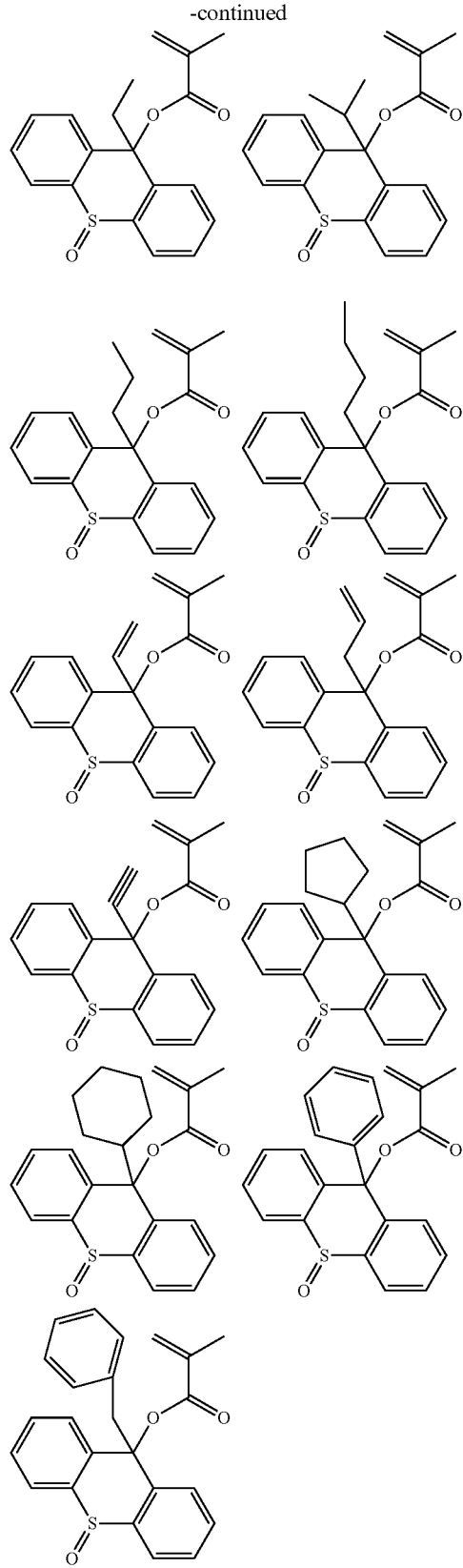
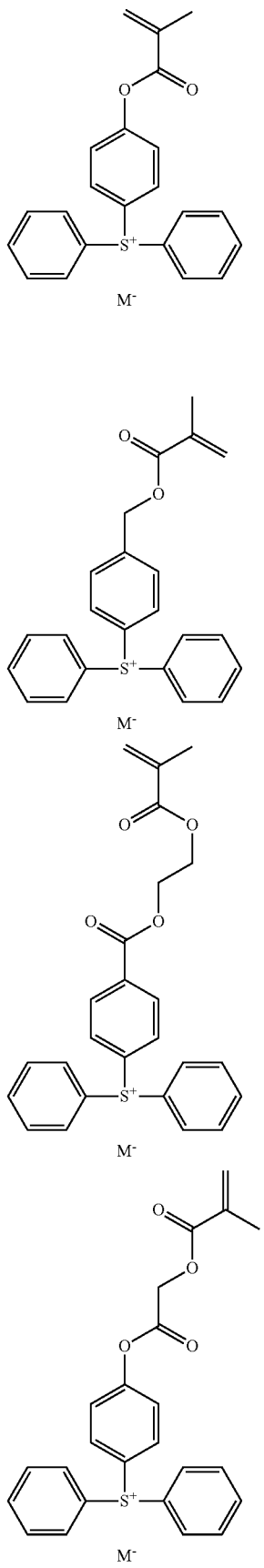
Examples of the monomer from which recurring units (b1) of sulfonium salt in formula (2) are derived are shown below.

101
-continued
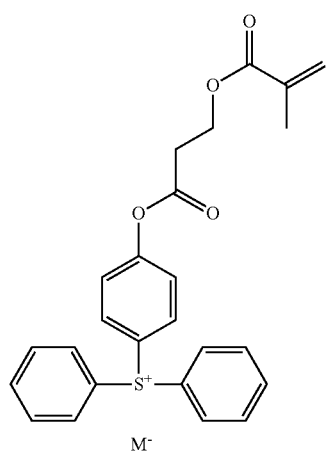
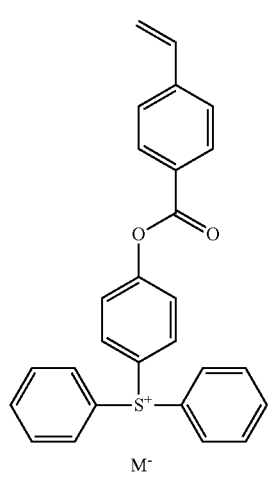
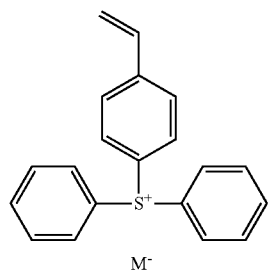
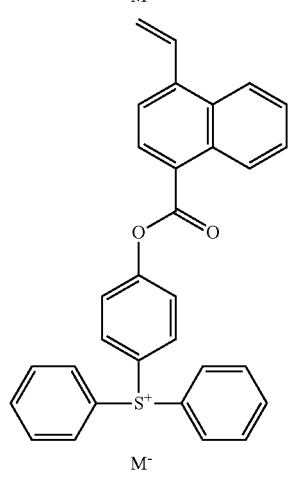
102
-continued
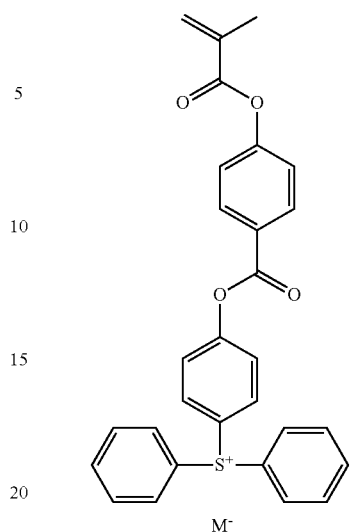
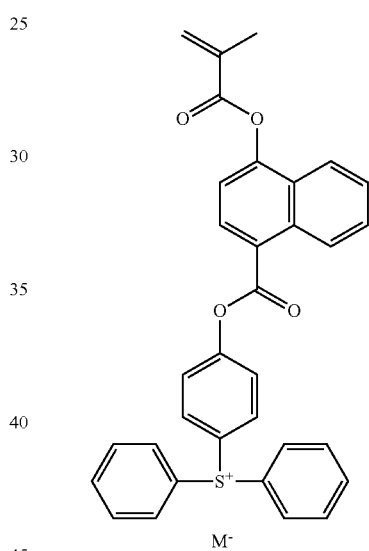
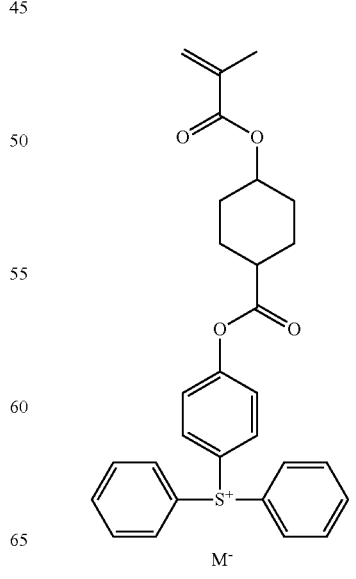

-continued
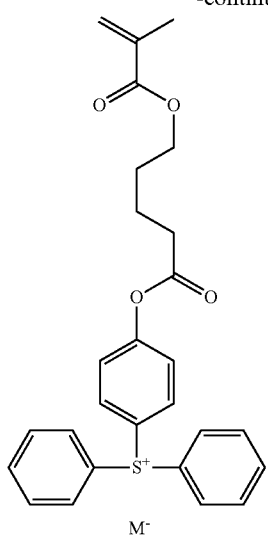
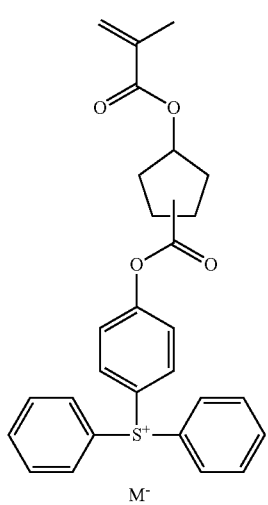
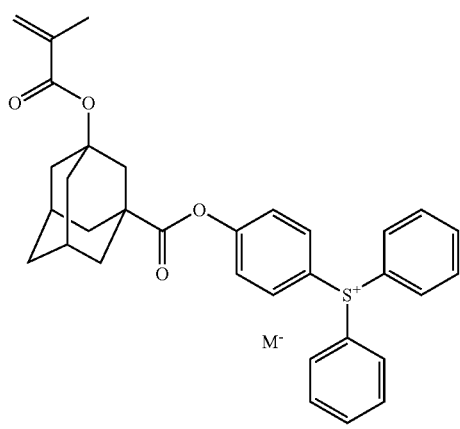
M⁻ is a non-nucleophilic counter ion.
Examples of the monomer from which recurring units (b2) of sulfonium salt in formula (2) are derived are shown below.
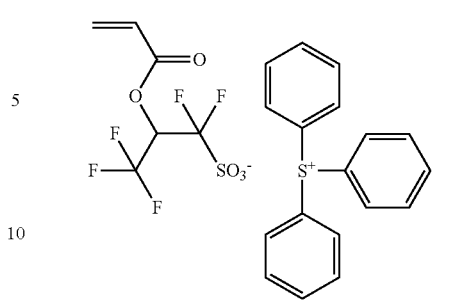
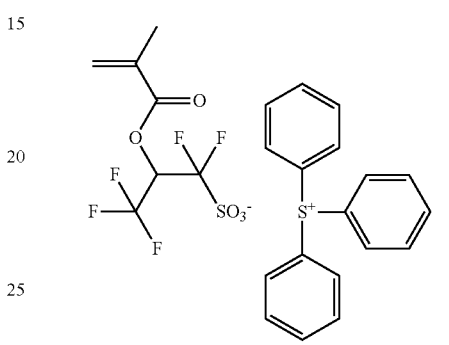
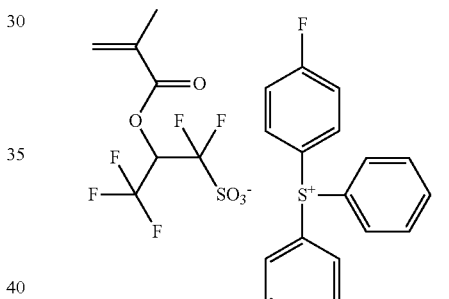
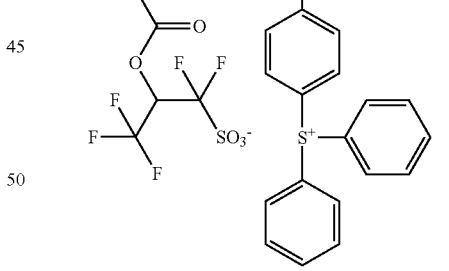
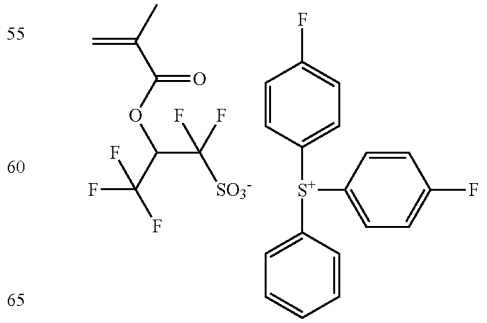

105
-continued
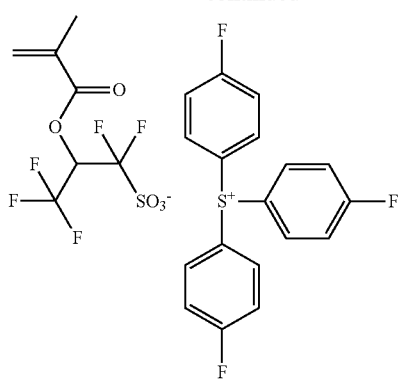
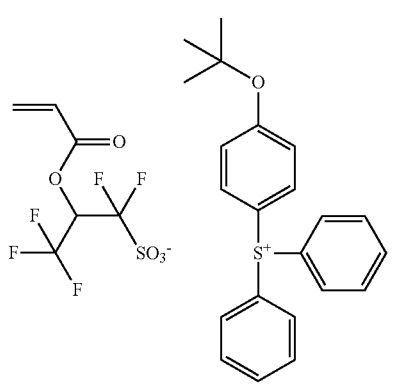
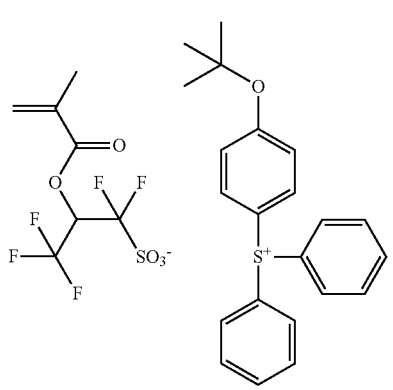
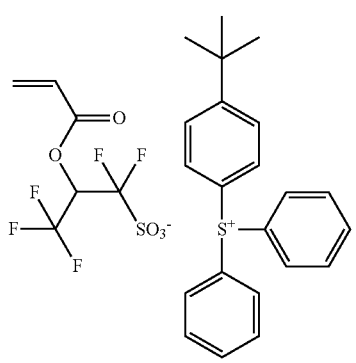
106
-continued
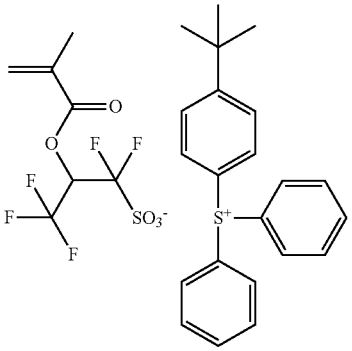
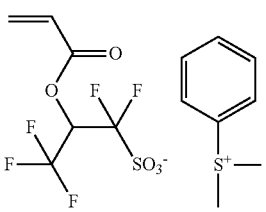

107
-continued
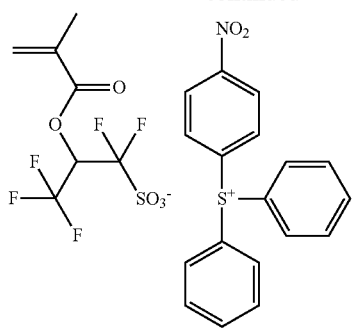
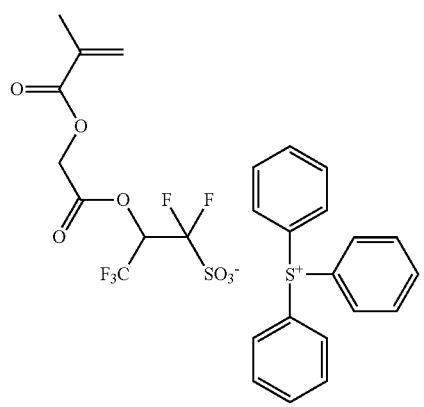
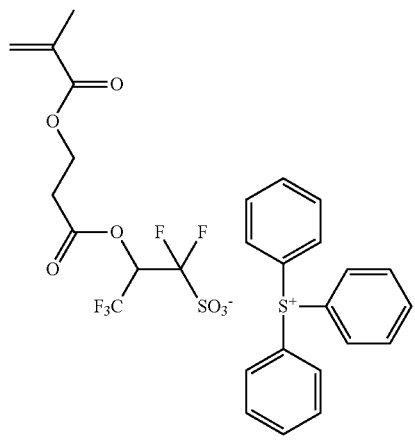
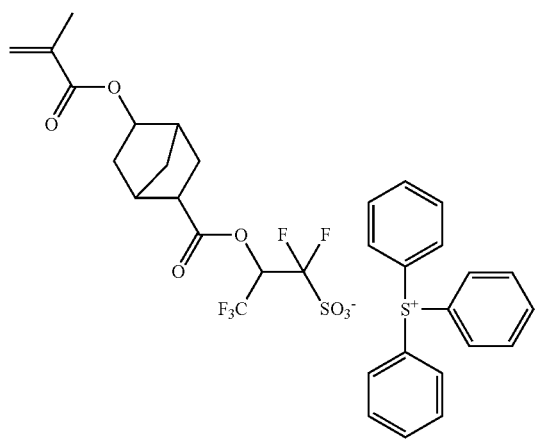
108
-continued
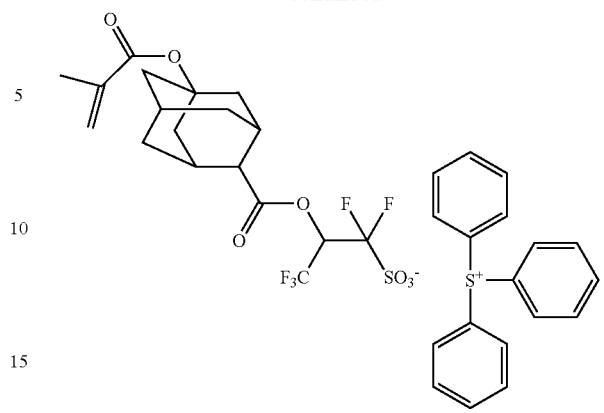
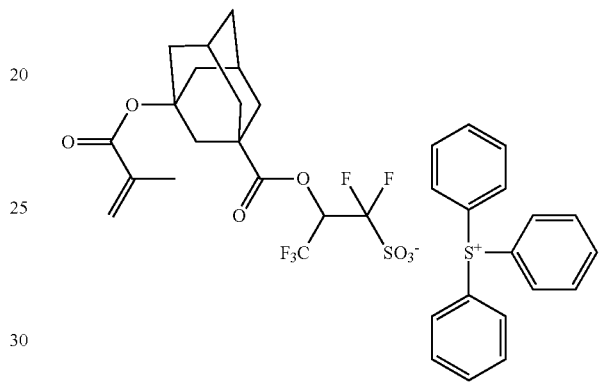
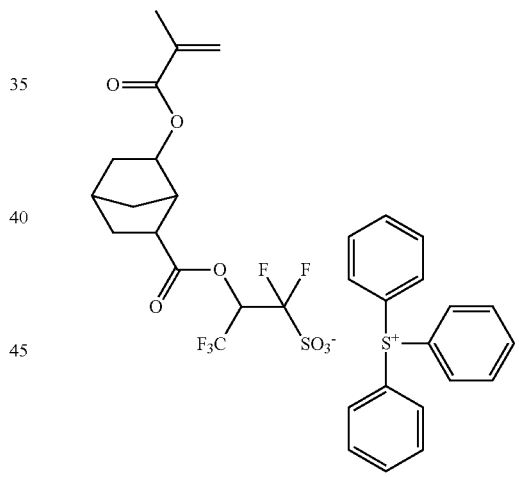
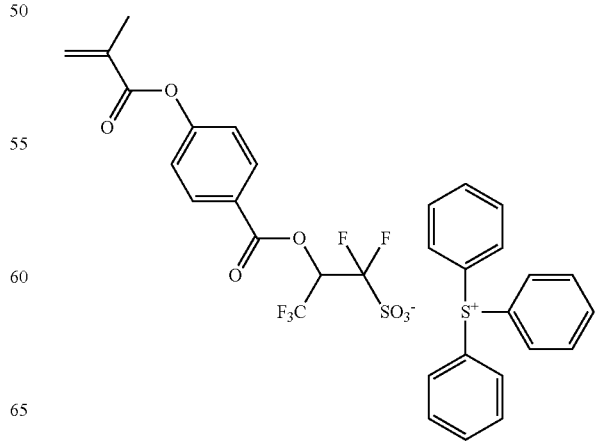

109
-continued
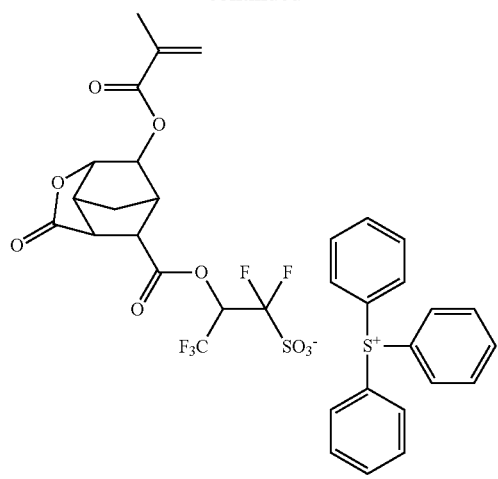
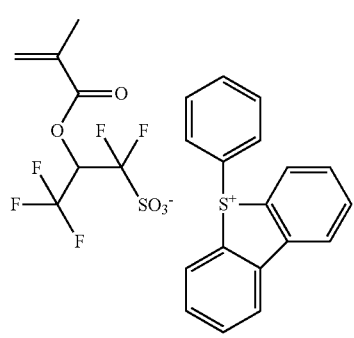
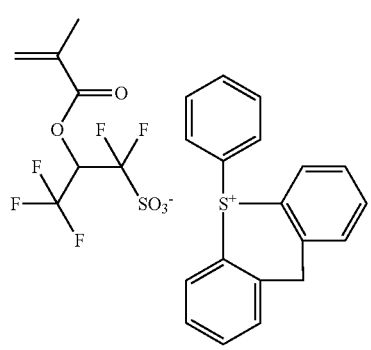
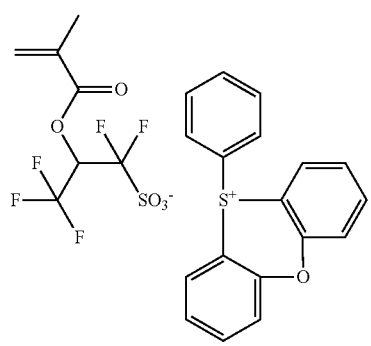
110
-continued
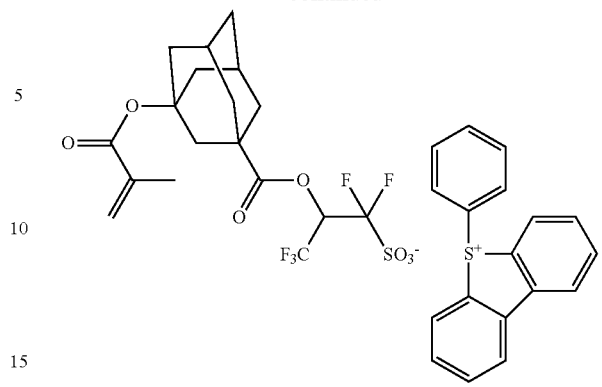
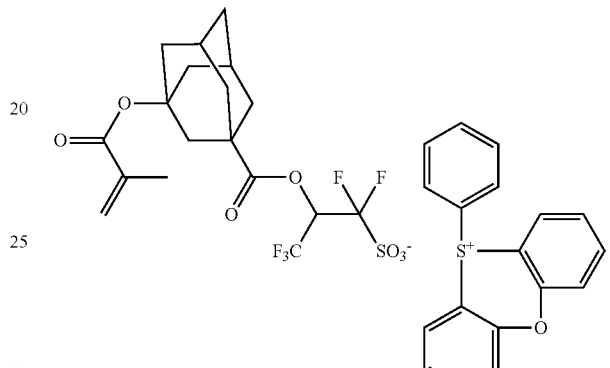
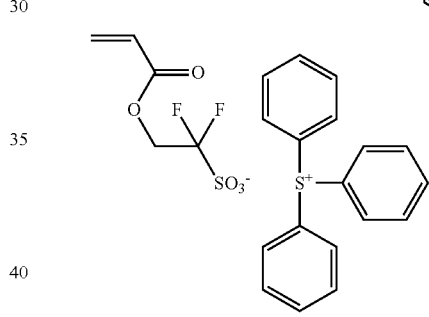
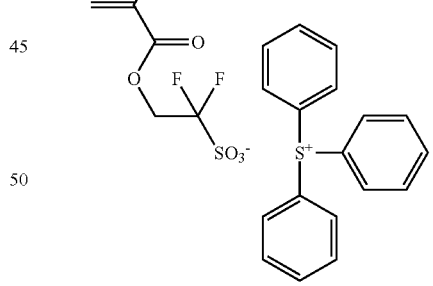
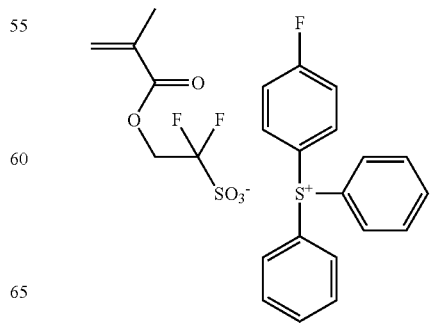

111
-continued
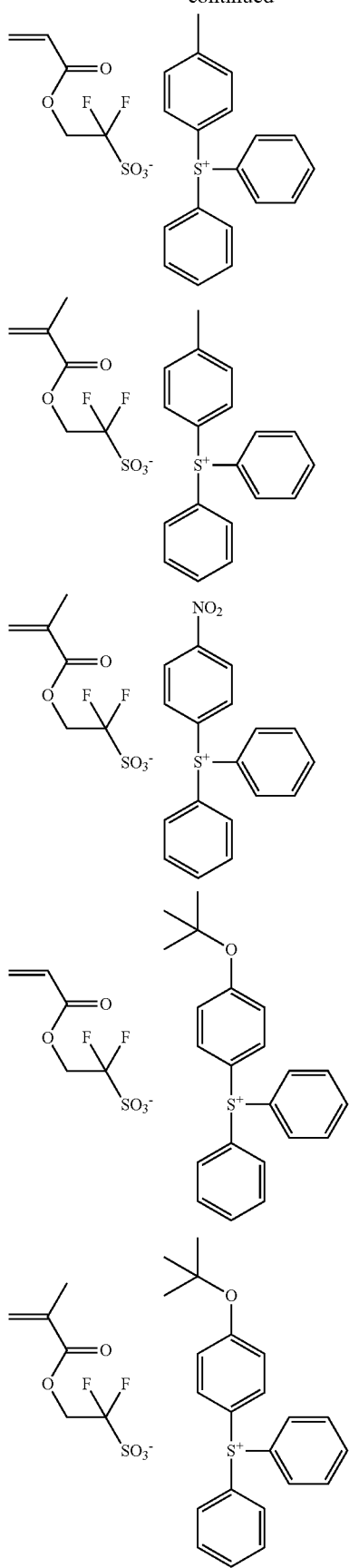
112
-continued
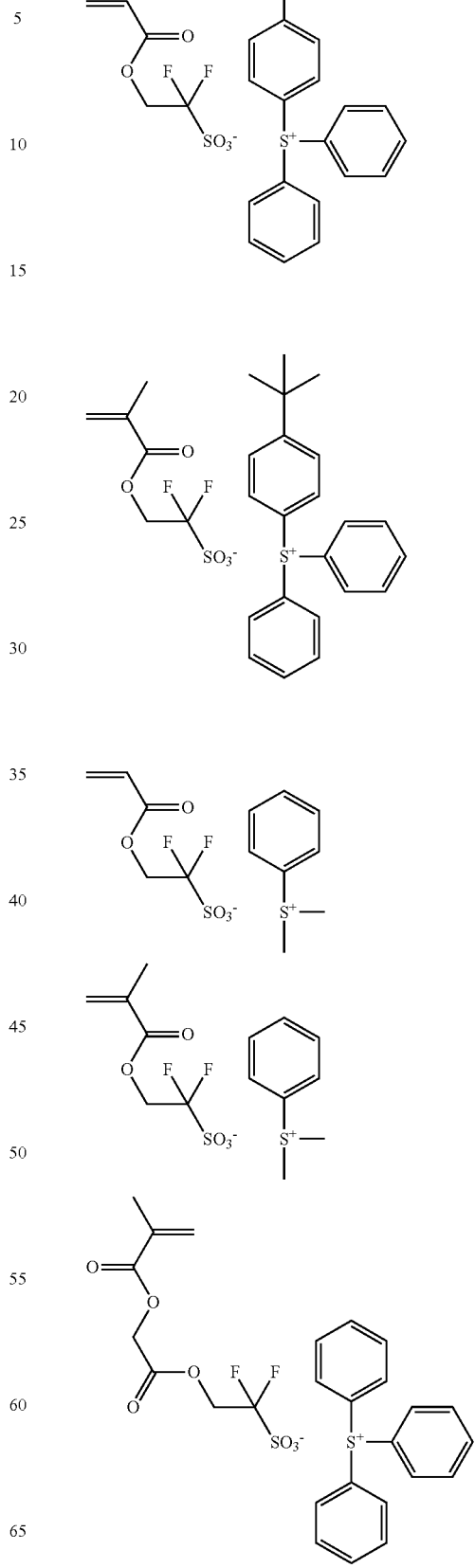

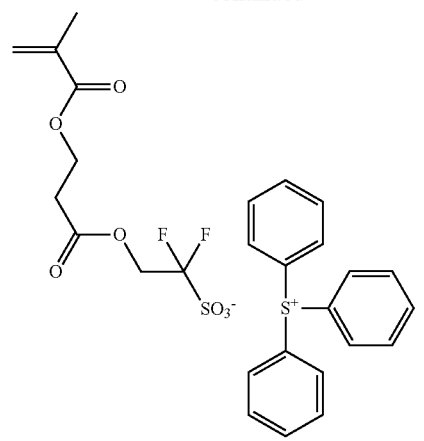
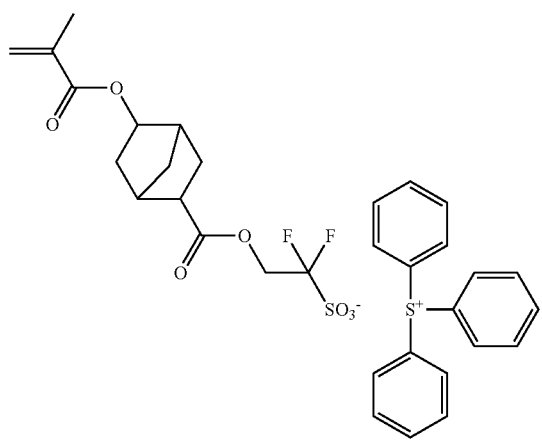
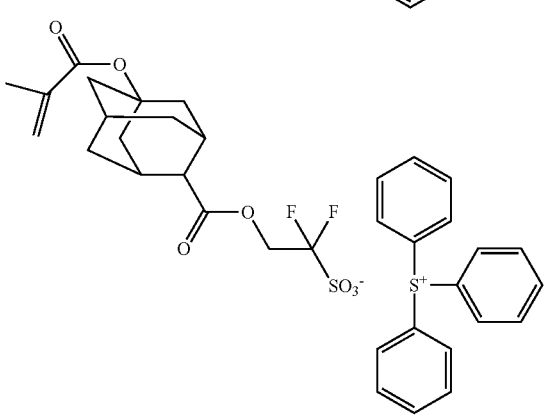
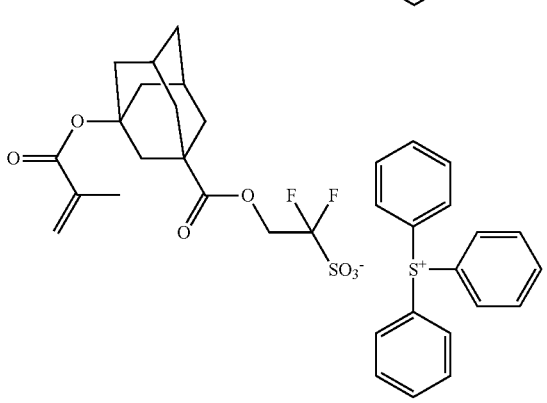
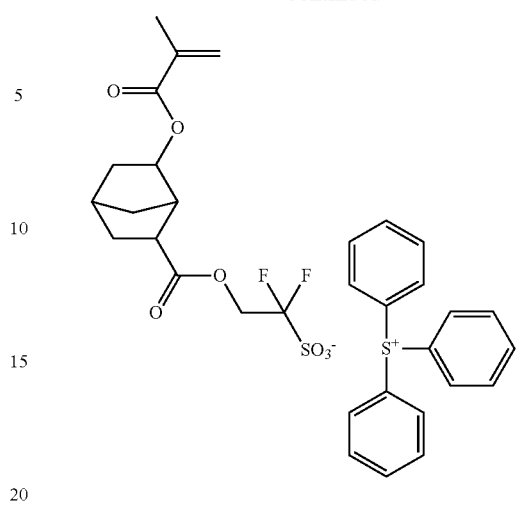
Examples of the monomer from which recurring units (b3) of sulfonium salt in formula (2) are derived are shown below.
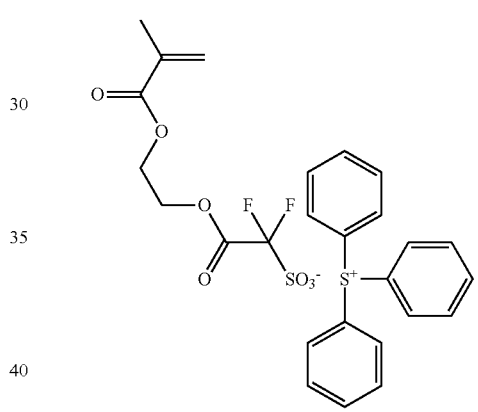
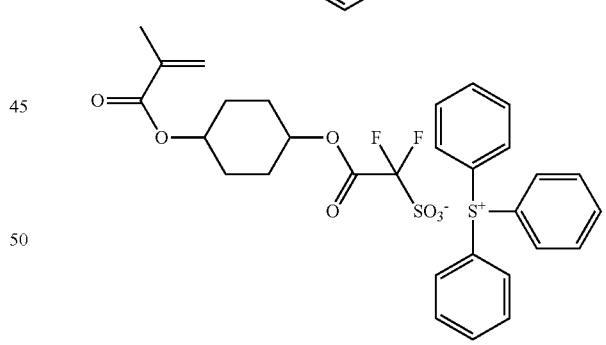
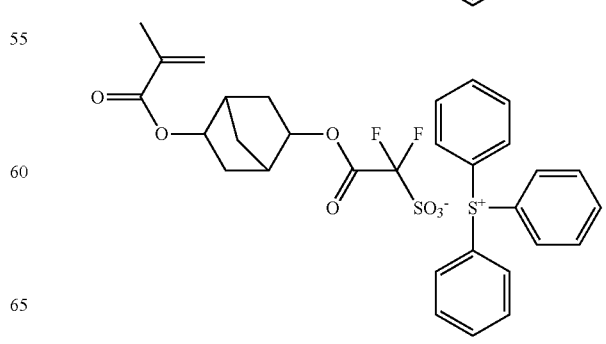

115
-continued
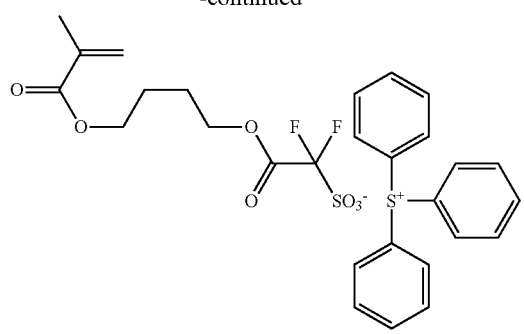
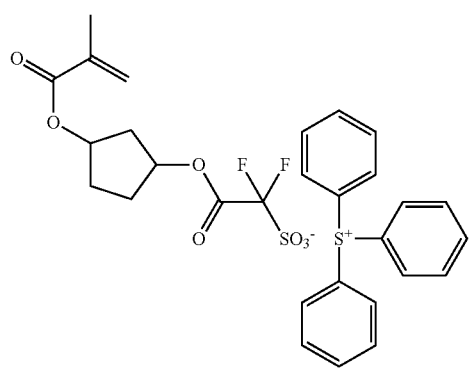
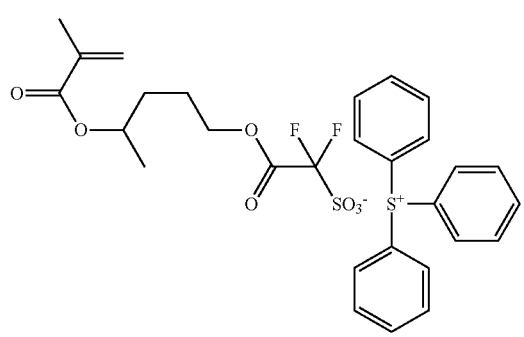
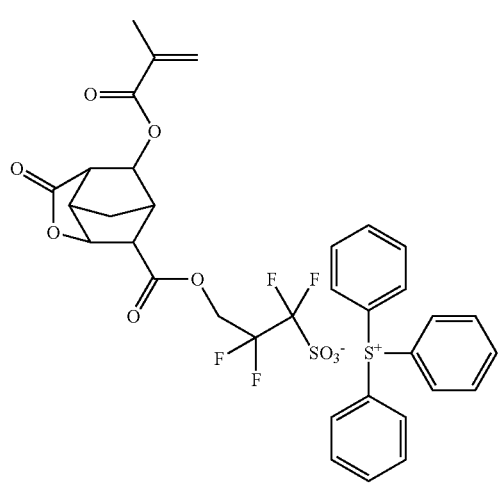
116
-continued
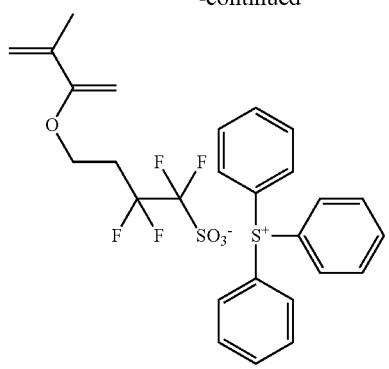
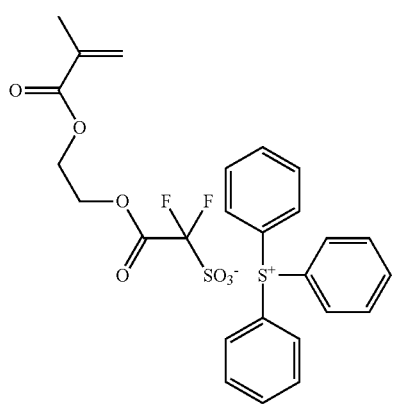
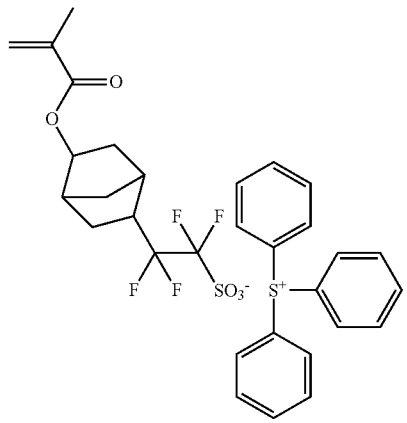
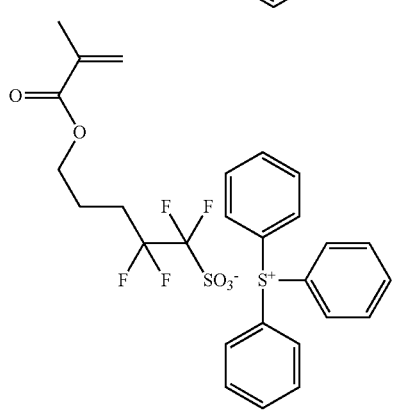

117
-continued
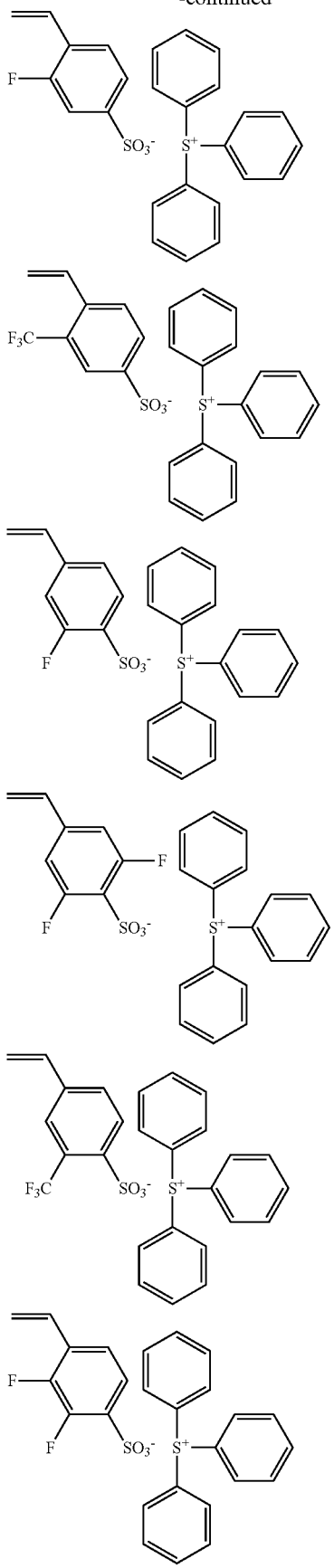
118
-continued
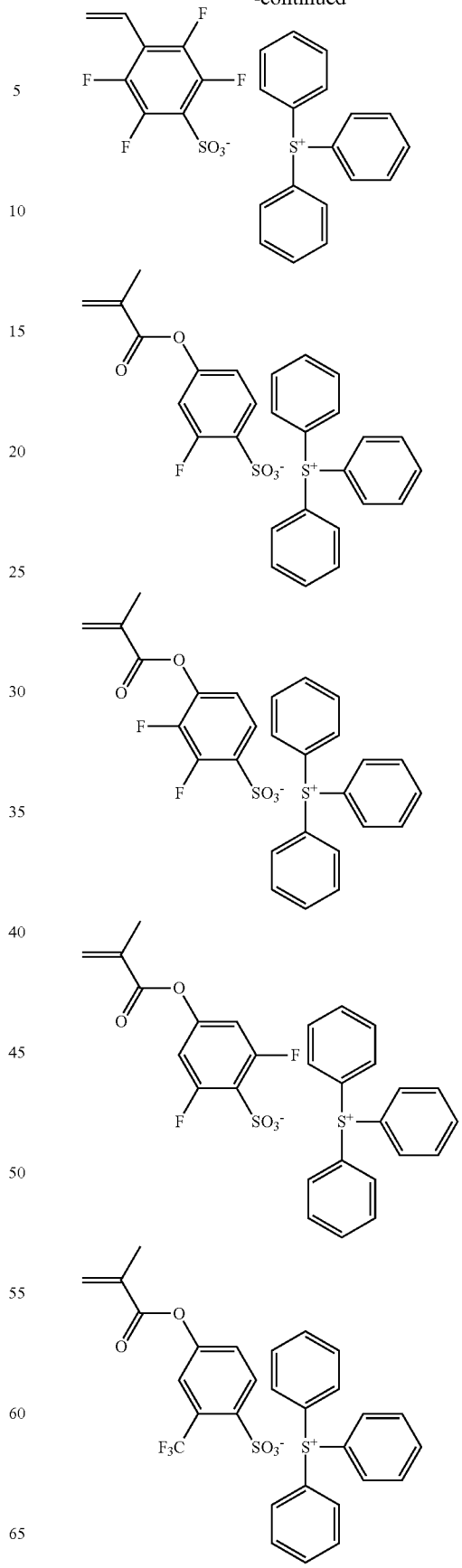

119
-continued
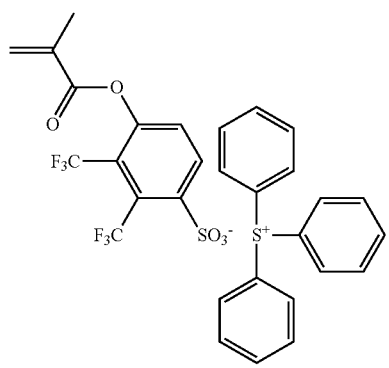
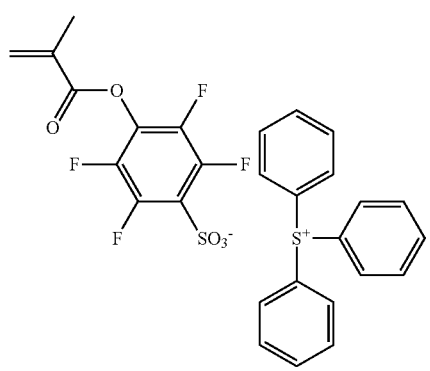
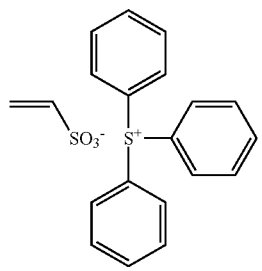
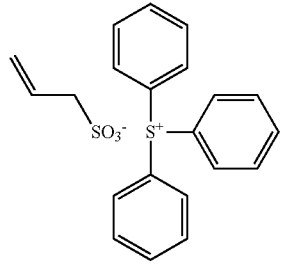
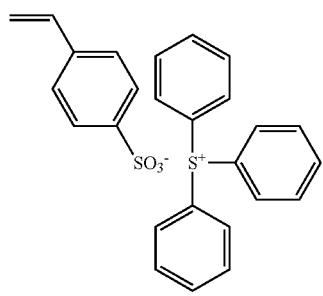
120
-continued
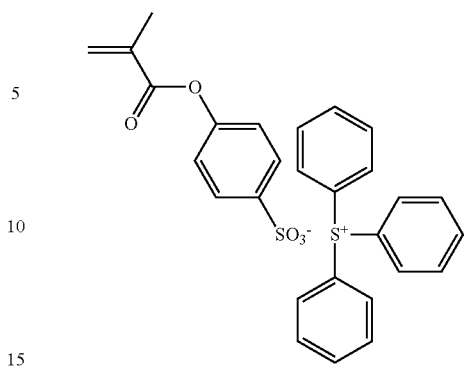
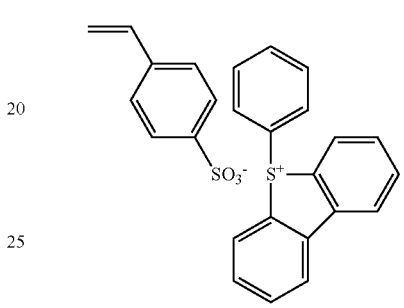
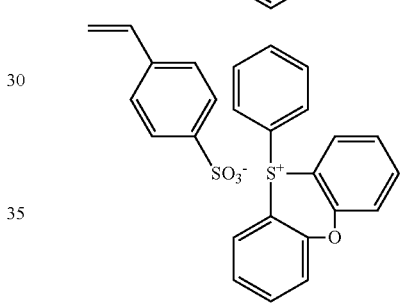
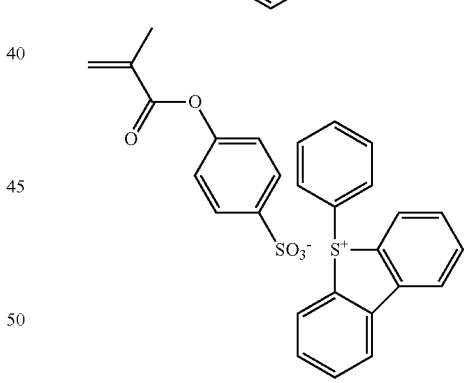
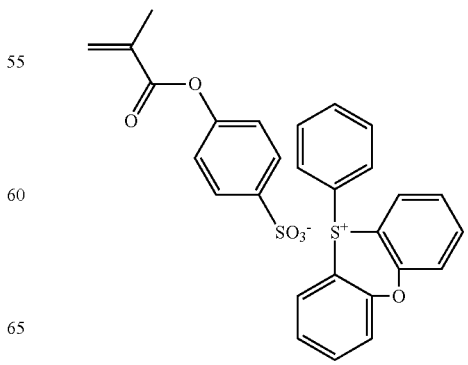

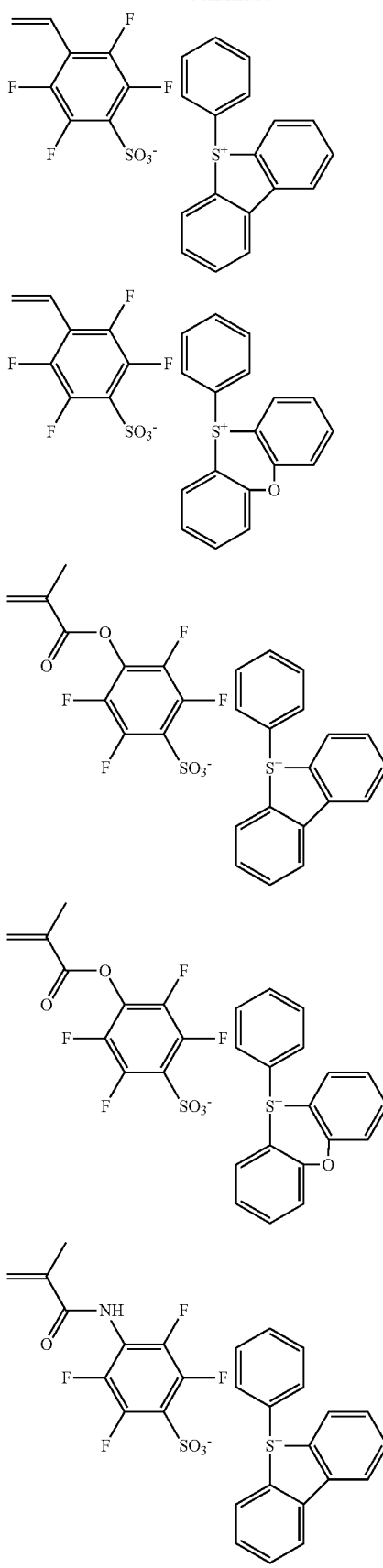

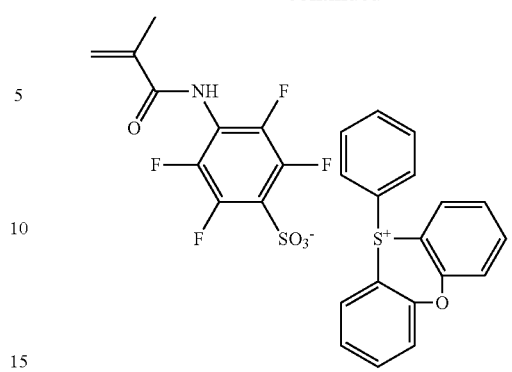

While the polymer is characterized by comprising, in copolymerized form, recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, and preferably acid generator-bearing recurring units (b1), (b2) or (b3), recurring units (c) having a phenolic hydroxyl group as the adhesive group may be further copolymerized.

Examples of the monomer from which recurring units (c) having a phenolic hydroxyl group are derived are shown below.

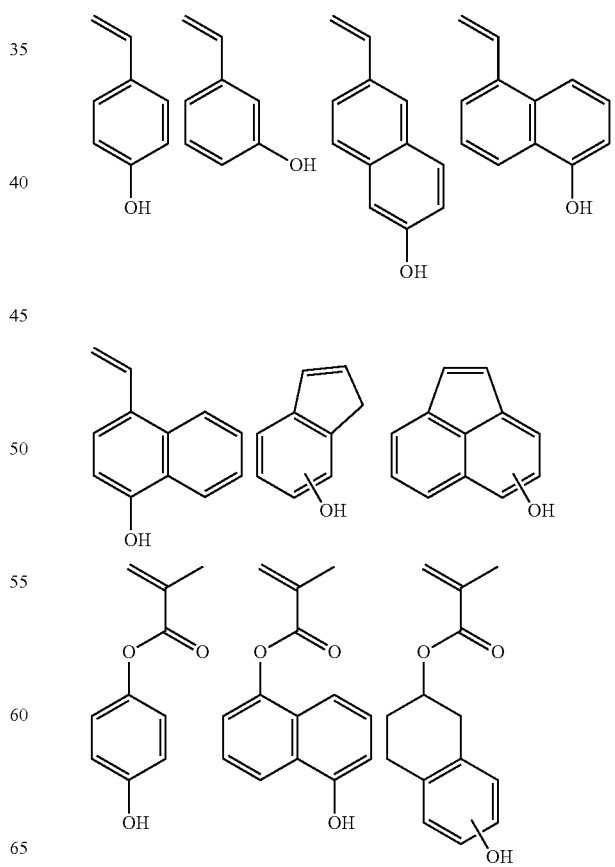

-continued
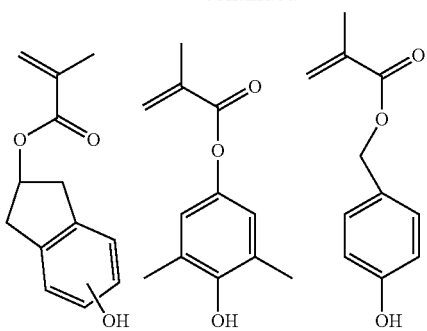
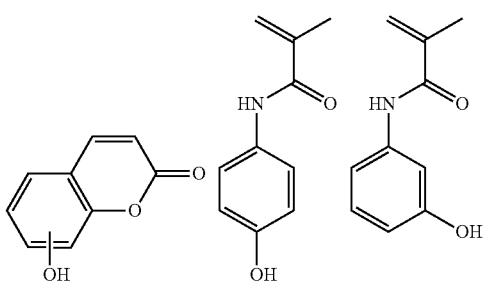
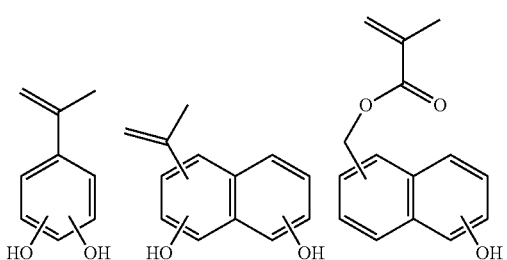
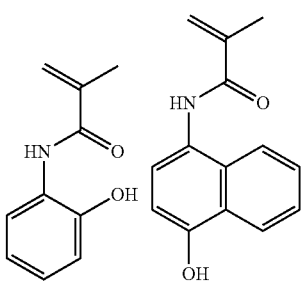
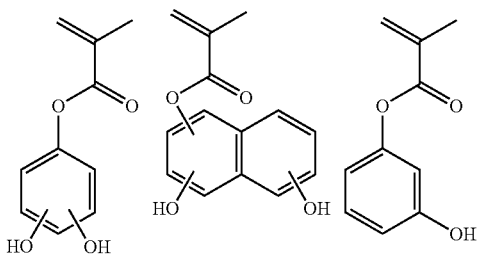
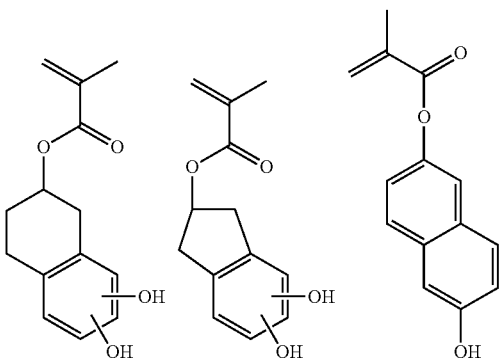
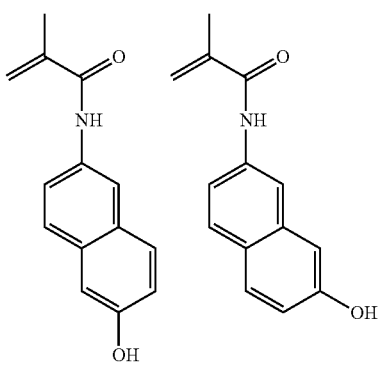
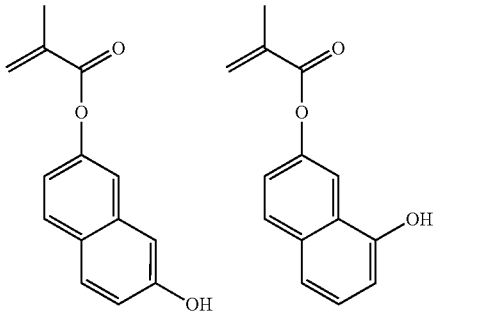
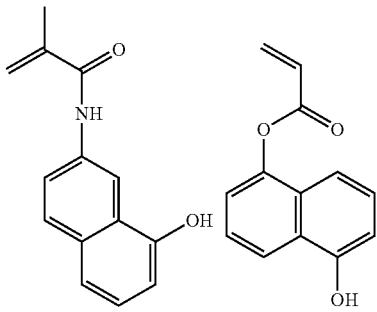

125
126
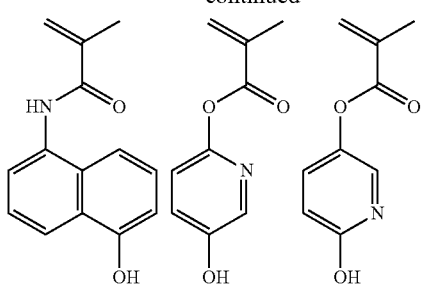
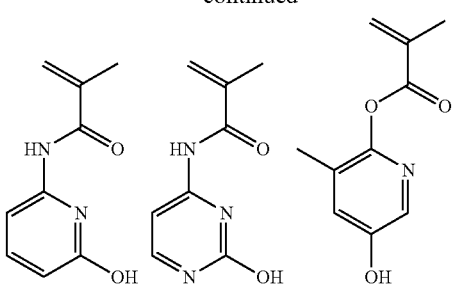

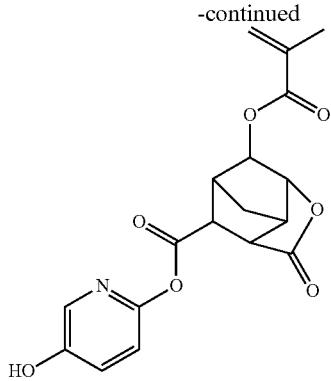

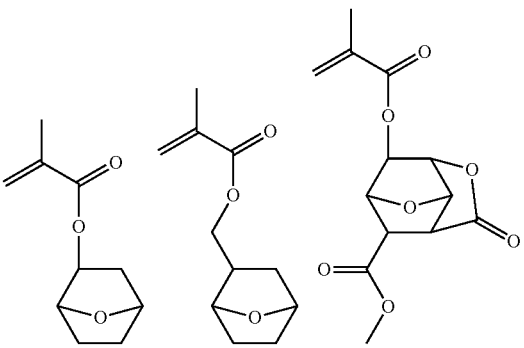

Recurring units (d) having another adhesive group may also be copolymerized. Examples of the other adhesive group include hydroxyl (other than the phenolic hydroxyl), carboxyl, lactone ring, carbonate, thiocarbonate, carbonyl, cyclic acetal, ether, ester, sulfonic acid ester, cyano, amide, and —O—C(=O)-G- wherein G is sulfur or NH. Examples of the monomer from which recurring units (d) having another adhesive group are derived are shown below.

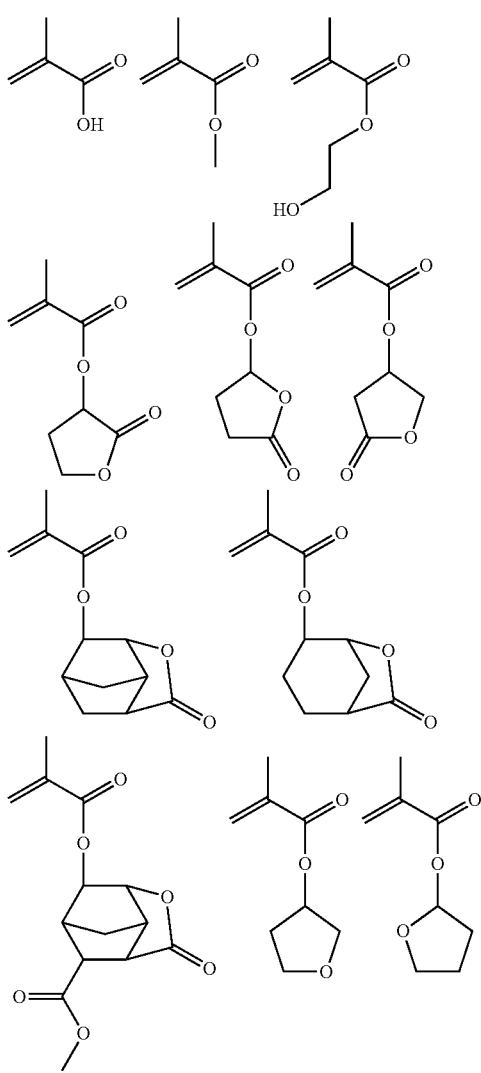

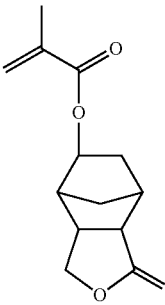

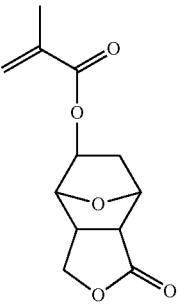

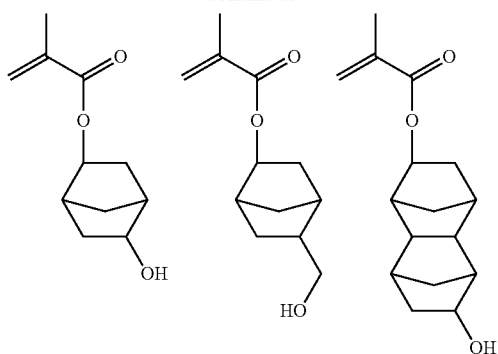
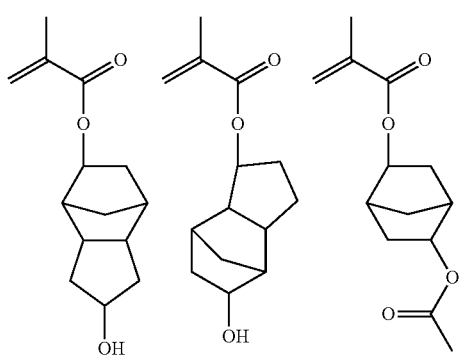
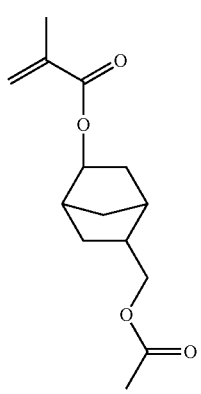
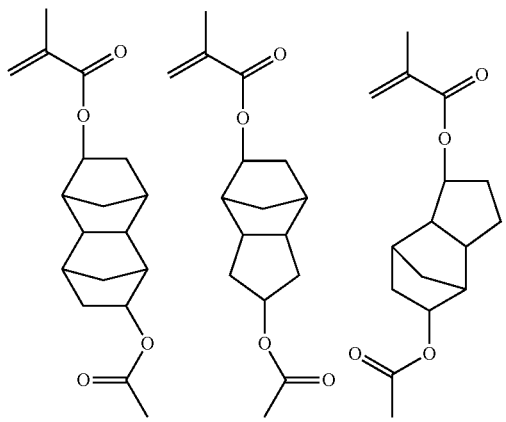
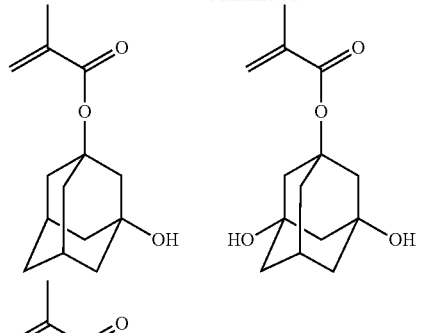
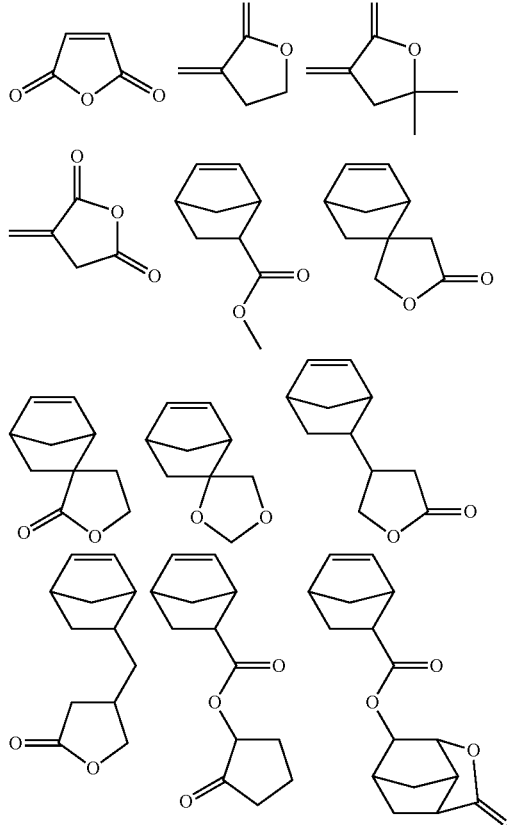

131
-continued
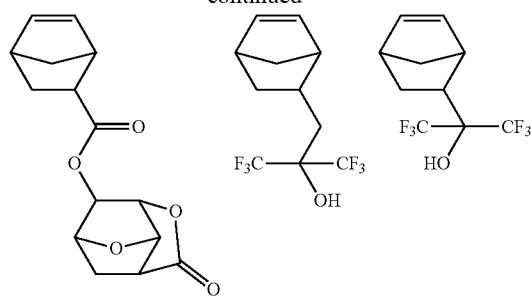
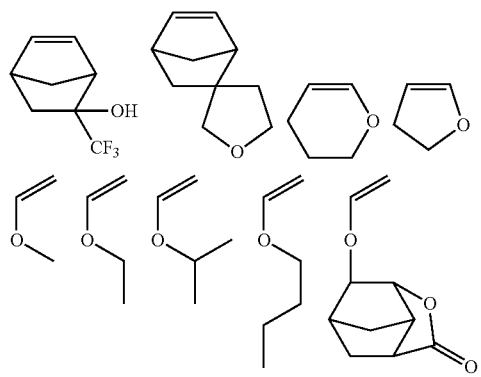
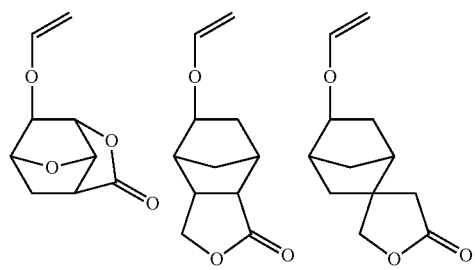
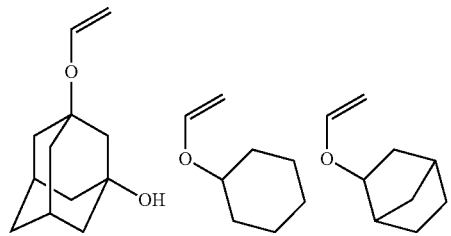
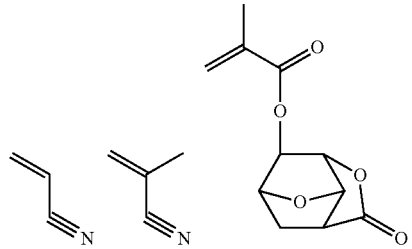
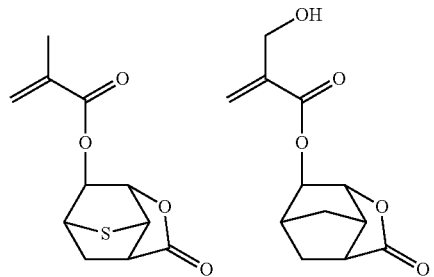
132
-continued
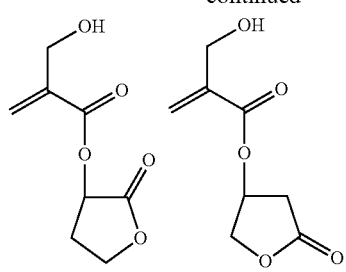
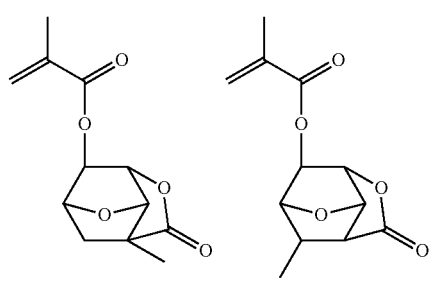
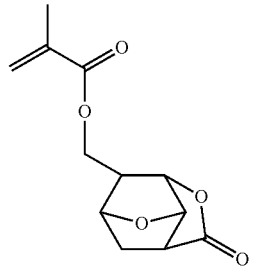
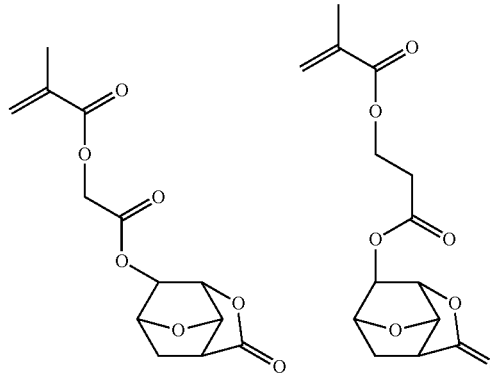
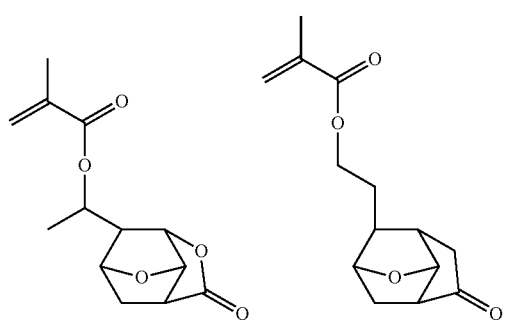

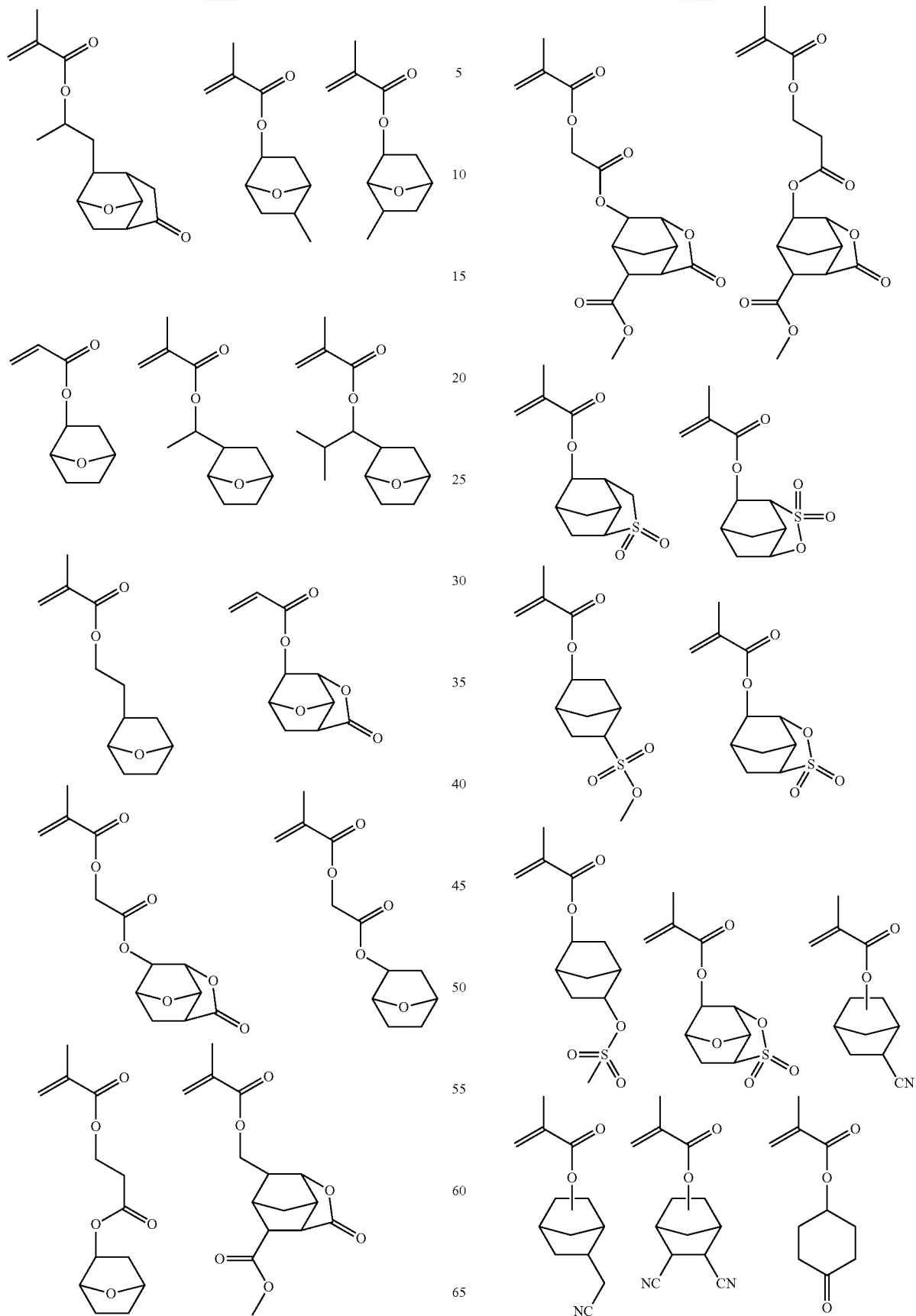

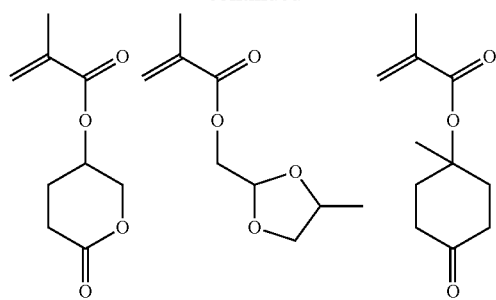
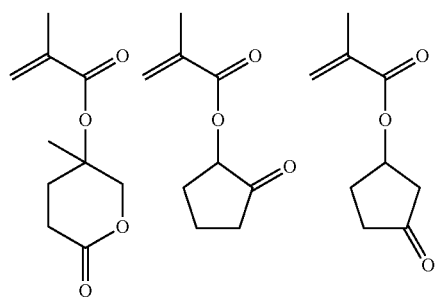
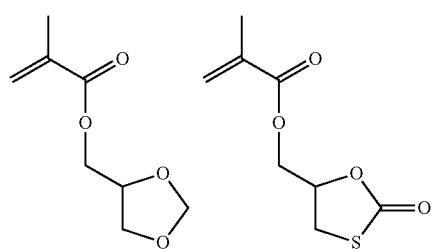
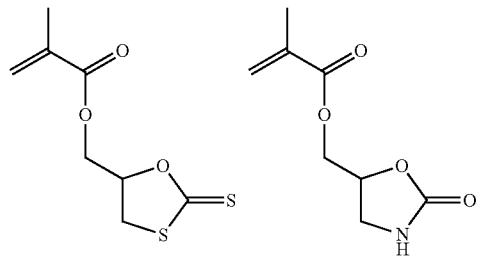
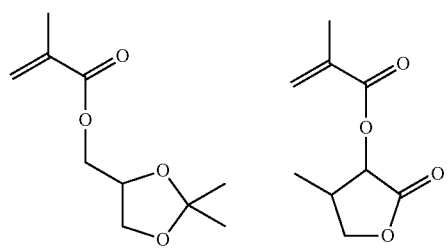
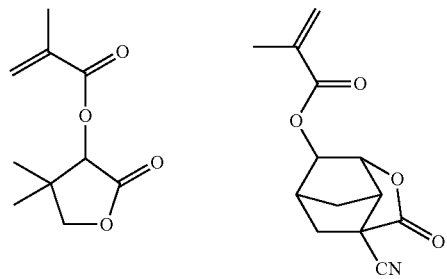
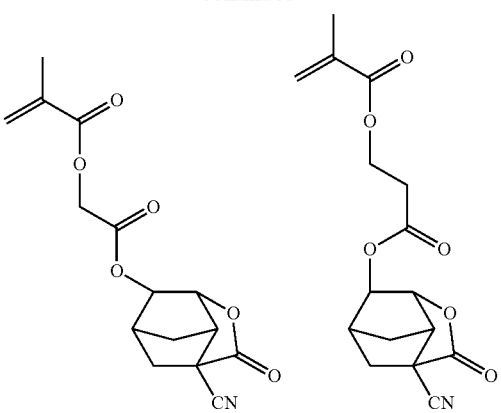
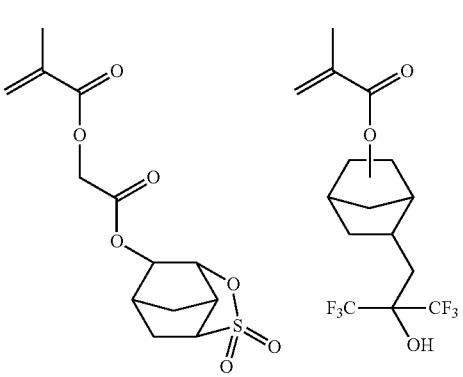
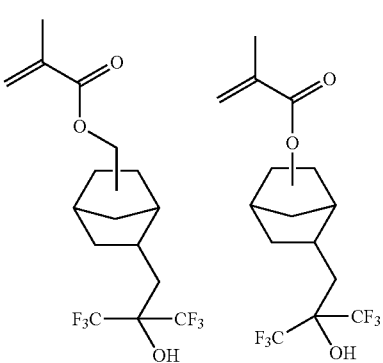
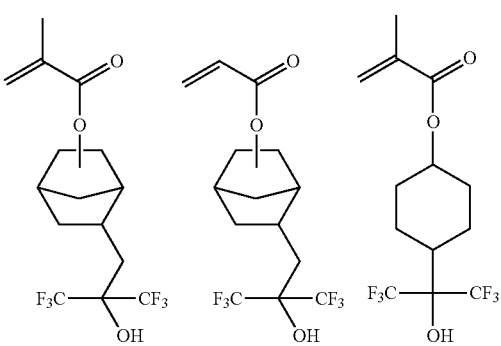

137
-continued
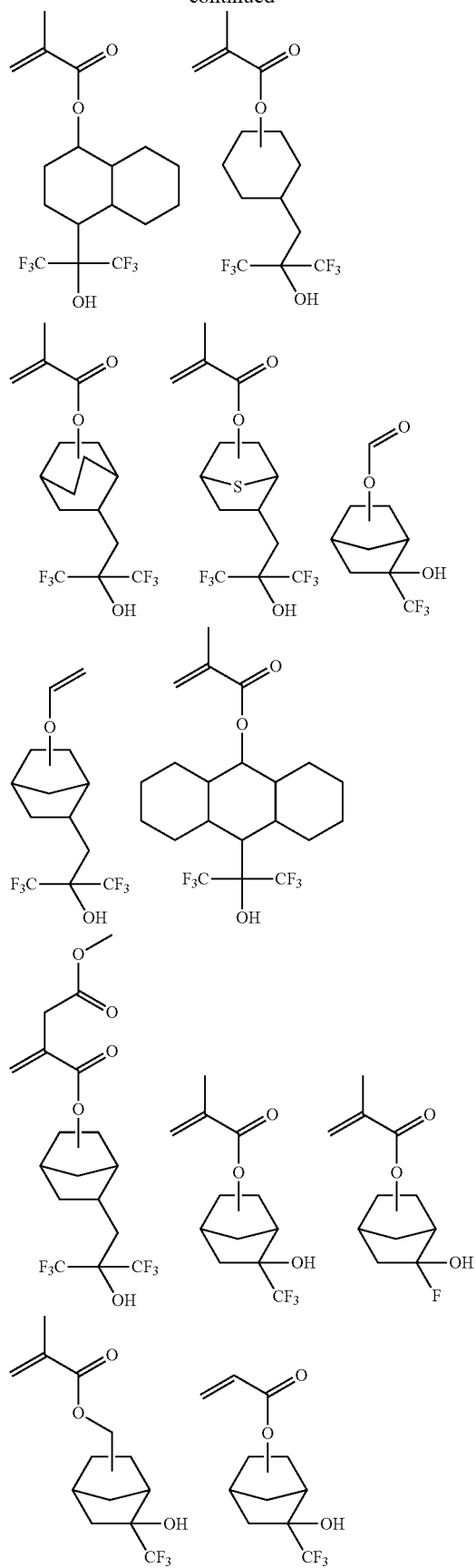
138
-continued
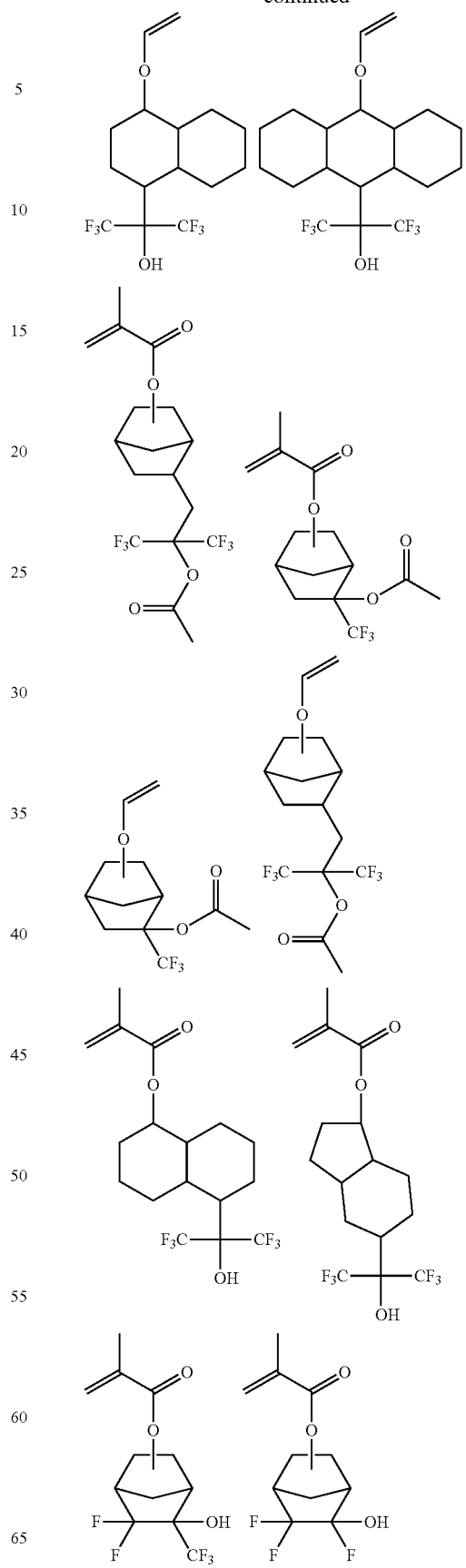

-continued
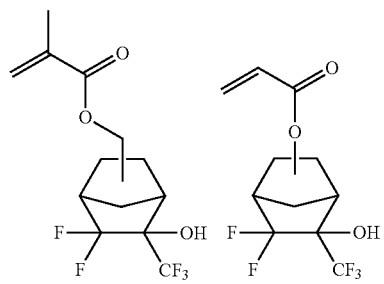
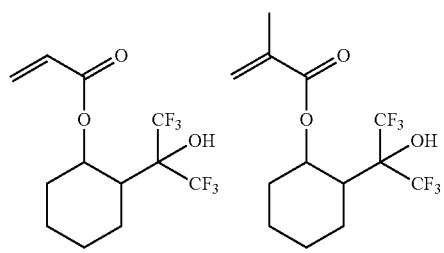
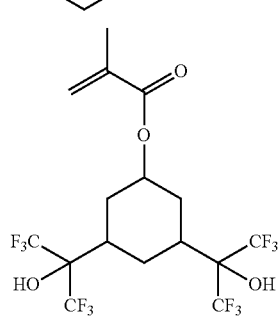
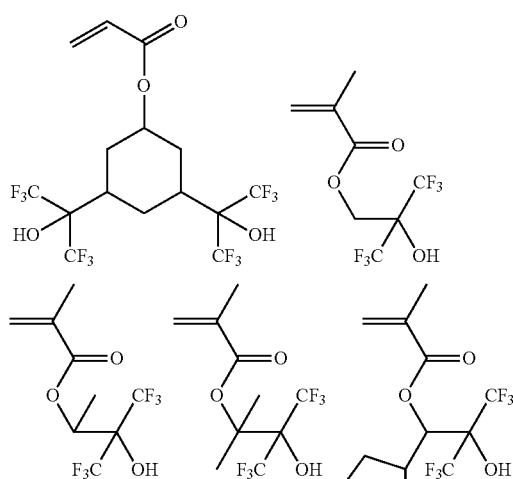
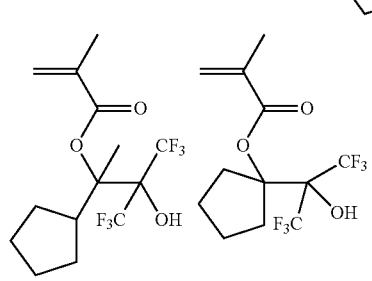
-continued
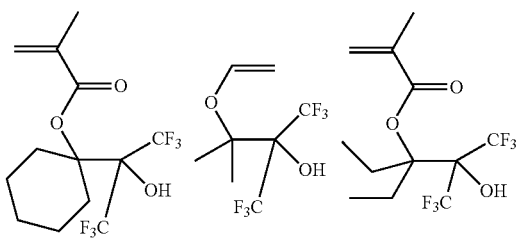
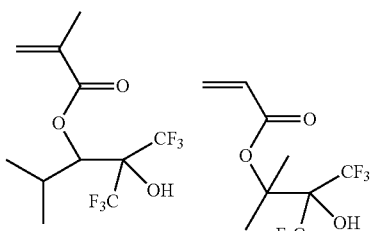
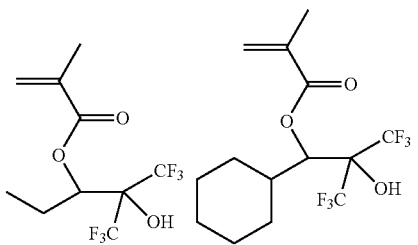
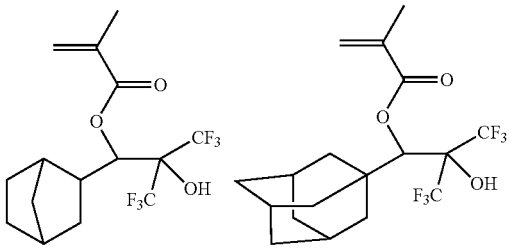
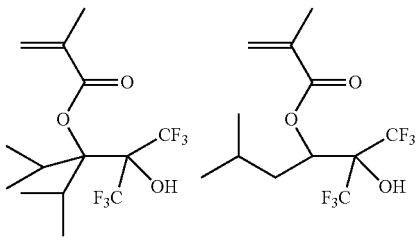
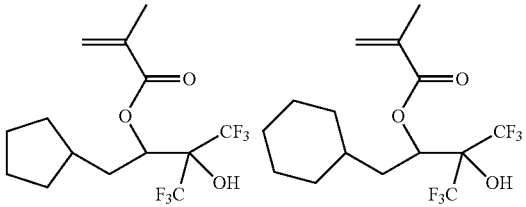
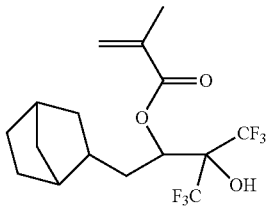

-continued
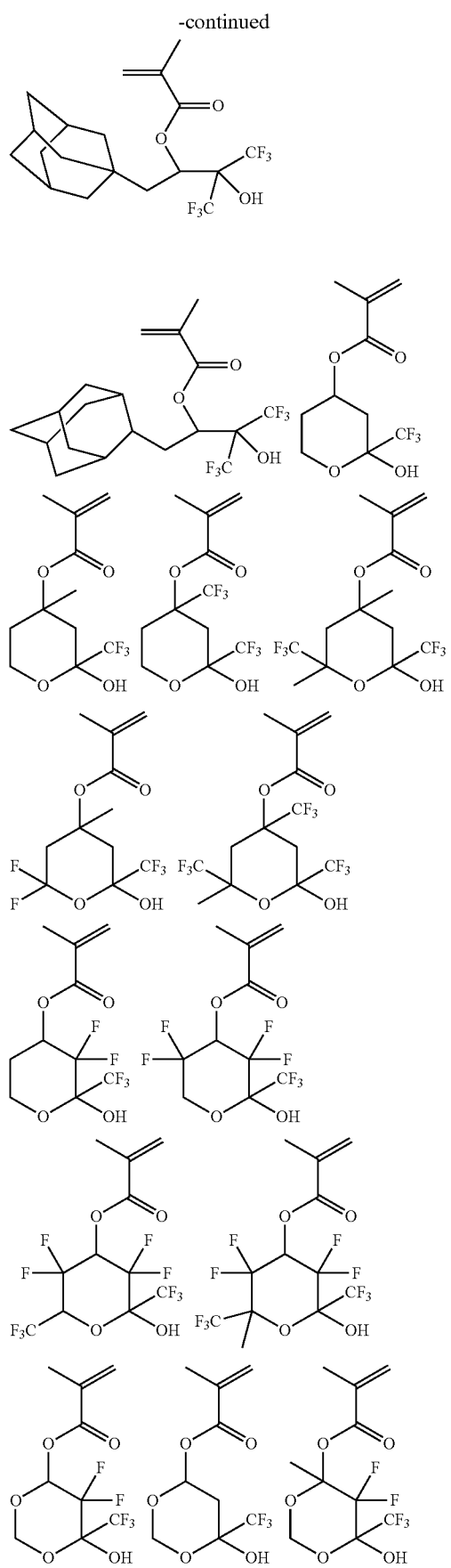
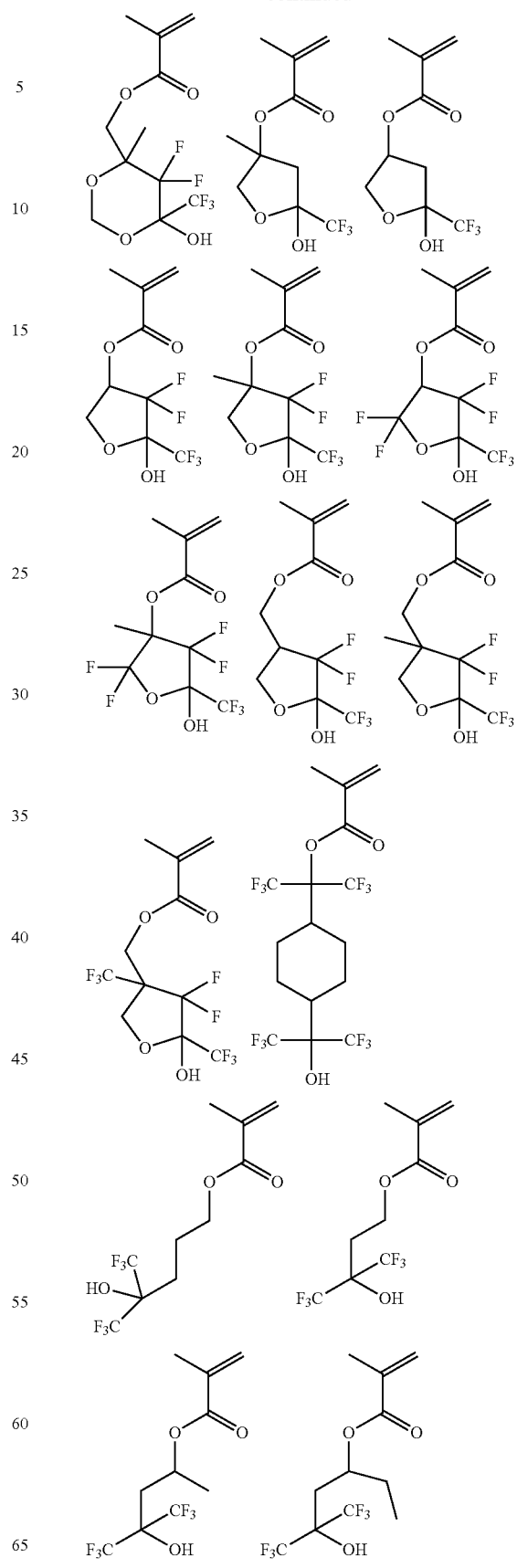

143
-continued
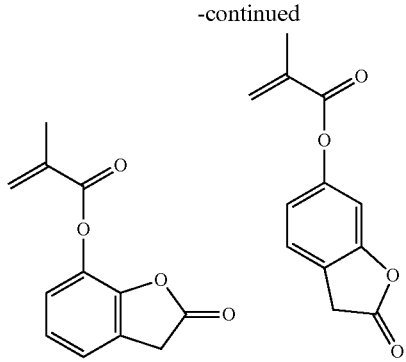
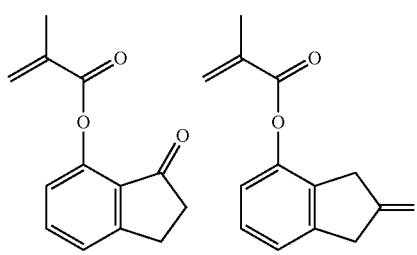
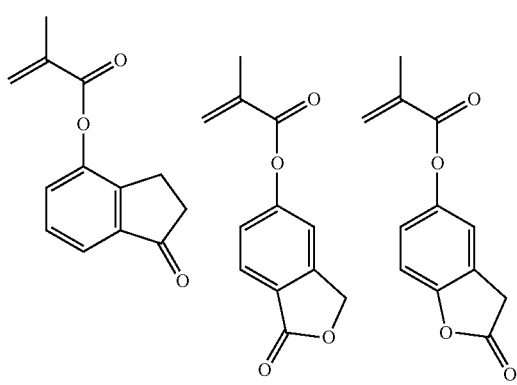
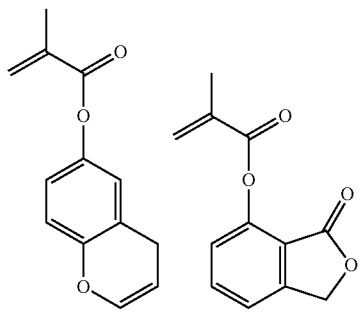
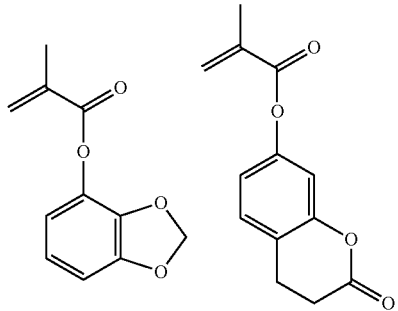
144
-continued
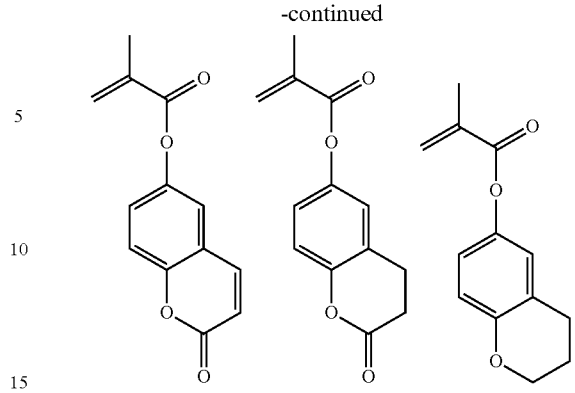
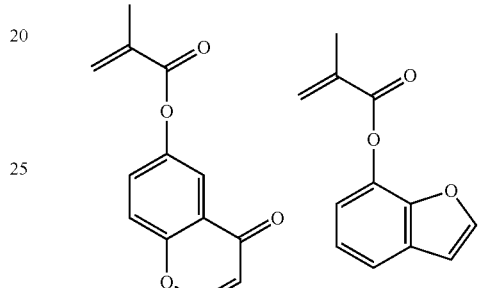
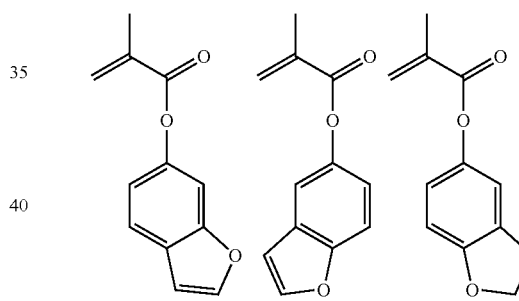
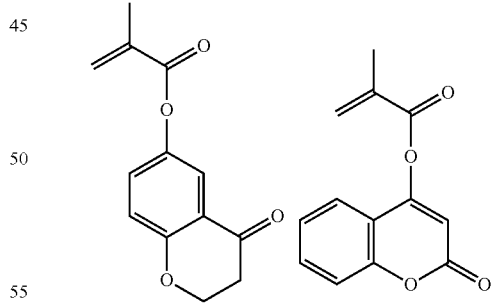
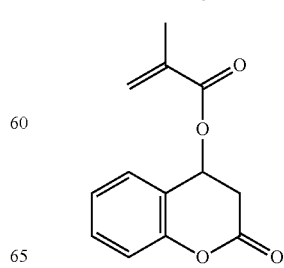

145
-continued
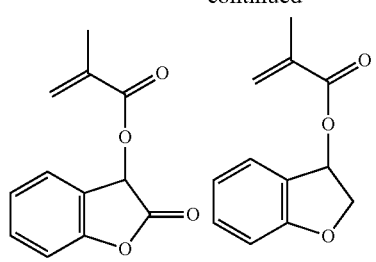
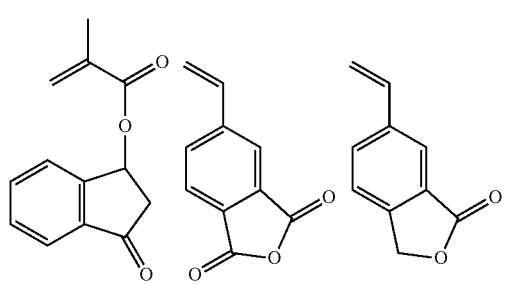
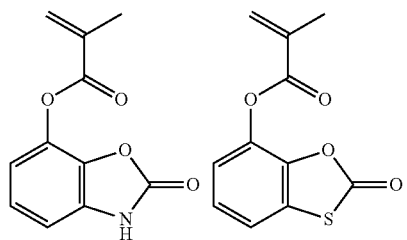
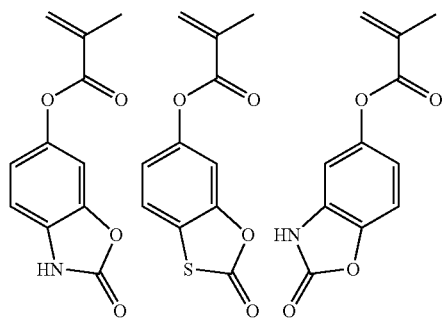
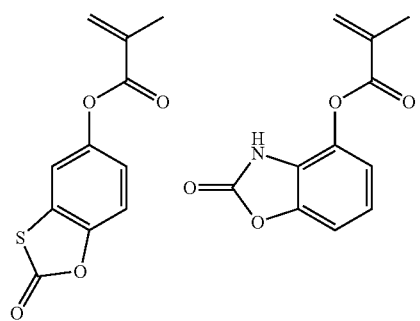
146
-continued
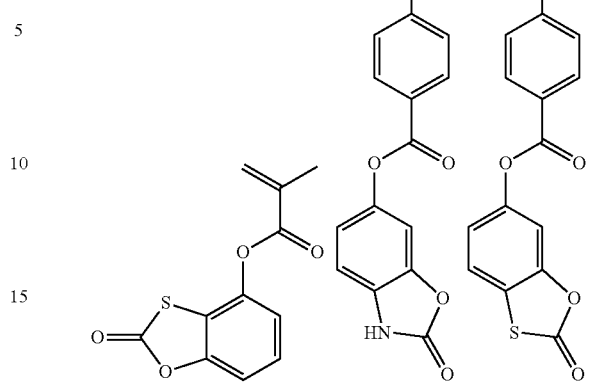
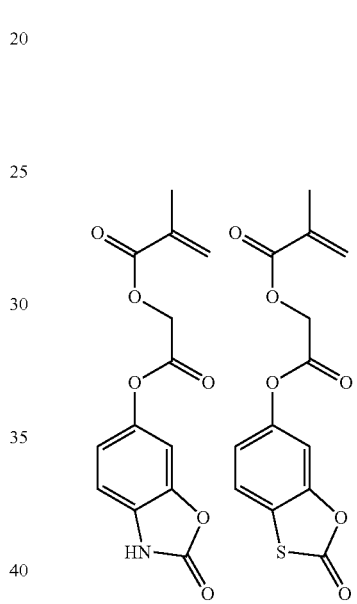
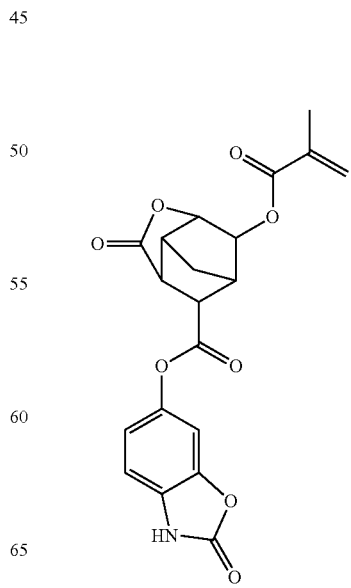

147
-continued

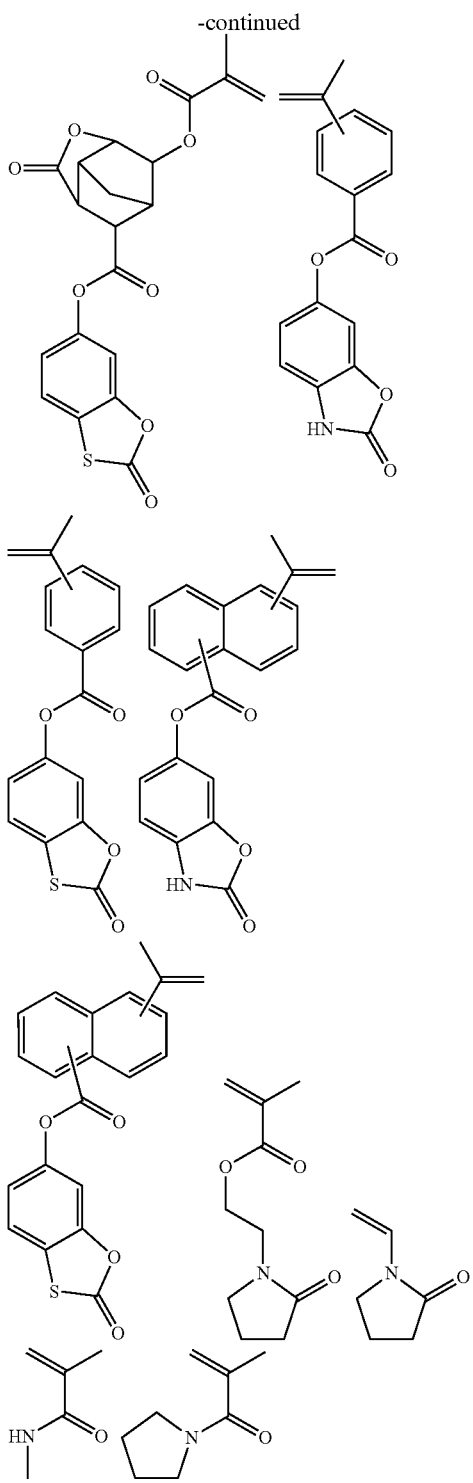

In the case of a hydroxyl-containing monomer, a corresponding monomer in which the hydroxyl group has been replaced by an acetal group which is susceptible to deprotection with acid, typically ethoxyethoxy, may be used, and polymerization be followed by deprotection with weak acid and water. Alternatively, the hydroxyl group may have been replaced by an acetyl, formyl or pivaloyl group, and polymerization be followed by alkaline hydrolysis.

Further, another monomer (e) may be copolymerized, for example, indene, benzofuran, benzothiophene, acenaphth-

148 ylene, chromone, coumarin, norbornadiene, and derivatives thereof. Examples are shown below.

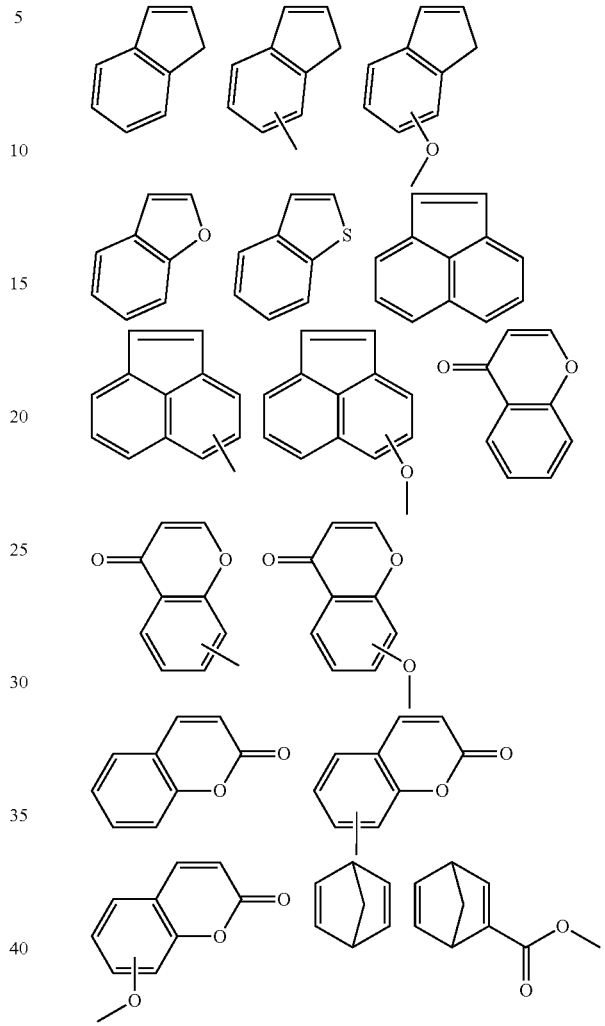

Examples of recurring units (f) other than the foregoing which can be copolymerized herein include styrene, vinylnaphthalene, vinylanthracene, vinylpyrene, and methyleneindane, but are not limited thereto.

In a copolymer having units (a1), (a2), (b1), (b2), (b3). (c), (d), (e), and (f) copolymerized therein, the copolymerization ratio may preferably fall in the range: $0 \leq a1 \leq 0.9$, $0 \leq a2 \leq 0.9$, $0 < a1+a2 < 1$, $0 \leq b1 \leq 0.5$, $0 \leq b2 \leq 0.5$, $0 \leq b3 \leq 0.5$, $0 \leq b1+b2+b3 \leq 0.5$, $0 \leq c \leq 0.9$, $0 \leq d \leq 0.9$, $0 \leq e \leq 0.9$, and $0 \leq f \leq 0.5$; more preferably $0 \leq a1 \leq 0.8$, $0 \leq a2 \leq 0.8$, $0.1 \leq a1+a2 \leq 0.8$, $0 \leq b1 \leq 0.4$, $0 \leq b2 \leq 0.4$, $0 \leq b3 \leq 0.4$, $0 \leq b1+b2+b3 \leq 0.4$, $0 \leq c \leq 0.8$, $0 \leq d \leq 0.8$, $0 \leq e \leq 0.8$, and $0 \leq f \leq 0.4$;
even more preferably $0 \leq a1 \leq 0.7$, $0 \leq a2 \leq 0.7$, $0.15 \leq a1+a2 \leq 0.7$, $0 \leq b1 \leq 0.3$, $0 \leq b2 \leq 0.3$, $0 \leq b3 \leq 0.3$, $0 \leq b1+b2+b3 \leq 0.3$, $0 \leq c \leq 0.7$, $0 \leq d \leq 0.7$, $0 \leq e \leq 0.7$, and $0 \leq f \leq 0.3$;
most preferably $0 \leq a1 \leq 0.7$, $0 \leq a2 \leq 0.7$, $0.15 \leq a1+a2 \leq 0.7$, $0 \leq b1 \leq 0.3$, $0 \leq b2 \leq 0.3$, $0 \leq b3 \leq 0.3$, $0.1 \leq b1+b2+b3 \leq 0.3$, $0 < c \leq 0.7$, $0 \leq d \leq 0.7$, $0 \leq e \leq 0.7$, and $0 \leq f \leq 0.3$; provided $a1+a2+b1+b2+b3+c+d+e+f=1$.

The polymer as used herein may be synthesized by any desired method, for example, by dissolving monomers corresponding to the respective units (a1), (a2), (b1), (b2), (b3), (c), (d), (e), and (f) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is to be copolymerized, one possible procedure is by carrying out polymerization using acetoxystyrene or acetoxyvinylnaphthalene instead of hydroxystyrene or hydroxyvinylnaphthalene, and effecting alkaline hydrolysis for deprotection of the acetoxy group for converting back to polyhydroxystyrene or hydroxypolyvinylnaphthalene. Suitable bases used for alkaline hydrolysis include ammonia water and triethylamine. The reaction conditions include a temperature of −20° C. to 100° C., preferably 0° C. to 60° C. and a time of 0.2 to 100 hours, preferably 0.5 to 20 hours.

The polymer used herein should preferably have a weight average molecular weight (Mw) in the range of 1,000 to 500,000, and more preferably 2,000 to 30,000, as measured in tetrahydrofuran solvent by GPC versus polystyrene standards. With a Mw of at least 1,000, the resist composition is fully heat resistant. A polymer with a Mw of up to 500,000 may be devoid of a loss of alkaline solubility or a footing phenomenon after pattern formation.

If a multi-component polymer has a broad molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

While the polymer is characterized by comprising, in copolymerized form, recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, and optionally acid generator-bearing recurring units (b1), (b2) or (b3), it is acceptable to use a blend of two or more such polymers which differ in compositional ratio, molecular weight or dispersity.

The polymer defined above is especially suited as a base resin in a positive resist composition. When a positive resist composition is prepared by using the relevant polymer as the base resin and combining it with suitable other components such as organic solvent, acid generator, dissolution inhibitor, basic compound, and surfactant, the resist composition has a very high sensitivity in that the polymer in the exposed region accelerates its dissolution rate in developer through catalytic reaction. The resist composition has many advantages including a high dissolution contrast, a high resolution, exposure latitude, process adaptability, a good pattern profile after exposure, high etch resistance, and minimized proximity bias due to controlled acid diffusion. Because of these advantages, the resist composition is fully viable in commercial processes and best suited as the micropatterning resist material for the fabrication of VLSIs.

Specifically, when an acid generator is added to formulate a chemically amplified positive resist composition capable of utilizing acid catalyzed reaction, a higher sensitivity is given and the aforementioned properties are further improved. When a dissolution inhibitor is added to the positive resist composition, the difference in dissolution rate between the exposed and unexposed regions is enhanced, with the resolution being further improved. When a basic compound is added, the rate of acid diffusion in the resist film can be suppressed, with the resolution being further improved. When a surfactant is added, the resist composition is further improved or controlled in coating operation.

In one embodiment, an acid generator is added to the resist composition in order that the composition function as a chemically amplified positive resist composition. Typical of the acid generator used herein is a photoacid generator (PAG) capable of generating an acid in response to actinic radiation or high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

Examples of the organic solvent used herein are described in JP-A 2008-111103, paragraphs [0144] to [0145], exemplary basic compounds or quenchers in paragraphs [0146]-[0164], and exemplary surfactants in paragraphs [0165]-[0166]. Examples of the dissolution inhibitor used herein are described in JP-A 2008-122932, paragraphs [0155]-[0178]. Also polymeric quenchers as described in JP-A 2008-239918 may be added. If necessary, acetylene alcohols may be added, for example, those described in JP-A 2008-122932, paragraphs [0179]-[0182].

Since the polymeric surfactant segregates at the surface of a resist film as coated, it is effective for rendering the resist pattern more rectangular. The polymeric quencher is effective for reducing a film loss and preventing the pattern from being rounded at the top when a protective topcoat for the immersion lithography is applied.

The metal-acid complex according to the invention is used an amount of 0.01 to 100 parts, preferably 0.1 to 50 parts by weight per 100 parts by weight of the polymer or base resin. The metal-acid complex may be used in combination with the amine quencher. Besides, a metal salt as described in JP-A 2013-25211 may also be added as the metal salt quencher.

When used, the acid generator is preferably added in an amount of 0.1 to 50 parts by weight per 100 parts by weight of the polymer or base resin. When used, the basic compound or quencher is preferably added in an amount of 0.01 to 20 parts, more preferably 0.02 to 15 parts by weight per 100 parts by weight of the base resin. When used, the dissolution inhibitor is preferably added in an amount of 0.5 to 50 parts, more preferably 1.0 to 30 parts by weight per 100 parts by weight of the base resin. When used, the surfactant is preferably added in an amount of 0.0001 to 10 parts, more preferably 0.001 to 5 parts by weight per 100 parts by weight of the base resin. When used, the organic solvent is preferably added in an amount of 100 to 10,000 parts, more preferably 200 to 8,000 parts by weight per 100 parts by weight of the base resin.

Process

Another embodiment of the invention is a pattern forming process comprising the steps of coating the resist composition defined above onto a substrate, baking the coating to form a resist film, exposing the resist film to high-energy radiation, and developing the exposed resist film with a developer.

The step of exposing the resist film to high-energy radiation may use EUV radiation having a wavelength of 3 to 15 nm or an accelerated electron beam, specifically an electron beam at an accelerating voltage of 1 to 150 keV.

In the resist film, the specific metal-acid complex is a conductive metal salt which serves as an antistatic agent effective for preventing the resist film from being charged during EB image writing. This eliminates a need for an antistatic film on the resist film. In addition, since the specific metal-acid complex has a strong absorption of EUV of wavelength 13.5 nm, the sensitivity of the resist is improved upon exposure to EUV by the mechanism that the outer shell electrons of the metal are excited, and the electrons transfer to the acid generator, whereby the efficiency of acid generation is enhanced.

Since the specific metal-acid complex does not undergo salt exchange with fluorosulfonic acid or fluorosulfonimidic acid generated from the acid generator, it does not function as a quencher. Thus the specific metal-acid complex may be added in a larger amount than the quencher, providing the advantages of increased absorption of EUV radiation and increased sensitivity.

When the resist composition, typically chemically amplified positive resist composition comprising the polymer of formula (1), the specific metal-acid complex, optionally an acid generator and a basic compound, in an organic solvent is used for the microfabrication of various integrated circuits, any well-known lithography processes may be applied.

For example, the resist composition is applied onto a substrate for integrated circuit fabrication or a processable layer thereon (e.g., Si, $SiO_2$, SiN, SiON, TiN, WSi, BPSG, SOG, or organic antireflective coating) or a substrate for mask circuit fabrication or a processable layer thereon (e.g., Cr, CrO, CrON, MoSi, or $SiO_2$) by any suitable technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes to form a resist film having a thickness of 0.1 to 2.0 µm.

Next the resist film is exposed imagewise to high-energy radiation selected from among UV, DUV, EB, x-ray, excimer laser, γ-ray, synchrotron radiation, or EUV (or soft x-ray) directly or through a mask having the desired pattern. The exposure is preferably carried out to provide a dose of 1 to 200 $mJ/cm^2$, preferably 10 to 100 $mJ/cm^2$, or 0.1 to 100 $\mu C/cm^2$, preferably 0.5 to 50 $\mu C/cm^2$. This is followed by baking (PEB) on a hot plate at 60 to 150° C. for 10 seconds to 30 minutes, preferably at 80 to 120° C. for 30 seconds to 20 minutes.

Finally, the exposed resist film is developed with a developer which is an aqueous alkaline solution, typically a 0.1 to 5%, preferably 2 to 3% by weight of tetramethylammonium hydroxide (TMAH), choline hydroxide, tetraethylammonium hydroxide (TEAH), tetrapropylammonium hydroxide (TPAH), tetrabutylammonium hydroxide (TBAH), benzyltrimethylammonium hydroxide or benzyltriethylammonium hydroxide. Development is carried out for 3 seconds to 3 minutes, preferably 5 seconds to 2 minutes by any conventional techniques such as dip, puddle and spray techniques. The exposed region of resist film is dissolved in the developer, but not the unexposed region. In this way, the desired positive pattern is formed on the substrate.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxylsobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of organic solvent development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexane, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

Of the variety of high-energy radiation, the resist composition is best suited in micropatterning with EB, EUV (or soft x-ray), x-ray, v-ray, or synchrotron radiation. Particularly when EUV radiation having a wavelength of 3 to 15 nm or an accelerated EB at an accelerating voltage of 1 to 150 keV, preferably up to 100 keV, especially a low voltage accelerated EB at an accelerating voltage of up to 50 key is used, a finer size pattern can be formed.

The specific metal-acid complex acts as follows. Upon EB or EUV exposure, the complex-forming metal selected from cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium generates secondary electrons, to which the acid generator is sensitive, indicating a higher sensitivity. If secondary electrons randomly diffuse in the resist film, the image is blurred. With this combined with diffusion of the acid generated from the acid generator, the image blur is exaggerated. The image blur invites an edge roughness increase. If secondary electrons diffuse in the thickness direction of the resist film, that is, perpendicular to the substrate, then the image blur is suppressed. When the substrate is electrically charged positive (+), secondary electrons move as if they were sucked into the substrate, that is, secondary electrons diffuse perpendicularly. Then the sensitivity can be improved while suppressing the image blur, and without degrading the edge roughness.

EXAMPLE

Examples are given below by way of illustration of the invention and not by way of limitation. The abbreviation "pbw" is parts by weight. For all polymers, Mw and Mn are determined by GPC versus polystyrene standards.

Synthesis Example

Various polymers (Polymers 1 to 5) for use in resist compositions were prepared by combining suitable monomers, effecting copolymerization reaction in tetrahydrofuran solvent, pouring into methanol for crystallization, repeatedly washing with hexane, isolation, and drying. The polymers were analyzed by $^1$H-NMR to determine their composition and by GPC to determine Mw and dispersity Mw/Mn.

Polymer 1

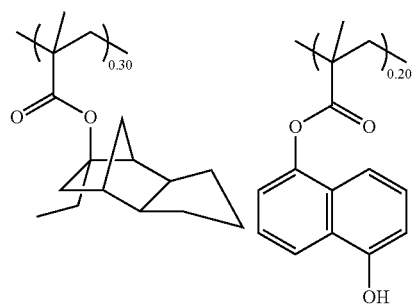

Polymer 1

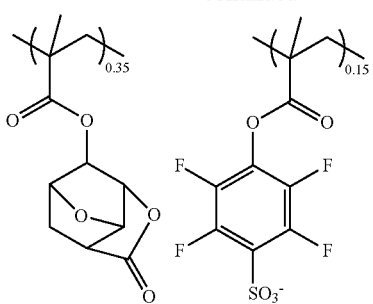

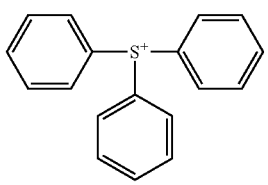

Mw = 7,900
Mw/Mn = 1.97

Polymer 2

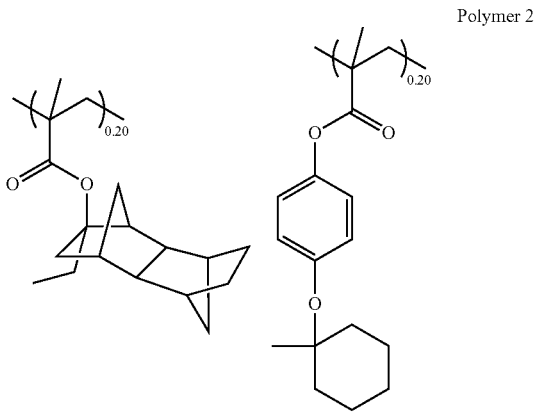

Polymer 2

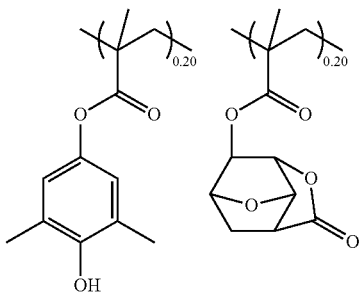

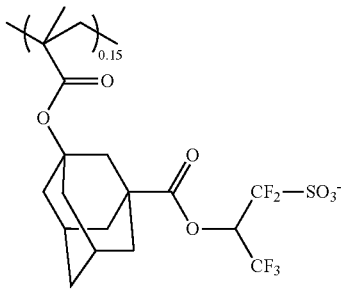

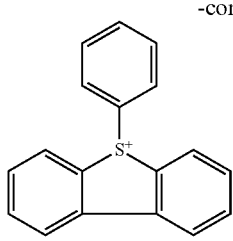
Mw = 9,000
Mw/Mn = 1.98
Polymer 3
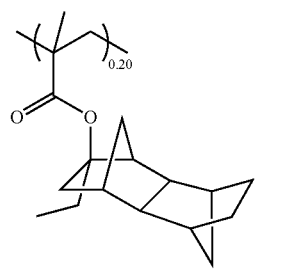
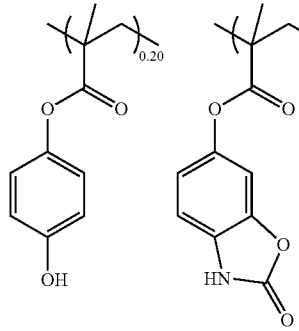
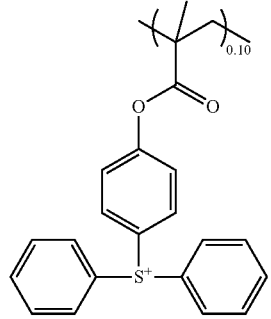
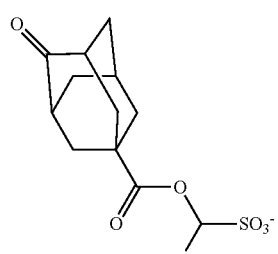
Mw = 7,100
Mw/Mn = 1.75
Polymer 4
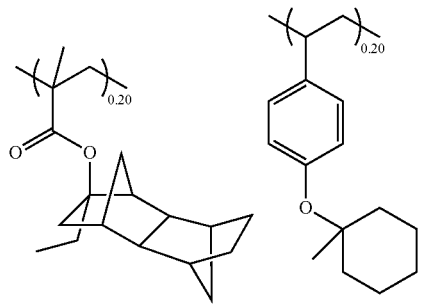
Polymer 4
Polymer 3
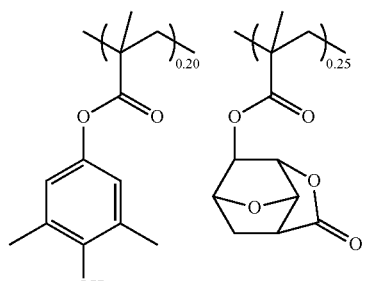
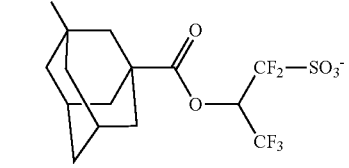
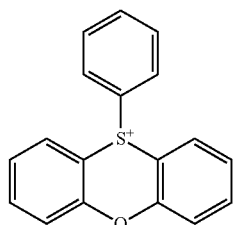
Mw = 9,000
Mw/Mn = 1.98
Polymer 5
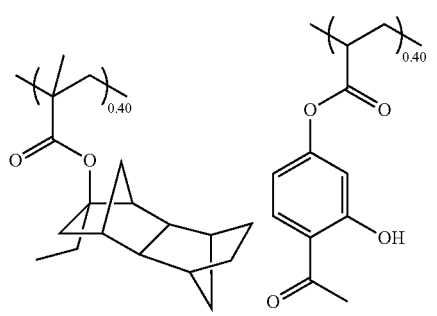
Polymer 5

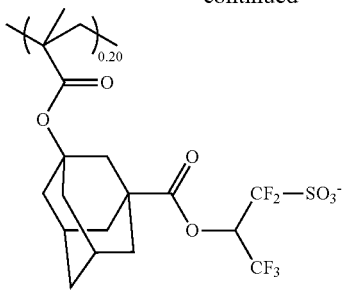

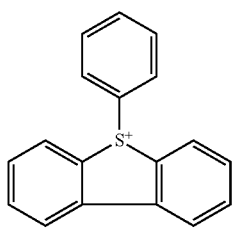

Mw = 8,400
Mw/Mn = 1.91

Positive resist compositions in solution form were prepared by dissolving a polymer (Polymers 1 to 5) and components in a solvent in accordance with the formulation of Tables 1 and 2 and filtering through a filter with a pore size of 0.2 μm. The solvent contained 100 ppm of surfactant FC-4430 (commercially available from 3M). The components in Tables 1 and 2 are identified below.

Metal Complexes: The Following Structural Formulae $(CF_3SO_3^-)_2Cu^{2+}$
copper(II) trifluoromethanesulfonate
$(CF_3SO_3^-)_3Ce^{3+}$
cerium(III) trifluoromethanesulfonate
$(CF_3SO_3^-)_3In^{3+}$
indium(III) trifluoromethanesulfonate
$(CF_3SO_3^-)_4Hf^{4+}$
hafnium(IV) trifluoromethanesulfonate
$(CF_3SO_3^-)_4Zr^{4+}$
zirconium(IV) trifluoromethanesulfonate
$(CF_3SO_3^-)_4Ti^{4+}$
titanium(IV) trifluoromethanesulfonate
$(CF_3SO_3^-)_3Sc^{3+}$
scandium(III) trifluoromethanesulfonate
$(CF_3SO_3^-)_3Y^{3+}$
yttrium(III) trifluoromethanesulfonate
$(CF_3SO_3^-)_3La^{3+}$
lanthanum(III) trifluoromethanesulfonate
$(CF_3SO_3^-)_3Nd^{3+}$
neodymium(III) trifluoromethanesulfonate
$(CF_3SO_3^-)_3Tm^{3+}$
thulium(III) trifluoromethanesulfonate
$CF_3SO_3^-Ag^+$
silver trifluoromethanesulfonate $(C_4F_9SO_3^-)_2Ba^{2+}$
barium(II) nonafluorobutanesulfonate $(CF_3SO_3^-)_2Ba^{2+}$
barium(II) trifluoromethanesulfonate $\left[F_3C-\underset{O_2}{S}-N-\underset{O_2}{S}-CF_3\right]_3^- In^{3+}$
indium(III) tris(trifluoromethanesulfonimide)

$\left[F_3C-\underset{O_2}{S}-N-\underset{O_2}{S}-CF_3\right]_2^- Ba^{2+}$
barium(II) bis(trifluoromethanesulfonimide)

$\left[F_3C-\underset{O_2}{S}-N-\underset{O_2}{S}-CF_3\right]_3^- Sc^{3+}$
scandium(III) tris(trifluoromethanesulfonimide)

$\left[F_3C-\underset{O_2}{S}-N-\underset{O_2}{S}-CF_3\right]_2^- Cu^{2+}$
copper(II) bis(trifluoromethanesulfonimide)

$\left[F_3C-\underset{O_2}{S}-N-\underset{O_2}{S}-CF_3\right]_4^- Hf^{4+}$
hafnium(IV) tetra(trifluoromethanesulfonimide)

$\left[F_3C-\underset{O_2}{S}-N-\underset{O_2}{S}-CF_3\right]_4^- Zr^{4+}$
zirconium(IV) tetra(trifluoromethanesulfonimide)

$\left[\begin{array}{c}O_2S-CF_2\\N\phantom{xxx}CF_2\\O_2S-CF_2\end{array}\right]_2^- Ba^{2+}$
barium(II) bis(1,1,2,2,3,3-hexafluoropropane-1,3-disulfonimide)

$\left[F_3C-\underset{O_2}{S}-\underset{\underset{CF_3}{\overset{SO_2}{|}}}{C}-\underset{O_2}{S}-CF_3\right]_2^- Ba^{2+}$
barium(II) bis(trifluoromethanesulfonimide)

$\left[\begin{array}{c}O_2S-CF_2\\N\phantom{xxx}CF_2\\O_2S-CF_2\end{array}\right]^- Rb^+$
rubidium(I) 1,1,2,2,3,3-hexafluoropropane-1,3-disulfonimide $\left[\begin{array}{c}O_2S-CF_2\\N\phantom{xxx}CF_2\\O_2S-CF_2\end{array}\right]_2^- Sr^{2+}$
strontium(II) bis(1,1,2,2,3,3-hexafluoropropane-1,3-disulfonimide)

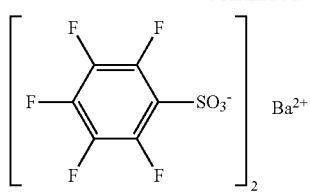

barium pentafluorobenzenesulfonate

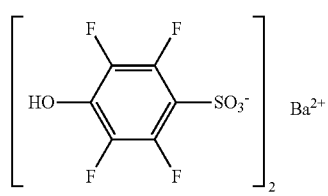

barium 4-hydroxy-2,3,5,6-tetrafluorobenzene-
sulfonate

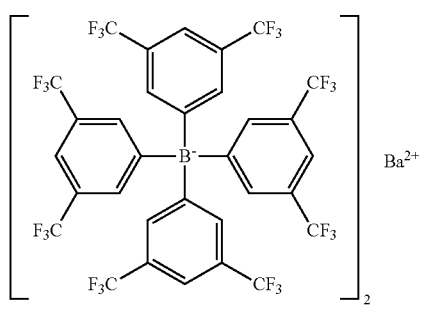

barium tetrakis[3,5-bis(trifluoromethyl)phenyl]-
borate

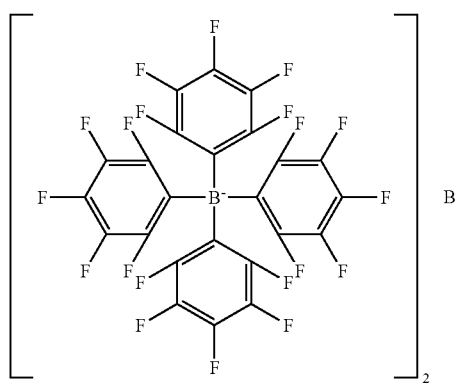

barium tetrakis(2,3,4,5,6-pentafluorophenyl)-
borate

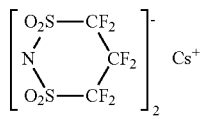

cesium (1,1,2,2,3,3-hexafluoropropane-
1,3-disulfonimide)

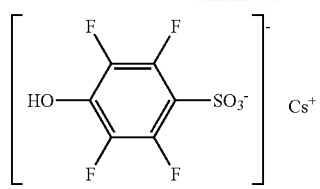

cesium 4-hydroxy-2,3,5,6-tetrafluorobenzene-
sulfonate

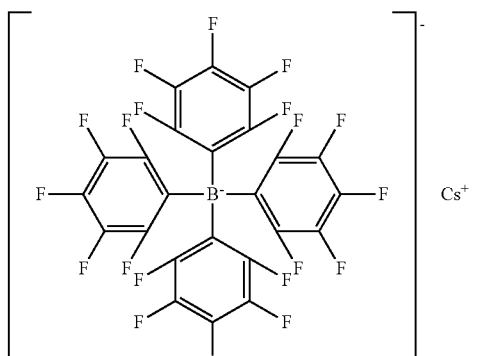

cesium tetrakis(pentafluorophenyl)borate

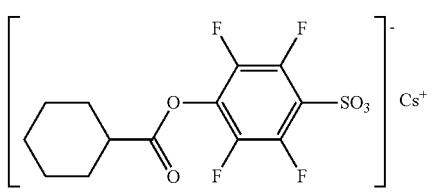

cesium 4-cyclohexylcarbonyloxy-2,3,5,6-
tetrafluorobenzenesulfonate

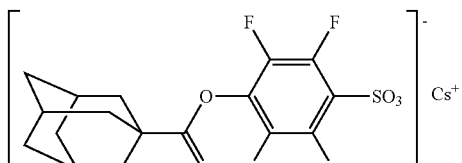

cesium 4-(1-adamantylcarbonyloxy)-2,3,5,6-
tetrafluorobenzenesulfonate

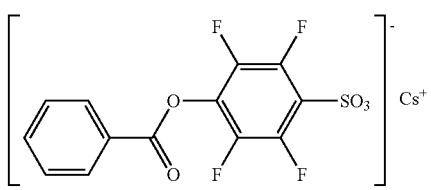

cesium 4-phenylcarbonyloxy-2,3,5,6-
tetrafluorobenzenesulfonate

-continued

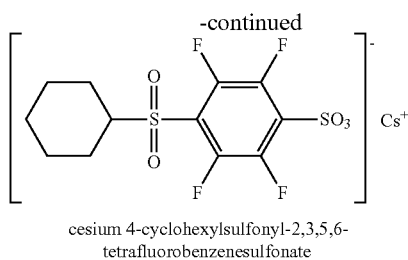

cesium 4-cyclohexylsulfonyl-2,3,5,6-tetrafluorobenzenesulfonate

Acid Generator: PAG1 of the Following Structural Formula

PAG 1

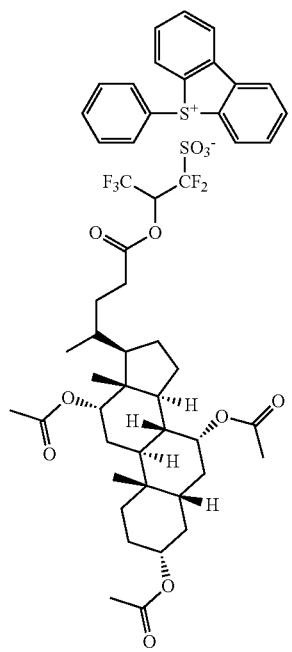

Basic Compound or Quencher:
Amine 1, Amine 2, hafnium carboxyethylacrylate, and cesium pivalate of the following structural formulae

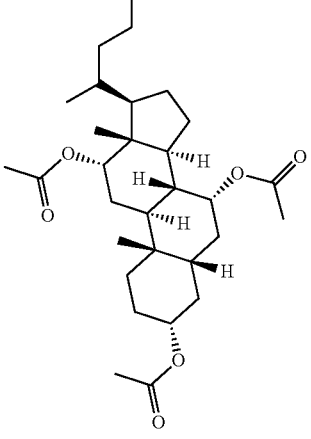

Amine 1

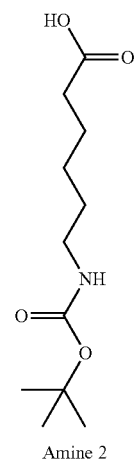

Amine 2

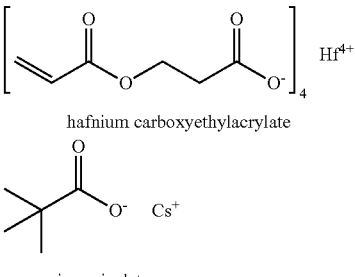

hafnium carboxyethylacrylate

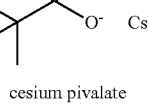

cesium pivalate

Organic Solvents:
PGMEA (propylene glycol monomethyl ether acetate)
CyH (cyclohexanone)
PGME (propylene glycol monomethyl ether)
GBL (γ-butyrolactone)

TABLE 1

|  |  | Polymer (pbw) | Metal complex (pbw) | Acid generator (pbw) | Quencher (pbw) | Organic solvent (pbw) |
| --- | --- | --- | --- | --- | --- | --- |
| Resist | 1 | Polymer 1 (100) | copper(II) trifluoromethanesulfonate (5.0) | — | Amine1 (1.3) | PGMEA (1,000) CyH (1,000) GBL (200) |
|  | 2 | Polymer 2 (100) | cerium(III) trifluoromethanesulfonate (6.8) | — | Amine1 (1.3) | PGMEA (1,000) CyH (1,000) GBL (200) |
|  | 3 | Polymer 3 (100) | indium(III) trifluoromethanesulfonate (4.0) | — | Amine1 (1.3) | PGMEA (1,000) CyH (1,000) GBL (200) |
|  | 4 | Polymer 4 (100) | hafnium(IV) trifluoromethanesulfonate (7.0) | — | Amine1 (1.3) | PGMEA (1,000) CyH (1,000) GBL (200) |
|  | 5 | Polymer 5 (100) | zirconium(IV) trifluoromethanesulfonate (6.0) | — | Amine1 (1.3) | PGMEA (1,000) CyH (1,000) GBL (200) |
|  | 6 | Polymer 1 (100) | titanium(IV) trifluoromethanesulfonate (7.0) | — | Amine2 (0.5) | PGMEA (1,000) CyH (1,000) GBL (200) |

TABLE 1-continued

| | | Polymer (pbw) | Metal complex (pbw) | Acid generator (pbw) | Quencher (pbw) | Organic solvent (pbw) |
|---|---|---|---|---|---|---|
| | 7 | Polymer 1 (100) | scandium(III) trifluoromethanesulfonate (10.1) | — | Amine1 (1.3) | PGMEA (1,000) CyH (1,000) GBL (200) |
| | 8 | Polymer 1 (100) | yttrium(III) trifluoromethanesulfonate (11.2) | — | Amine1 (1.3) | PGMEA (1,000) CyH (1,000) GBL (200) |
| | 9 | Polymer 1 (100) | lanthanum(III) trifluoromethanesulfonate (10.2) | — | Amine1 (1.3) | PGMEA (1,000) CyH (1,000) GBL (200) |
| | 10 | Polymer 1 (100) | neodymium(III) trifluoromethanesulfonate (10.3) | — | Amine1 (1.3) | PGMEA (1,000) CyH (1,000) GBL (200) |
| | 11 | Polymer 1 (100) | thulium(III) trifluoromethanesulfonate (10.2) | — | Amine1 (1.3) | PGMEA (1,000) CyH (1,000) GBL (200) |
| | 12 | Polymer 1 (100) | silver trifluoromethanesulfonate (1.2) | — | Amine1 (1.3) | PGMEA (1,000) CyH (1,000) GBL (200) |
| | 13 | Polymer 1 (100) | indium(III) tris(trifluoromethanesulfonimide) (12.2) | — | Amine1 (1.3) | PGMEA (1,000) CyH (1,000) GBL (200) |
| | 14 | Polymer 1 (100) | barium(II) bis(trifluoromethanesulfonimide) (14.2) | — | Amine1 (1.3) | PGMEA (1,000) CyH (1,000) GBL (200) |
| | 15 | Polymer 1 (100) | scandium(III) tris(trifluoromethanesulfonimide) (15.2) | — | Amine1 (1.3) | PGMEA (1,000) CyH (1,000) GBL (200) |
| | 16 | Polymer 1 (100) | copper(II) bis(trifluoromethanesulfonimide) (8.5) | — | Amine1 (1.3) | PGMEA (1,000) CyH (1,000) GBL (200) |
| | 17 | Polymer 1 (100) | hafnium(IV) tetra(trifluoromethanesulfonimide) (7.8) | — | Amine1 (1.3) | PGMEA (1,000) CyH (1,000) GBL (200) |
| | 18 | Polymer 1 (100) | zirconium(IV) tetra(trifluoromethanesulfonimide) (8.6) | — | Amine1 (1.3) | PGMEA (1,000) CyH (1,000) PGME (300) |
| | 19 | Polymer 1 (100) | zirconium(IV) tetra(trifluoromethanesulfonimide) (8.6) | — | hafnium carboxyethyl-acrylate (1.0) | PGMEA (1,000) CyH (1,000) GBL (200) |
| | 20 | Polymer 1 (100) | zirconium(IV) tetra(trifluoromethanesulfonimide) (8.6) | PAG1 (5.5) | cesium pivalate (0.8) | PGMEA (1,000) CyH (1,000) GBL (200) |

TABLE 2

| | | Polymer (pbw) | Metal complex (pbw) | Acid generator (pbw) | Quencher (pbw) | Organic solvent (pbw) |
|---|---|---|---|---|---|---|
| Resist | 21 | Polymer 1 (100) | rubidium(I) 1,1,2,2,3,3-hexafluoropropane-1,3-disulfonimide (8.6) | PAG1 (5.5) | Amine1 (1.3) | PGMEA (1,000) CyH (1,000) GBL (200) |
| | 22 | Polymer 1 (100) | strontium(II) bis(1,1,2,2,3,3-hexafluoropropane-1,3-disulfonimide) (8.6) | PAG1 (5.5) | Amine1 (1.3) | PGMEA (1,000) CyH (1,000) GBL (200) |
| | 23 | Polymer 1 (100) | barium(II) nonafluorobutanesulfonate (6.0) | — | Amine1 (1.3) | PGMEA (1,000) CyH (1,000) GBL (200) |
| | 24 | Polymer 1 (100) | barium(II) trifluoromethanesulfonate (3.2) | — | Amine1 (1.3) | PGMEA (1,000) CyH (1,000) GBL (200) |
| | 25 | Polymer 1 (100) | barium(II) bis(1,1,2,2,3,3-hexafluoropropane-1,3-disulfonimide) (6.5) | — | Amine1 (1.3) | PGMEA (1,000) CyH (1,000) GBL (200) |
| | 26 | Polymer 1 (100) | barium(II) bis(trifluoromethanesulfonemethide) (7.0) | — | Amine1 (1.3) | PGMEA (1,000) CyH (1,000) GBL (200) |
| | 27 | Polymer 1 (100) | barium pentafluorobenzenesulfonate (6.5) | — | Amine1 (1.3) | PGMEA (1,000) CyH (1,000) GBL (200) |

TABLE 2-continued

| | | Polymer (pbw) | Metal complex (pbw) | Acid generator (pbw) | Quencher (pbw) | Organic solvent (pbw) |
|---|---|---|---|---|---|---|
| | 28 | Polymer 1 (100) | barium 4-hydroxy-2,3,5,6-tetrafluorobenzenesulfonate (7.0) | — | Amine1 (1.3) | PGMEA (1,000) CyH (1,000) GBL (200) |
| | 29 | Polymer 1 (100) | barium tetrakis[3,5-bis(trifluoromethyl)phenyl]borate (9.5) | — | Amine1 (1.3) | PGMEA (1,000) CyH (1,000) GBL (200) |
| | 30 | Polymer 1 (100) | barium tetrakis(2,3,4,5,6-pentafluorophenyl)borate (10.0) | — | Amine1 (1.3) | PGMEA (1,000) CyH (1,000) GBL (200) |
| | 31 | Polymer 1 (100) | cesium (1,1,2,2,3,3-hexafluoropropane-1,3-disulfonimide) (5.0) | — | cesium pivalate (0.8) | PGMEA (1,000) CyH (1,000) GBL (200) |
| | 32 | Polymer 1 (100) | cesium 4-hydroxy-2,3,5,6-tetrafluorobenzenesulfonate (6.8) | — | cesium pivalate (0.8) | PGMEA (1,000) CyH (1,000) GBL (200) |
| | 33 | Polymer 1 (100) | cesium tetrakis(pentafluorophenyl)borate (10.0) | — | Amine1 (1.3) | PGMEA (1,000) CyH (1,000) GBL (200) |
| | 34 | Polymer 1 (100) | cesium 4-cyclohexylcarbonyloxy-2,3,5,6-tetrafluorobenzenesulfonate (6.0) | — | Amine1 (1.3) | PGMEA (1,000) CyH (1,000) GBL (200) |
| | 35 | Polymer 1 (100) | cesium 4-(1-adamentylcarbonyloxy)-2,3,5,6-tetrafluorobenzenesulfonate (8.0) | — | Amine1 (1.3) | PGMEA (1,000) CyH (1,000) GBL (200) |
| | 36 | Polymer 1 (100) | cesium 4-phenylcarbonyloxy-2,3,5,6-tetrafluorobezenesulfonate (6.0) | — | Amine1 (1.3) | PGMEA (1,000) CyH (1,000) GBL (200) |
| | 37 | Polymer 1 (100) | cesium 4-cyclohexylsulfonyl-2,3,5,6-tetrafluorobenzenesulfonate (6.0) | — | Amine1 (1.3) | PGMEA (1,000) CyH (1,000) GBL (200) |
| Comparative Resist | 1 | Polymer 1 (100) | — | — | Amine1 (1.3) | PGMEA (1,000) CyH (1,000) GBL (200) |
| | 2 | Polymer 1 (100) | — | — | Amine1 (0.6) | PGMEA (1,000) CyH (1,000) GBL (200) |
| | 3 | Polymer 1 (100) | — | — | cesium pivalate (1.2) | PGMEA (1,000) CyH (1,000) GBL (200) |

Examples 1 to 37 & Comparative Examples 1 to 3

EB Writing Test

Using a coater/developer system Clean Track Mark 5 (Tokyo Electron Ltd.), the positive resist composition was spin coated onto a silicon substrate (diameter 6 inches, vapor primed with hexamethyldisilazane (HMDS)) and pre-baked on a hot plate at 110° C. for 60 seconds to form a resist film of 70 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the resist film was baked (PEB) on a hot plate at the temperature shown in Tables 3 and 4 for 60 seconds and puddle developed in a 2.38 wt % tetramethylammonium hydroxide (TMAH) aqueous solution for 30 seconds to form a positive pattern.

Resolution is a minimum size at the exposure dose (sensitivity) that provides a 1:1 resolution of a 100-nm line-and-space pattern. The 100-nm line-and-space pattern was measured for line width roughness (LWR) under SEM.

The resist composition is shown in Tables 3 and 4 along with the sensitivity and LWR of EB lithography.

TABLE 3

| | Resist | PEB temp. (° C.) | Sensitivity (µC/cm$^2$) | LWR (nm) |
|---|---|---|---|---|
| Resist | 1 | Resist 1 | 85 | 23.5 | 6.9 |
| | 2 | Resist 2 | 80 | 28.5 | 5.3 |
| | 3 | Resist 3 | 85 | 22.0 | 6.1 |
| | 4 | Resist 4 | 80 | 24.0 | 5.5 |
| | 5 | Resist 5 | 80 | 22.0 | 6.1 |
| | 6 | Resist 6 | 85 | 22.0 | 5.2 |
| | 7 | Resist 7 | 85 | 22.0 | 6.1 |
| | 8 | Resist 8 | 85 | 25.0 | 5.7 |
| | 9 | Resist 9 | 85 | 26.0 | 6.5 |
| | 10 | Resist 10 | 85 | 25.0 | 6.2 |
| | 11 | Resist 11 | 85 | 23.0 | 5.9 |
| | 12 | Resist 12 | 85 | 24.0 | 5.6 |
| | 13 | Resist 13 | 85 | 22.0 | 6.0 |
| | 14 | Resist 14 | 85 | 26.0 | 6.5 |
| | 15 | Resist 15 | 85 | 25.0 | 6.1 |
| | 16 | Resist 16 | 85 | 24.0 | 6.4 |
| | 17 | Resist 17 | 85 | 24.0 | 5.4 |
| | 18 | Resist 18 | 85 | 21.0 | 5.9 |
| | 19 | Resist 19 | 85 | 22.0 | 5.8 |
| | 20 | Resist 20 | 80 | 26.0 | 4.9 |

TABLE 4

| | | Resist | PEB temp. (° C.) | Sensitivity (μC/cm²) | LWR (nm) |
|---|---|---|---|---|---|
| Example | 21 | Resist 21 | 85 | 24.0 | 5.9 |
| | 22 | Resist 22 | 85 | 26.0 | 5.8 |
| | 23 | Resist 23 | 75 | 22.0 | 4.8 |
| | 24 | Resist 24 | 75 | 23.5 | 4.9 |
| | 25 | Resist 25 | 80 | 19.0 | 4.4 |
| | 26 | Resist 26 | 80 | 18.0 | 4.1 |
| | 27 | Resist 27 | 80 | 27.0 | 3.9 |
| | 28 | Resist 28 | 80 | 28.0 | 3.8 |
| | 29 | Resist 29 | 80 | 24.0 | 3.7 |
| | 30 | Resist 30 | 80 | 22.0 | 3.6 |
| | 31 | Resist 31 | 80 | 23.0 | 3.4 |
| | 32 | Resist 32 | 80 | 22.0 | 3.4 |
| | 33 | Resist 33 | 80 | 24.0 | 3.6 |
| | 34 | Resist 34 | 80 | 25.0 | 3.6 |
| | 35 | Resist 35 | 80 | 23.0 | 3.3 |
| | 36 | Resist 36 | 80 | 25.0 | 3.2 |
| | 37 | Resist 37 | 80 | 23.0 | 3.1 |
| Comparative Example | 1 | Comparative Resist 1 | 85 | 35.5 | 7.2 |
| | 2 | Comparative Resist 2 | 85 | 21.5 | 9.2 |
| | 3 | Comparative Resist 3 | 85 | 36.5 | 7.2 |

It is evident from Tables 3 and 4 that the resist compositions of Examples have a high sensitivity and reduced LWR. The resist compositions of Comparative Examples have sensitivity and LWR values which are inferior to those of Examples.

It is demonstrated that the resist composition comprising a polymer comprising acid labile group-substituted recurring units and preferably acid generator-bearing recurring units, to which a specific metal-acid complex is added, exhibits a high resolution, a high sensitivity, and a minimal LWR. The resist composition is best suited as the resist material for VLSIs and patterning material for masks.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2015-023149 and 2015-159402 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator, said resist composition further comprising a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of a $C_1$-$C_4$ fluoroalkylsulfonic acid, $C_6$-$C_{12}$ arylsulfonic acid having at least one fluorine atom which may be substituted with hydroxy group, $C_1$-$C_{12}$ alkoxy group or acyloxy group, or sulfonyl group, tetraphenylboric acid having at least one fluorine atom, $C_1$-$C_4$ fluoroalkylsulfonimidic acid, and $C_1$-$C_4$ fluoroalkylsulfonemethide acid.

2. The resist composition of claim 1 wherein the polymer comprising recurring units of acid labile group-substituted (meth)acrylic acid, styrenecarboxylic acid or vinylnaphthalenecarboxylic acid and/or recurring units having an acid labile group-substituted phenolic hydroxyl group has recurring units (a1) and/or (a2), as represented by the general formula (1):

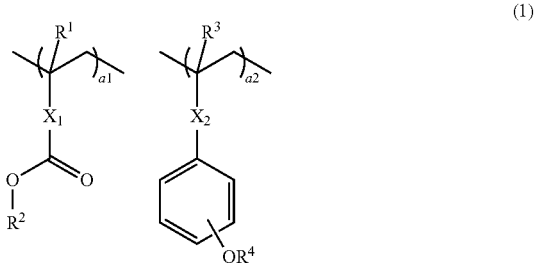

(1)

wherein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety and naphthylene moiety, a phenylene group, or a naphthylene group, $X_2$ is a single bond or an ester or amide group, a1 and a2 are numbers in the range: $0 \leq a1 \leq 0.9$, $0 \leq a2 \leq 0.9$, and $0 < a1+a2 < 1$.

3. The resist composition of claim 1 which is a chemically amplified positive resist composition.

4. The resist composition of claim 1, further comprising at least one component selected from among an organic solvent, a dissolution inhibitor, an acid generator, a basic compound, and a surfactant.

5. A pattern forming process comprising the steps of coating the resist composition of claim 1 onto a substrate, baking, exposing the resulting resist film to high-energy radiation, and developing with a developer.

6. The process of claim 5 wherein the high-energy radiation is EUV radiation having a wavelength of 3 to 15 nm.

7. The process of claim 5 wherein the high-energy radiation is an electron beam at an accelerating voltage of 1 to 150 keV.

8. A resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator,
said resist composition further comprising a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of an alkylsulfonic acid, arylsulfonic acid, alkylsulfonimidic acid, alkylsulfonemethide acid, and tetraphenylboric acid each of which has at least one fluorine atom;
wherein the polymer comprising recurring units of acid labile group-substituted (meth)acrylic acid, styrenecarboxylic acid or vinylnaphthalenecarboxylic acid and/or recurring units having an acid labile group-substituted phenolic hydroxyl group has recurring units (a1) and/or (a2), as represented by the general formula (1):

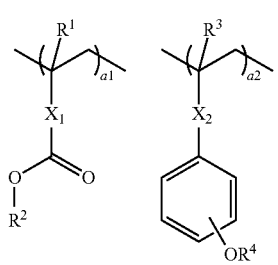

wherein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety and naphthylene moiety, a phenylene group, or a naphthylene group, $X_2$ is a single bond or an ester or amide group, a1 and a2 are numbers in the range: $0 \leq a1 \leq 0.9$, $0 \leq a2 \leq 0.9$, and $0 < a1+a2 < 1$; and
wherein in addition to the recurring units (a1) and (a2), the polymer comprises recurring units (b1), (b2) or (b3) of a sulfonium salt having the general formula (2):

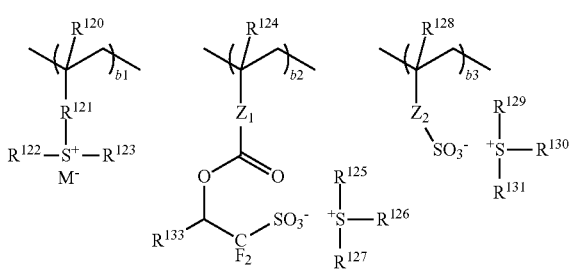

wherein $R^{120}$, $R^{124}$, and $R^{128}$ each are hydrogen or methyl, $R^{121}$ is a single bond, phenylene, —O—R—, or —C(=O)—Y—R—, Y is oxygen or NH, R is a straight, branched or cyclic $C_1$-$C_6$ alkylene group, $C_3$-$C_{10}$ alkenylene or phenylene group, which may contain a carbonyl, ester, ether or hydroxyl moiety, $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or phenylthio group which may contain a straight, branched or cyclic $C_1$-$C_{10}$ alkyl, halogen, trifluoromethyl, cyano, nitro, hydroxyl, alkoxy, alkoxycarbonyl or acyloxy radical, $Z_1$ is a single bond or —C(=O)—$Z_3$—$R^{132}$—, $Z_2$ is a single bond, methylene, ethylene, phenylene, fluorinated phenylene, —O—$R^{132}$— or —C(=O)—$Z_3$—$R^{132}$—, $Z_3$ is oxygen or NH, $R^{132}$ is a straight, branched or cyclic $C_1$-$C_6$ alkylene group, alkenylene, or phenylene group, which may contain a carbonyl, ester, ether or hydroxyl moiety, a pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom, $R^{133}$ is hydrogen or trifluoromethyl, $M^-$ is a non-nucleophilic counter ion, b1, b2 and b3 are in the range of $0 \leq b1 \leq 0.5$, $0 \leq b2 \leq 0.5$, $0 \leq b3 \leq 0.5$, and $0 < b1+b2+b3 \leq 0.5$.

9. The resist composition of claim 8 wherein the polymer comprises recurring units (b2) of a sulfonium salt having formula (2).

10. A pattern forming process comprising the steps of coating the resist composition of claim 8 onto a substrate, baking, exposing the resulting resist film to high-energy radiation, and developing with a developer.

11. A resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator,
said resist composition further comprising a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of an alkylsulfonic acid, arylsulfonic acid, alkylsulfonimidic acid, alkylsulfonemethide acid, and tetraphenylboric acid each of which has at least one fluorine atom;
wherein the complex is at least one selected from those complexes having the following general formulae:

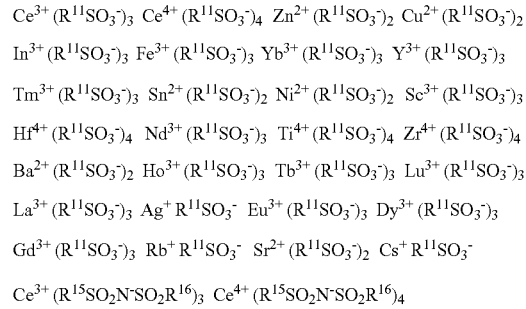

-continued

Zn²⁺ (R¹⁵SO₂N⁻SO₂R¹⁶)₂    Cu²⁺ (R¹⁵SO₂N⁻SO₂R¹⁶)₂
In³⁺ (R¹⁵SO₂N⁻SO₂R¹⁶)₃    Fe³⁺ (R¹⁵SO₂N⁻SO₂R¹⁶)₃
Yb³⁺ (R¹⁵SO₂N⁻SO₂R¹⁶)₃    Y³⁺ (R¹⁵SO₂N⁻SO₂R¹⁶)₃
Tm³⁺ (R¹⁵SO₂N⁻SO₂R¹⁶)₃    Sn²⁺ (R¹⁵SO₂N⁻SO₂R¹⁶)₂
Ni²⁺ (R¹⁵SO₂N⁻SO₂R¹⁶)₂    Sc³⁺ (R¹⁵SO₂N⁻SO₂R¹⁶)₃
Hf⁴⁺ (R¹⁵SO₂N⁻SO₂R¹⁶)₄    Nd³⁺ (R¹⁵SO₂N⁻SO₂R¹⁶)₃
Ti⁴⁺ (R¹⁵SO₂N⁻SO₂R¹⁶)₄    Zr⁴⁺ (R¹⁵SO₂N⁻SO₂R¹⁶)₄
Ba²⁺ (R¹⁵SO₂N⁻SO₂R¹⁶)₂    Ho³⁺ (R¹⁵SO₂N⁻SO₂R¹⁶)₃
Tb³⁺ (R¹⁵SO₂N⁻SO₂R¹⁶)₃    Lu³⁺ (R¹⁵SO₂N⁻SO₂R¹⁶)₃
La³⁺ (R¹⁵SO₂N⁻SO₂R¹⁶)₃    Ag⁺ R¹⁵SO₂N⁻SO₂R¹⁶
Eu³⁺ (R¹⁵SO₂N⁻SO₂R¹⁶)₃    Dy³⁺ (R¹⁵SO₂N⁻SO₂R¹⁶)₃
Gd³⁺ (R¹⁵SO₂N⁻SO₂R¹⁶)₃    Rb⁺ R¹⁵SO₂N⁻SO₂R¹⁶
Sr²⁺ (R¹⁵SO₂N⁻SO₂R¹⁶)₂    Cs⁺ R¹⁵SO₂N⁻SO₂R¹⁶

Ce³⁺ (R¹⁷SO₂C⁻SO₂R¹⁸)₃    Ce⁴⁺ (R¹⁷SO₂C⁻SO₂R¹⁸)₄
      |                         |
      SO₂R¹⁹                    SO₂R¹⁹
Zn²⁺ (R¹⁷SO₂C⁻SO₂R¹⁸)₂    Cu²⁺ (R¹⁷SO₂C⁻SO₂R¹⁸)₂
      |                         |
      SO₂R¹⁹                    SO₂R¹⁹
In³⁺ (R¹⁷SO₂C⁻SO₂R¹⁸)₃    Fe³⁺ (R¹⁷SO₂C⁻SO₂R¹⁸)₃
      |                         |
      SO₂R¹⁹                    SO₂R¹⁹
Yb³⁺ (R¹⁷SO₂C⁻SO₂R¹⁸)₃    Y³⁺ (R¹⁷SO₂C⁻SO₂R¹⁸)₃
      |                         |
      SO₂R¹⁹                    SO₂R¹⁹
Tm³⁺ (R¹⁷SO₂C⁻SO₂R¹⁸)₃    Sn²⁺ (R¹⁷SO₂C⁻SO₂R¹⁸)₂
      |                         |
      SO₂R¹⁹                    SO₂R¹⁹
Ni²⁺ (R¹⁷SO₂C⁻SO₂R¹⁸)₂    Sc³⁺ (R¹⁷SO₂C⁻SO₂R¹⁸)₃
      |                         |
      SO₂R¹⁹                    SO₂R¹⁹
Hf⁴⁺ (R¹⁷SO₂C⁻SO₂R¹⁸)₄    Nd³⁺ (R¹⁷SO₂C⁻SO₂R¹⁸)₃
      |                         |
      SO₂R¹⁹                    SO₂R¹⁹
Ti⁴⁺ (R¹⁷SO₂C⁻SO₂R¹⁸)₄    Zr⁴⁺ (R¹⁷SO₂C⁻SO₂R¹⁸)₄
      |                         |
      SO₂R¹⁹                    SO₂R¹⁹
Ba²⁺ (R¹⁷SO₂C⁻SO₂R¹⁸)₂    Ho³⁺ (R¹⁷SO₂C⁻SO₂R¹⁸)₃
      |                         |
      SO₂R¹⁹                    SO₂R¹⁹
Tb³⁺ (R¹⁷SO₂C⁻SO₂R¹⁸)₃    Lu³⁺ (R¹⁷SO₂C⁻SO₂R¹⁸)₃
      |                         |
      SO₂R¹⁹                    SO₂R¹⁹
La³⁺ (R¹⁷SO₂C⁻SO₂R¹⁸)₃    Ag⁺ R¹⁷SO₂C⁻SO₂R¹⁸
      |                         |
      SO₂R¹⁹                    SO₂R¹⁹
Eu³⁺ (R¹⁷SO₂C⁻SO₂R¹⁸)₃    Dy³⁺ (R¹⁷SO₂C⁻SO₂R¹⁸)₃
      |                         |
      SO₂R¹⁹                    SO₂R¹⁹
Gd³⁺ (R¹⁷SO₂C⁻SO₂R¹⁸)₃    Rb⁺ R¹⁷SO₂C⁻SO₂R¹⁸
      |                         |
      SO₂R¹⁹                    SO₂R¹⁹
Sr²⁺ (R¹⁷SO₂C⁻SO₂R¹⁸)₂    Cs⁺ R¹⁷SO₂C⁻SO₂R¹⁸
      |                         |
      SO₂R¹⁹                    SO₂R¹⁹

-continued

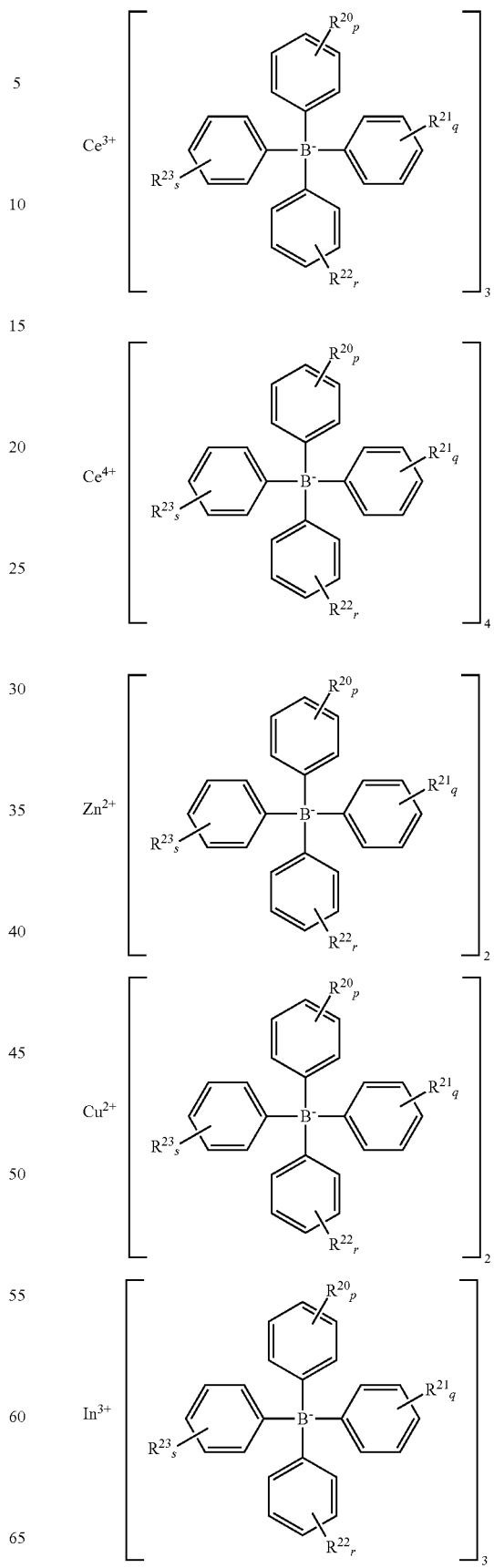

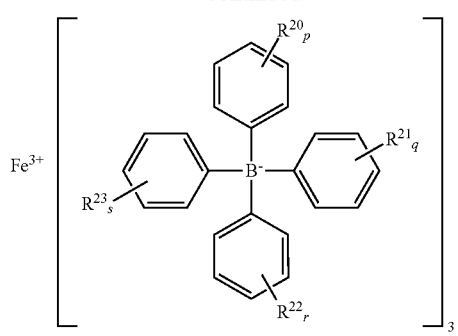
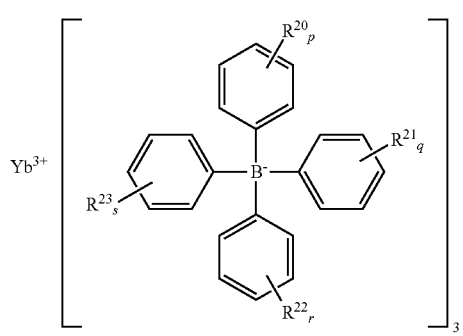
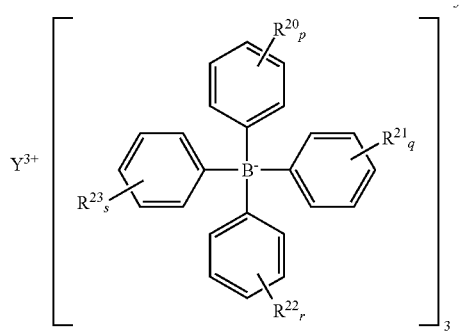
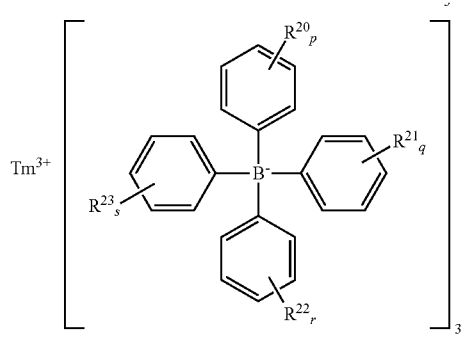
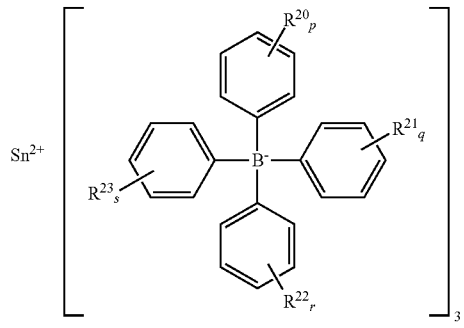
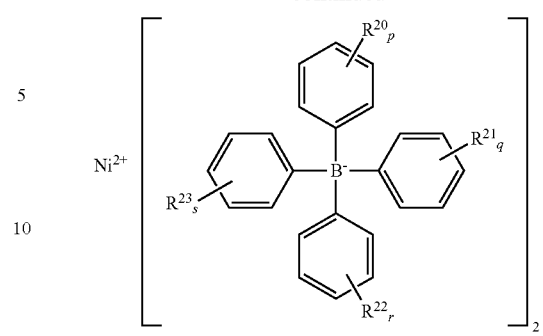
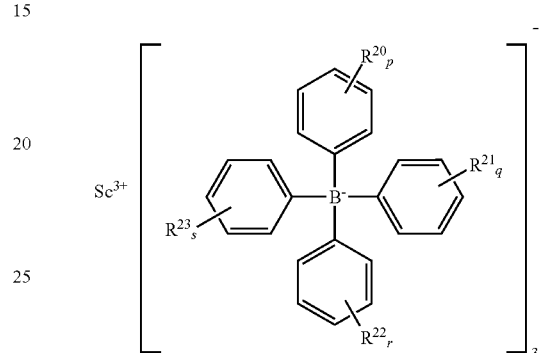
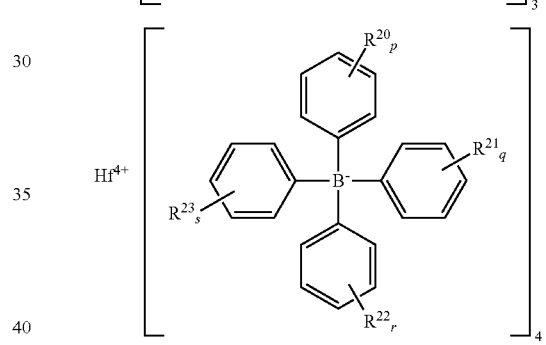
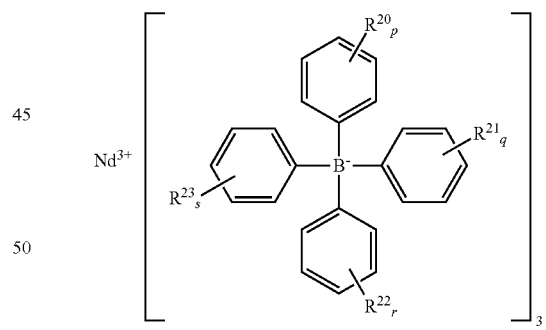
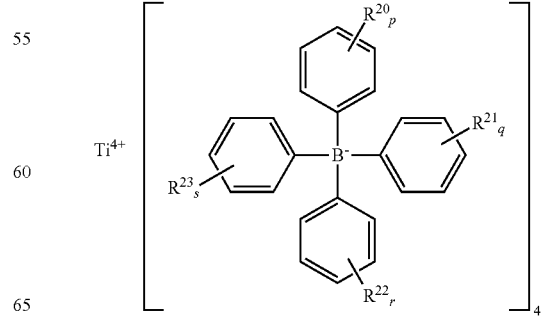

175
-continued
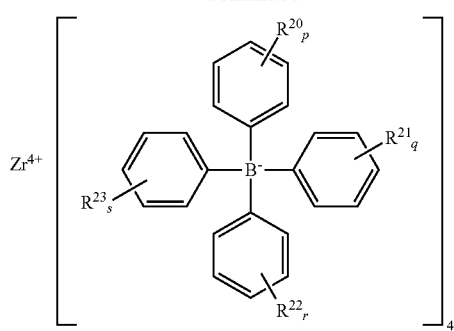
Zr⁴⁺
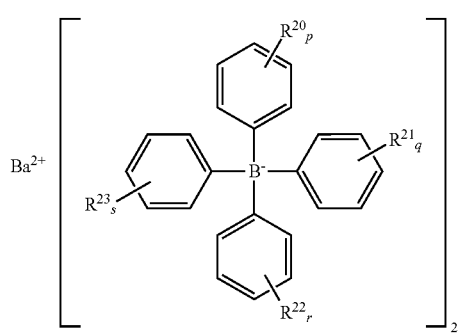
Ba²⁺
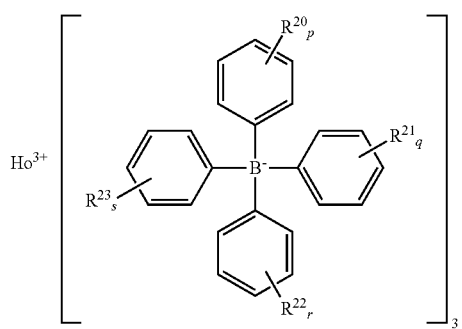
Ho³⁺
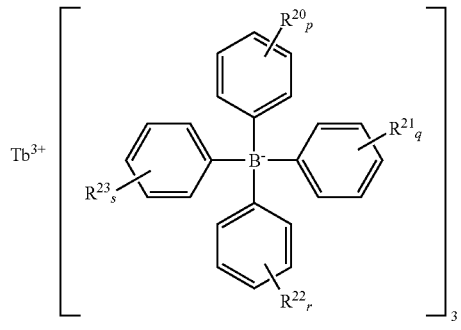
Tb³⁺
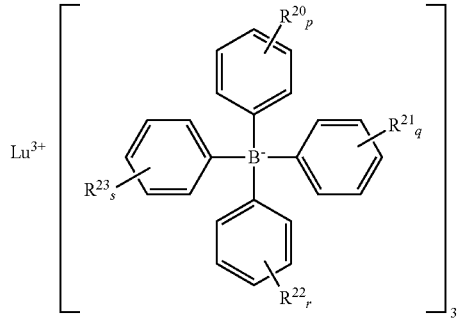
Lu³⁺
176
-continued
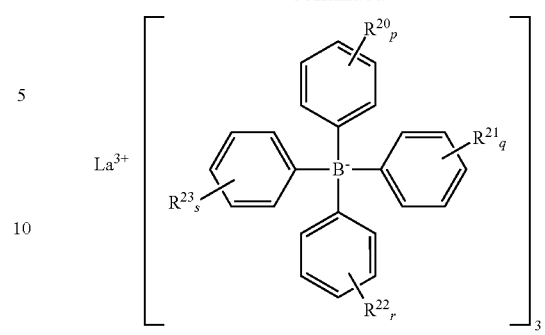
La³⁺
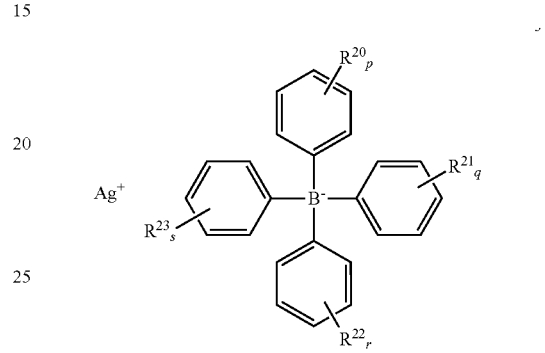
Ag⁺
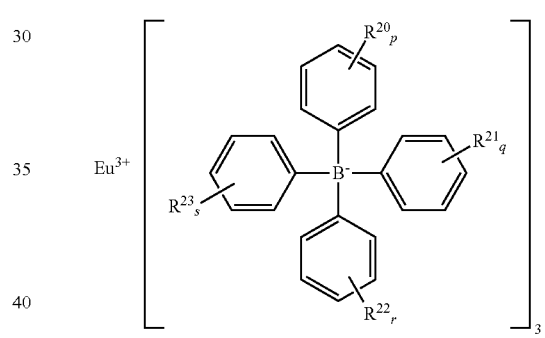
Eu³⁺
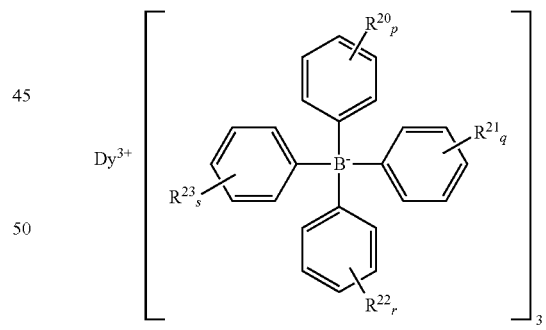
Dy³⁺
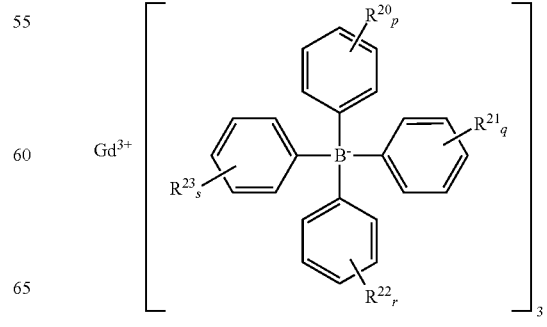
Gd³⁺

-continued

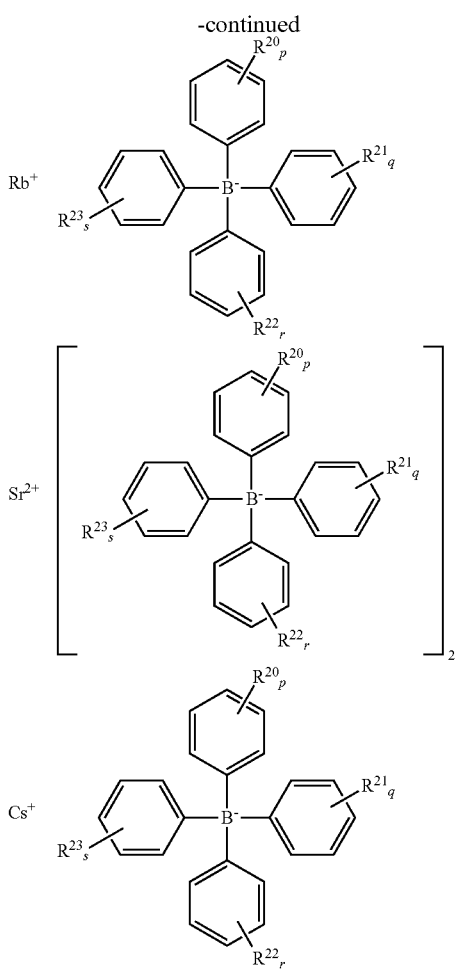

wherein R¹¹ is fluorine or an organic group selected from the group consisting of trifluoromethyl, pentafluoroethyl, trifluoroethyl, octafluorobutyl, nonafluorobutyl, 2-fluorophenyl, 3-fluorophenyl, 4-fluorophenyl, 2,4-difluorophenyl, 2,3-difluorophenyl, 3,4-difluorophenyl, 3,5-difluorophenyl, 2,4,5-trifluorophenyl, 2,3,4-trifluorophenyl, 2,3,4,5-tetrafluorophenyl, 2,3,5,6-tetrafluorophenyl, 2,3,4,5,6-pentafluorophenyl, 2-trifluoromethylphenyl, 3-trifluoromethylphenyl, 4-trifluoromethylphenyl, 2,4-di(trifluoromethyl)phenyl, 4-hydroxy-2,3,5,6-tetrafluorophenyl, 4-methoxy-2,3,5,6-tetrafluorophenyl, 4-acetoxy-2,3,5,6-tetrafluorophenyl, 4-pivaloyloxy-2,3,5,6-tetrafluorophenyl, 4-cyclohexylcarbonyloxy-2,3,5,6-tetrafluorophenyl, 4-adamantylcarbonyloxy-2,3,5,6-tetrafluorophenyl, 4-phenylcarbonyloxy-2,3,5,6-tetrafluorophenyl, 4-cyclohexylsulfonyl-2,3,5,6-tetrafluorophenyl, and 4-phenylsulfonyl-2,3,5,6-tetrafluorophenyl, $R^{15}$, $R^{16}$, $R^{17}$, $R^{18}$, and $R^{19}$ are each independently fluorine, trifluoromethyl, pentafluoroethyl, trifluoroethyl, octafluorobutyl, or nonafluorobutyl, $R^{15}$ and $R^{16}$ may bond together to form a ring, $R^{20}$, $R^{21}$, $R^{22}$, and $R^{23}$ are each independently fluorine or trifluoromethyl, each of p, q, r and s is an integer of 1 to 5.

12. A pattern forming process comprising the steps of coating the resist composition of claim 11 onto a substrate, baking, exposing the resulting resist film to high-energy radiation, and developing with a developer.

13. A pattern forming process comprising the steps of coating a resist composition onto a substrate, baking, exposing the resulting resist film to high-energy radiation, and developing with a developer;
wherein the resist composition comprises recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator, and
said resist composition further comprises a complex of a metal with an acid, the metal being selected from the group consisting of cerium, copper, zinc, iron, indium, yttrium, ytterbium, tin, thulium, scandium, nickel, neodymium, hafnium, zirconium, titanium, lanthanum, silver, barium, holmium, terbium, lutetium, europium, dysprosium, gadolinium, rubidium, strontium, and cesium, and the acid being selected from the group consisting of an alkylsulfonic acid, arylsulfonic acid, alkylsulfonimidic acid, alkylsulfonemethide acid, and tetraphenylboric acid each of which has at least one fluorine atom;
wherein in the step of exposing the resist film to high-energy radiation, the surface of the substrate underneath the resist film is electrically charged positive.

14. A pattern forming process comprising the steps of coating the resist composition of claim 13 onto a substrate, baking, exposing the resulting resist film to high-energy radiation, and developing with a developer.

* * * * *